US010437402B1

(12) United States Patent
Pan

(10) Patent No.: US 10,437,402 B1
(45) Date of Patent: Oct. 8, 2019

(54) INTEGRATED LIGHT-EMITTING PIXEL ARRAYS BASED DEVICES BY BONDING

(71) Applicant: Shaoher Pan, Palo Alto, CA (US)

(72) Inventor: Shaoher Pan, Palo Alto, CA (US)

( * ) Notice: Subject to any disclaimer, the term of this patent is extended or adjusted under 35 U.S.C. 154(b) by 0 days.

(21) Appl. No.: 15/937,735

(22) Filed: Mar. 27, 2018

(51) Int. Cl.
*H01L 27/12* (2006.01)
*G06F 3/044* (2006.01)
*H01L 29/786* (2006.01)
*H01L 33/00* (2010.01)
*H01L 33/06* (2010.01)
(Continued)

(52) U.S. Cl.
CPC .......... *G06F 3/044* (2013.01); *H01L 23/5387* (2013.01); *H01L 25/0753* (2013.01); *H01L 27/124* (2013.01); *H01L 27/1218* (2013.01); *H01L 27/1222* (2013.01); *H01L 27/1266* (2013.01); *H01L 29/78678* (2013.01); *H01L 33/007* (2013.01); *H01L 33/0079* (2013.01); *H01L 33/06* (2013.01); *H01L 33/32* (2013.01); *H01L 33/502* (2013.01); *H01L 33/58* (2013.01); *H01L 33/62* (2013.01); *G06F 2203/04102* (2013.01); *H01L 2933/0041* (2013.01); *H01L 2933/0058* (2013.01); *H01L 2933/0066* (2013.01); *H01L 2933/0083* (2013.01)

(58) Field of Classification Search
CPC .............................. H01L 33/504; H01L 33/62
See application file for complete search history.

(56) References Cited

U.S. PATENT DOCUMENTS 5,827,753 A   10/1998   Huang et al.
6,844,903 B2   1/2005   Mueller-Mach et al.
(Continued)

FOREIGN PATENT DOCUMENTS

CN   102751296   10/2012
JP   2002-141492   5/2002
(Continued)

OTHER PUBLICATIONS

Non-final Office Action in U.S. Appl. No. 15/291,330, dated Aug. 1, 2018, 54 pages.
(Continued)

*Primary Examiner* — Eliseo Ramos Feliciano
*Assistant Examiner* — Ankush K Singal
(74) *Attorney, Agent, or Firm* — Fish & Richardson P.C.

(57) ABSTRACT

Integrated active-matrix light emitting pixel arrays based displays and methods of fabricating the integrated displays are provided. An example method includes: forming multiple layers on a first substrate to form a light emitting structure, integrating the light emitting structure on the first substrate with a backplane device on a second substrate by connecting a first top layer of the light emitting structure with a second top layer of the backplane device, e.g., by using low temperature bonding, the backplane device including at least one backplane having pixel circuits, and after the integration, patterning the light emitting structure to form an array of light emitting elements each conductively coupled to respective pixel circuits to thereby form an array of active-matrix light emitting pixels. A pattern of different color phosphor or different size quantum dots materials can be deposited on the light emitting pixels to form an array of multi-color display pixels.

52 Claims, 33 Drawing Sheets

(51) Int. Cl.
*H01L 33/32* (2010.01)
*H01L 33/50* (2010.01)
*H01L 33/58* (2010.01)
*H01L 33/62* (2010.01)
*H01L 23/538* (2006.01)
*H01L 25/075* (2006.01)

(56) References Cited

U.S. PATENT DOCUMENTS

| | | |
|---|---|---|
| 7,248,310 B2 | 7/2007 | Mueller-Mach et al. |
| 7,956,370 B2 | 6/2011 | Pan |
| 8,642,363 B2 | 2/2014 | Lau et al. |
| 8,674,383 B2 | 3/2014 | Pan |
| 9,184,211 B2 * | 11/2015 | Hirakata ................ H01L 27/15 |
| 9,423,535 B1 | 8/2016 | Hu et al. |
| 10,079,265 B1 * | 9/2018 | Wu ........................ H01L 27/156 |
| 10,128,308 B1 | 11/2018 | Shin et al. |
| 2003/0025118 A1 | 2/2003 | Yamazaki et al. |
| 2003/0082889 A1 | 5/2003 | Maruyama et al. |
| 2004/0238827 A1 | 12/2004 | Takayama et al. |
| 2008/0116468 A1 | 5/2008 | Radkov et al. |
| 2009/0032799 A1 | 2/2009 | Pan |
| 2010/0308300 A1 | 12/2010 | Pan |
| 2011/0193056 A1 | 8/2011 | Wang |
| 2011/0309378 A1 | 12/2011 | Lau et al. |
| 2012/0169682 A1 | 7/2012 | Kuhlman et al. |
| 2012/0241809 A1 | 9/2012 | Pan et al. |
| 2014/0063393 A1 | 3/2014 | Zhong et al. |
| 2014/0152619 A1 | 6/2014 | Hotelling et al. |
| 2014/0225838 A1 | 8/2014 | Gupta et al. |
| 2014/0367633 A1 | 12/2014 | Bibl et al. |
| 2015/0091849 A1 | 4/2015 | Ludden |
| 2015/0332635 A1 | 11/2015 | Lau et al. |
| 2015/0362165 A1 | 12/2015 | Chu et al. |
| 2016/0163765 A1 | 6/2016 | Hu et al. |
| 2016/0259368 A1 | 9/2016 | Bibl et al. |
| 2016/0299395 A1 | 10/2016 | Kosuge et al. |
| 2016/0313848 A1 | 10/2016 | Rhee |
| 2017/0069612 A1 | 3/2017 | Zhang et al. |
| 2017/0123529 A1 | 5/2017 | Ho |
| 2017/0179097 A1 | 6/2017 | Zhang et al. |
| 2017/0179192 A1 | 6/2017 | Zhang et al. |
| 2017/0185193 A1 | 6/2017 | Kim |
| 2017/0250167 A1 | 8/2017 | Bower et al. |
| 2017/0352791 A1 | 12/2017 | Kang |
| 2018/0102085 A1 | 4/2018 | Pan |
| 2018/0114800 A1 | 4/2018 | Pan |

FOREIGN PATENT DOCUMENTS

| | | |
|---|---|---|
| JP | 2007-005372 | 1/2007 |
| WO | WO 2013-105347 | 7/2013 |

OTHER PUBLICATIONS

Horng et al., "Performance of GaN-based Light-emitting Diodes Fabricated Using GaN Epilayers Grown on Silicon Substrates," Optics Express, 22(1):179-187.

Huang et al., "Static active-matrix OLED Display without Pixel Refresh Enabled by Amorphous-silicon Non-volatile Memory," Journal of the SID, 18/11, 2010, pp. 879-883.

Setlur, "Phosphors for LED-based Solid-state Lighting," The Electrochemical Society Interface, Winter 2009, pp. 32-36.

Singh et al., "Design and Fabrication of InGaN/GaN MQWs Blue LED on Sapphire Substrate for High Voltage Operation," IRACST—Engineering Science and Technology: An International Journal (ESTIJ), ISSN: 2250-3498, 5(4):299-301, Aug. 2015.

International Search Report and Written Opinion in PCT/US2017/056378, dated Mar. 6, 2018, 17 pages.

* cited by examiner

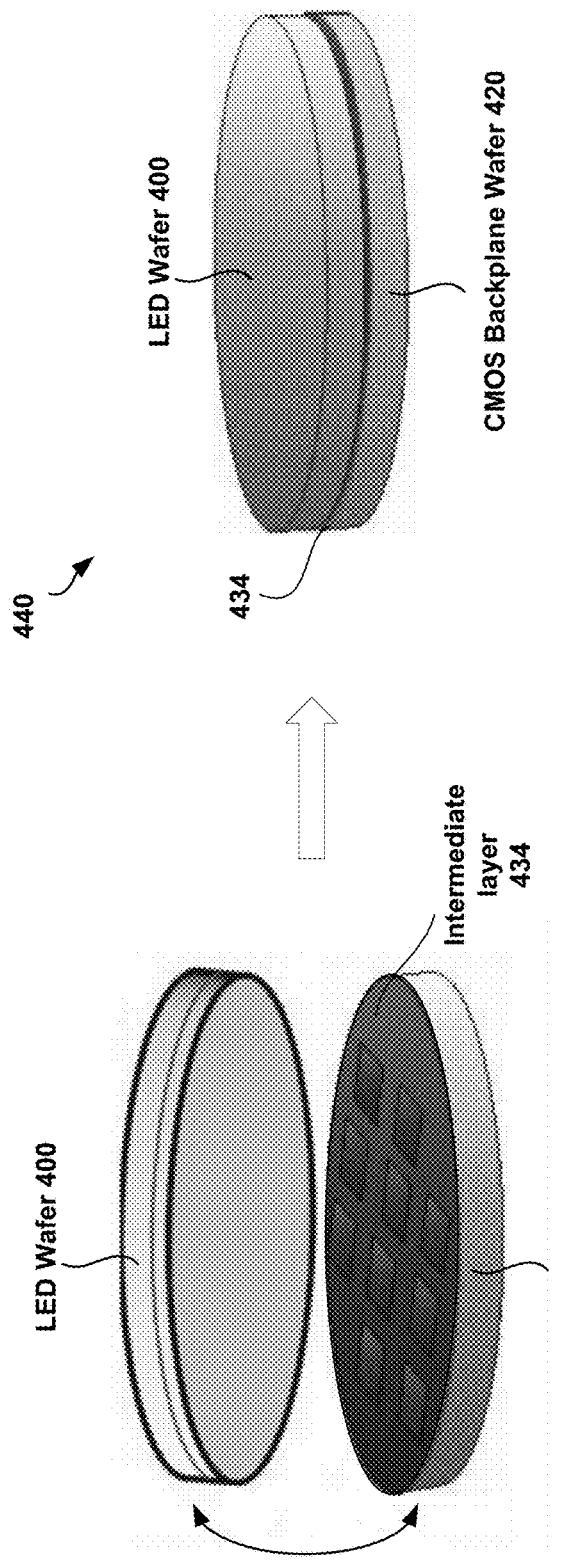

INTEGRATED LIGHT-EMITTING PIXEL ARRAYS BASED DEVICES BY BONDING

TECHNICAL FIELD

This disclosure relates generally to display devices or systems, particularly to integrated light-emitting pixel arrays based display devices or systems.

BACKGROUND

Displays utilizing arrays of light emitting pixels are popular in the electronic field and especially in portable electronic and communication devices, because large amounts of data and pictures can be transmitted rapidly and virtually to any location. Light emitting diode (LED) arrays are becoming more popular than liquid crystal displays (LCD) as an image source in both direct view and virtual image displays. One reason for this is that LEDs are capable of generating relatively high luminance, thus displays incorporating LED arrays can be used in a greater variety of ambient conditions.

Although LED arrays offer certain advantages, a major disadvantage is the complexity of their manufacturing process. In some cases, the arrays are manufactured by depositing materials on a supporting substrate and addressing/driver connections to row and column buses are made around the edges. Thus, the supporting substrate size is larger than the array size because of the necessary I/O pads or terminals. Providing very small contact pads in an effort to increase the array size greatly reduces the assembly yield. Another problem is that the driver circuitry for the LED arrays has a relatively high power consumption and adds a further manufacturing complexity.

SUMMARY

Described herein are integrated light-emitting pixel array-based devices or systems and methods of making them by bonding different components on different substrates together, which can greatly simplify the manufacturing complexity and improve manufacturing efficiency and quality.

One aspect of the present disclosure features a method of fabricating an integrated device, the method including: forming a plurality of layers on a first substrate to form a light emitting structure; integrating the formed light emitting structure on the first substrate with a backplane device formed on a second substrate by connecting a first top layer of the light emitting structure with a second top layer of the backplane device, where the backplane device includes at least one backplane having a plurality of pixel circuits; and after the integration, patterning the light emitting structure to form a plurality of separate light emitting elements each conductively coupled to respective pixel circuits of the plurality of pixel circuits to thereby form a plurality of active-matrix light emitting pixels, where each of the active-matrix light emitting pixels includes at least one of the light emitting elements and at least one of the pixel circuits conductively coupled to the at least one of the light emitting elements.

Each of the pixel circuits can include a non-volatile memory including at least one transistor conductively coupled to a corresponding drive electrode in the second top layer, and the non-volatile memory can be conductively coupled to a corresponding light emitting element in a respective active-matrix light emitting pixel through the corresponding drive electrode. The at least one backplane can include scanning drivers and data drivers, and each of the non-volatile memories can be coupled to one of the scanning drivers through at least one word line and to one of the data drivers through at least one bit line.

In some implementations, the plurality of layers includes a contact electrode layer as the first top layer, and each of the pixel circuits is coupled to a respective drive electrode in the second top layer, and each of the pixel circuits is conductively coupled to the light emitting structure through the respective drive electrode and the contact electrode layer. The contact electrode layer can include a doped semiconductor layer, and the contact electrode layer can be patterned to form individual Ohmic contacts of the separate light emitting elements.

In some implementations, integrating the formed light emitting structure on the first substrate with the backplane device formed on the second substrate includes using low temperature bonding to bond the first top layer of the light emitting structure on the second top layer of the backplane device through an intermediate conductive layer.

The method can include: simultaneously patterning the light emitting structure and the intermediate conductive layer, where each of the light emitting elements is self-aligned with a respective patterned intermediate conductive layer. The intermediate conductive layer can include one or more metallic films including: an iridium-tin-oxide (ITO) film with a titanium (Ti) film, a cupper (Cu) film with a Tantalum (Ta) film, an aluminum (Al) film with a Tin (Sn) film, or a gold (Au) or silver (Ag) film with at least one adhesive film including chromium (Cr), Platinum (Pt), Palladium (Pd), or Titanium (Ti).

In some implementations, the first substrate includes a first semiconductor wafer and the second substrate includes a second semiconductor wafer, and integrating the formed light emitting structure on the first substrate with the backplane device formed on the second substrate can include: aligning the first semiconductor wafer with the second semiconductor wafer face-to-face at a wafer-to-wafer level of accuracy.

In some implementations, integrating the formed light emitting structure on the first substrate with the backplane device formed on the second substrate includes: aligning the formed light emitting structure on the first substrate with a first region of the backplane device on the second substrate; and bonding the light emitting structure with the first region of the backplane device.

In some examples, the method further includes integrating another light emitting structure on another first substrate with the backplane device on the second substrate by aligning the another light emitting structure on the another first substrate with a second region of the backplane device and bonding the another light emitting structure with the second region of the backplane device, the second region being adjacent to the particular region.

In some examples, the method further includes: scanning, by using a laser, an area with a particular shape on the light emitting structure such that the light emitting structure in the area is separated from the first substrate and remains bonded on the backplane device; and removing the first substrate together with other non-scanned areas on the light emitting structure from the first region of the backplane device.

The method can also include: aligning another light emitting structure on another first substrate with a second region of the backplane device on the second substrate; bonding the another light emitting structure with the second region of the backplane device; scanning, by using the laser, a second area with the particular shape on the another light emitting structure such that the another light emitting structure in the second area is separated from the another first substrate and remains bonded on the backplane device; and removing the another first substrate together with other non-scanned areas on the another light emitting structure from the second region of the backplane device, where the another light emitting structure on the another first substrate is aligned with the second region of the backplane device on the second substrate, such that the another light emitting structure in the second area is adjacent to the light emitting structure in the first area on the backplane device.

Each of the pixel circuits can be coupled to a respective drive electrode in the second top layer. The method can further include: before the patterning, aligning a protective mask with the respective drive electrodes in the second top layer, such that dielectric materials between the respective drive electrodes in the second top layer are selectively etched away after the patterning.

In some implementations, the method further include: before the patterning, removing the first substrate from the light emitting structure to expose the light emitting structure. The light emitting structure can include one or more quantum well layers as an active medium between the first top layer as a first contact electrode and a second contact electrode, the light emitting structure can include a buffer layer between the second contact electrode and the first substrate, and the method can further include: polishing the light emitting structure to remove the buffer layer to expose the second contact electrode. The method can also include: thinning the second contact electrode by polishing to remove a portion of the second contact electrode.

Removing the first substrate from the light emitting structure can include: using laser lift-off or laser scribing. The method can include: filling an isolation material in gaps between adjacent light emitting elements of the plurality of light emitting elements. The isolation material can include an opaque dielectric material.

In some implementations, the light emitting structure includes one or more quantum well layers as an active medium between the first top layer as a first contact electrode and a second contact electrode, and the method further includes: polishing the light emitting elements filled with the isolation material to expose the second contact electrodes in the light emitting elements and form a flat surface across the second contact electrodes of the light emitting elements. The method can further include depositing a transparent conductive layer on the flat surface to connect the second contact electrodes of the light emitting elements to form a common electrode for the light emitting elements.

The method can further include forming a conductive grid array package on a bottom of the second substrate opposite to the second top layer, the conducive grid array package being conductively coupled to the at least one backplane. The conductive grid array package can include a ball grid array (BGA) package.

In some implementations, the formed light-emitting structure includes one or more quantum well layers including Group III-V compounds and is configured to be activated to emit light with a primary color, and each of the light emitting elements is configured to emit light with the primary color. Each of the light emitting elements includes a light emitting diode (LED).

In some implementations, each of the light-emitting elements is operable to emit light with a first color, and the method further includes: forming a plurality of active-matrix multi-color display pixels using the plurality of active-matrix light-emitting pixels, each display pixel including at least a particular pixel element to emit light with a second color, the second color being different from the first color. Each display pixel includes at least three pixel elements operable to emit light with at least three different colors including red, blue, and green.

In some examples, forming the plurality of active-matrix multi-color display pixels includes: patterning with photoresist to select particular light-emitting elements of the plurality of light-emitting elements; depositing phosphor films or a quantum-dot films on the selected light-emitting elements, where the selected light-emitting elements with the deposited phosphor films or the quantum-dot films are operable to emit the second color when the phosphor films or the quantum-dot films are excited by light from the selected light-emitting elements; and removing the photoresist to form the particular pixel elements of the display pixels.

In some examples, each of the light-emitting elements is operable to emit ultraviolet (UV) or deep UV light with a wavelength between 100 nm and 450 nm. Forming the plurality of active-matrix multi-color display pixels can include: forming at least three different color phosphor films or different size quantum-dot films on at least three light-emitting elements in each of the display pixels, where the display pixel is operable to emit at least blue, red, and green colors when the phosphor films or quantum-dot films are excited by the UV or deep UV light from the at least three light-emitting elements.

In some examples, each of the light-emitting elements is operable to emit light with a blue color. Forming the plurality of active-matrix multi-color display pixels can include: forming at least two different color phosphor films or different size quantum-dot films on at least two light-emitting elements in each of the display pixels, where the display pixel is operable to emit at least red and green colors when the phosphor films or quantum-dot films are excited by the blue light from the at least two light-emitting elements. Forming the plurality of active-matrix multi-color display pixels can also include forming a transparent layer on a third light-emitting element in the display pixel, where the display pixel is operable to emit a blue color from the third light-emitting element.

In some examples, each display pixel includes a first pixel element and a second pixel element that have respective first light conversion efficiency and second light conversion efficiency when excited by the light-emitting elements. Patterning the light emitting structure to form a plurality of separate light emitting elements can include: patterning the light emitting structure to form a plurality of first light emitting elements each having a first area, the first light emitting elements being for the first pixel elements; and patterning the light emitting structure to form a plurality of second light emitting elements each having a second area, the second light emitting elements being for the second pixel elements, where an area ratio between the first area and the second area is based on a ratio between the first light conversion efficiency and the second light conversion efficiency.

The method can further include forming an isolation spacer between adjacent pixel elements of the display pixels, where the isolation spacer includes an opaque dielectric material. The method can further include forming a transparent protective layer on top of the plurality of active-matrix multi-color display pixels. The formed transparent protective layer can include a transparent touch-sensitive protective layer, and the transparent touch-sensitive protective layer can be configured to form, together with a common electrode of the light emitting elements, a capacitive touch screen position sensor. The method can include forming a polarizer film between the protective layer and the display pixels.

The first substrate can include one of a single crystal silicon semiconductor substrate and a sapphire substrate, and the plurality of layers can include epitaxial semiconductor layers grown on the first substrate. The at least one backplane can include a complementary metal-oxide-semiconductor (CMOS) backplane. The backplane device can include an array of backplanes formed on the second substrate and separable from each other.

The second substrate can include a flexible film on a rigid substrate. The method can further include: removing the rigid substrate such that the integrated device fabricated on the flexible film becomes flexible. The at least one backplane can include a low temperature polysilicon (LTPS) thin-film transistors (TFT) array control backplane.

Another aspect of the present disclosure features a method of fabricating an integrated active-matrix LED pixel array based display by bonding. The method includes: epitaxially growing a plurality of semiconductor layers on a first substrate to form a light emitting diode (LED) structure, the semiconductor layers including one or more quantum well layers having Group III-V compounds between a first doped semiconductor layer as a first contact electrode and a second doped semiconductor layer as a second contact electrode; forming an intermediate metal layer on a top layer of a backplane device formed on a second substrate, the backplane device including at least one backplane having a plurality of non-volatile memories, each of the non-volatile memories being conductively coupled to a respective drive electrode in the top layer of the backplane device; integrating the LED structure on the first substrate with the backplane device on the second substrate by low temperature bonding including bonding the first doped semiconductor layer of the LED structure with the top layer of the backplane device via the intermediate metal layer, where each of the non-volatile memories is conductively coupled to the LED structure via the respective drive electrode, the intermediate metal layer and the first contact electrode; after the integration, patterning the LED structure together with the intermediate metal layer and the bonded top layer of the backplane device to form an array of LEDs each conductively coupled to respective non-volatile memories of the plurality of non-volatile memories to thereby form an array of active-matrix LED pixels, where each of the active-matrix LED pixels includes at least one of the LEDs and at least one of the non-volatile memories conductively coupled to the at least one of the LEDs; forming an array of active-matrix multi-color display pixels by selectively depositing different color phosphor materials or different size quantum dots materials on surfaces of the LEDs in each of the active-matrix LED pixels, each display pixel including at least three pixel elements operable to emit light with three colors including red, blue, and green when excited by the LEDs; and forming a transparent protective layer on the array of active-matrix multi-color di splay pixels.

In some implementations, the method further include: forming first isolation spacers between adjacent LEDs of the array of LEDs, the first isolation spacers including an opaque dielectric material; polishing the array of LEDs with the first isolation spacers to expose the second doped semiconductor layers of the LEDs and to form a flat surface across the array of LEDs; depositing a transparent conductive layer on the flat surface to form a common electrode for the array of active-matrix LED pixels; forming second isolation spacers between adjacent pixel elements of the display pixels and on the transparent conductive layer, the second isolation spacers including the opaque dielectric material; and forming a polarizer film between the transparent protective layer and the array of active-matrix multi-color display pixels, where the different color phosphor materials or quantum dots materials are selectively patterned on the transparent conductive layer, and the transparent protective layer is touch-sensitive and configured to form, together with the common electrode, a capacitive touch screen position sensor.

In some implementations, the at least one backplane includes a complementary metal-oxide-semiconductor (CMOS) backplane, and the second substrate includes a silicon semiconductor wafer, where the first substrate includes one of a silicon semiconductor wafer and a sapphire wafer. The method can further include: before the integration, aligning the first substrate with the second substrate at a wafer-to-wafer level of accuracy; after the integration, removing the first substrate by laser lift-off to expose the LED structure and polishing the LED structure to expose the second doped semiconductor layer; before the patterning, aligning a protective mask with the respective drive electrodes in the top layer of the backplane device, such that dielectric materials between the respective drive electrodes in the top layer are selectively etched away after the patterning; and forming a ball grid array (BGA) package on a bottom layer of the second substrate opposite to the top layer and conductively coupled to the backplane device.

In some implementations, the at least one backplane includes a low temperature polysilicon (LTPS) active-matrix (AM) thin-film transistors (TFT) array control backplane, and the second substrate includes a flexible film on a carrier substrate. The first substrate can include one of a silicon semiconductor wafer and a sapphire wafer. Integrating the formed LED structure on the first substrate with the TFT backplane device formed on the second substrate can include: aligning the formed LED structure on the first substrate with a first region of the TFT backplane device on the second substrate; bonding the LED structure with the first region of the TFT backplane device; scanning, by using a laser, a rectangular area on the LED structure such that the LED structure in the rectangular area is separated from the first substrate and remains bonded on the TFT backplane device; and removing the first substrate together with other non-scanned areas on the LED structure from the first region of the TFT backplane device.

In some examples, the method further includes: aligning another LED structure on another first substrate with a second region of the TFT backplane device on the second substrate; bonding the another LED structure on the second region of the TFT backplane device; scanning, by using the laser, a rectangular area on the another LED structure such that the another LED structure in the rectangular area is separated from the another first substrate and remains bonded on the TFT backplane device; and removing the another first substrate together with other non-scanned areas on the another LED structure from the second region of the TFT backplane device, where the another LED structure on the another first substrate is aligned with the second region of the TFT backplane device on the second substrate, such that the another LED structure in the second area is adjacent to the LED structure in the first area on the TFT backplane device.

Each of the display pixels can include first, second, and third pixel elements having respective first, second, and third light conversion efficiencies to emit a blue color, a green color, and a red color when excited by the LEDs. Patterning the LED structure to form an array of LEDs can include: patterning the LED structure to form a plurality of first LEDs each having a first area, the first LEDs being for the first pixel elements; patterning the LED structure to form a plurality of second LEDs each having a second area, the second LEDs being for the second pixel elements; and patterning the LED structure to form a plurality of third LEDs each having a third area, the third LEDs being for the third pixel elements. An area ratio between the first area, the second area and the third area can be based on a ratio between the first light conversion efficiency, the second light conversion efficiency, and the third light conversion efficiency.

A further aspect of the present disclosure features an integrated device including: a backplane including a plurality of pixel circuits each conductively coupled to respective light-emitting elements through respective intermediate conductive layers to form an array of active-matrix light-emitting pixels, where each of the light-emitting elements includes one or more quantum well semiconductor layers between a first contact electrode and a second contact electrode, the first contact electrodes of the light-emitting elements being respectively bonded and conductively coupled to the pixel circuits in the backplane via the respective intermediate conductive layers; and a transparent conductive layer on the array of the light-emitting elements, where the transparent conductive layer is in contact with the second contact electrodes of the light-emitting elements to form a common electrode of the light-emitting elements.

The integrated device can further include isolation spacers between adjacent light emitting elements. The isolation spacers can include an opaque dielectric material.

Each of the light-emitting elements can have a size same as a respective intermediate conductive layer and be self-aligned with the respective intermediate conductive layer.

Each of the pixel circuits can include a non-volatile memory including at least one transistor conductively coupled to a corresponding drive electrode in a top layer of the backplane. Each of the light-emitting elements can be conductively coupled to a respective pixel circuit by the first contact electrode of the light-emitting element bonded to the corresponding drive electrode of the respective pixel circuit through the respective intermediate conductive layer. The light-emitting element can be aligned with the corresponding bonded drive electrode in the top layer of the backplane, and a size of the light-emitting element can be no smaller than a size of the corresponding bonded drive electrode. The backplane can include scanning drivers and data drivers, and each of the non-volatile memories can be coupled to one of the scanning drivers through at least one word line and to one of the data drivers through at least one bit line.

In some implementations, each of the light-emitting elements is operable to emit light with a primary color. The integrated device further includes: for each of the active-matrix light emitting pixels, at least a phosphor film or a quantum dot film on the conductive layer above at least one light-emitting element in the pixel and operable to emit a secondary light when excited by the light with the primary color, where the secondary light has a second color different from the primary color.

A number of the LEDs can be larger than a number of the LEDs deposited with the phosphor films or quantum dots films, and the number of the LEDs can be equal to at least two times of a number of the pixels.

In some examples, the one or more quantum well layers include Group III-V compounds and each of the light-emitting elements is operable as a light-emitting diode (LED) to emit light with a blue color, and for each of the active-matrix light emitting pixels, at least two blue color LEDs are configured to optically excite at least two other colors by secondary light emission of the phosphor films or quantum dots films on the at least two blue color LEDs. Each of the active-matrix light emitting pixels can be configured to be a multi-color display pixel including one blue color LED operable to provide a blue color and the at least two blue color LEDs with the phosphor films or quantum dots films operable to respectively provide a red color and a green color. An area ratio between the three blue color LEDs in the multi-color display pixel can be based on light conversion efficiencies of the red color phosphor film or quantum dots film and the green color phosphor film or quantum dots film when excited by the at least two blue color LEDs.

In some examples, the one or more quantum well layers include Group III-V compounds and each of the light-emitting elements is operable as a light-emitting diode (LED) to emit ultraviolet (UV) or deep UV light, and for each of the active-matrix light emitting pixels, at least three LEDs are configured to optically excite at least three colors by secondary light emission of the phosphor films or quantum dots films on the at least three LEDs. Each of the active-matrix light emitting pixels can be configured to be a multi-color display pixel including the at least three LEDs with the phosphor films or quantum dots films operable to respectively provide at least a red color, a blue color, and a green color. An area ratio between the three LEDs in the multi-color display pixel can be based on light conversion efficiencies of the red color phosphor film or quantum dots film, the blue color phosphor film or quantum dot film and the green color phosphor film or quantum dots film when excited by the three LEDs.

The conductive layer includes a transparent indium tin oxide (ITO) layer, and the transparent ITO layer is between the light-emitting elements and the at least one phosphor film or one quantum dot film.

In some implementations, each of the active-matrix light-emitting pixels is configured to be a multi-color display pixel including first and second pixel elements having respective first and second light conversion efficiencies to emit a first color and a second color when excited by the light-emitting elements, and the backplane is configured to drive the first and second pixel elements with respective first and second currents, and a current ratio between the first and second currents is based on a ratio between the first and second light conversion efficiencies.

In some implementations, the integrated device further includes: a touch-sensitive transparent protective layer on the array of active-matrix light-emitting pixels and configured to form, together with the common electrode, a capacitive touch screen position sensor; and a polarizer film positioned between the touch-sensitive transparent protective layer and the array of active-matrix light-emitting pixels.

Each of the respective intermediate conductive layers can form a highly-reflective mirror for a corresponding light-emitting element bonded with the respective intermediate conductive layer. The mirror can have a reflectivity higher than 80%. The first contact electrode can include a metal film with a high reflectivity and be configured to enhance a brightness of light emitted from the light-emitting element. Each of the active-matrix light-emitting pixels can be operable to output a light flux in one direction that is larger than 80% of light flux in two directions output from each of the at least one light-emitting element in the pixel. A ratio between an area of light emission from the pixels and a physical area of the pixels can be higher than 50%.

In some implementations, the backplane includes a complementary metal-oxide-semiconductor (CMOS) backplane. The backplane can be on a first side of a semiconductor substrate, and the device can further include: a conductive grid array package on a second, opposite side of the semiconductor substrate, the conductive grid array package being conductively coupled to the backplane. Each of the pixels can include at least one of: a size less than 5.0 µm, a respond time faster than 0.1 µs, or an emitting light flux higher than 20 cd/mm^2. The integrated device can include at least one of: a thickness less than 1.0 mm, or a device area larger than 50 mm×50 mm. The integrated device can be flexible.

In some implementations, the backplane includes a low temperature polysilicon (LTPS) thin-film transistors (TFT) array control backplane. The backplane can be on a substrate, and the device can further include a second LTPS TFT array control backplane on the substrate, the second backplane being adjacent to the backplane. Each of the pixels can include at least one of a size less than 10 µm, a respond time faster than 1.0 µs, or an emitting light flux higher than 10 cd/mm^2. The integrated device can include at least one of a thickness less than 1.0 mm or a device area larger than 100 mm×100 mm. The device can be flexible, rollable, and foldable.

The backplane can be operable to drive the active-matrix light emitting pixels by pulse-width-modulation (PWM). Each of the active-matrix light emitting pixels can be drivable by a current source.

Particular embodiments of the subject matter described in this specification can be implemented so as to realize one or more of the following advantages. A light-emitting structure (e.g., an LED structure including multiple epitaxial layers) is first formed on a first semiconductor substrate (e.g., silicon or sapphire) and then integrated with a backplane (e.g., a CMOS backplane or a TFT array control backplane) formed on a second substrate (e.g., silicon, polymer or glass), e.g., by bonding. After the integration, the light-emitting structure is patterned to form an array of light-emitting elements (e.g., LEDs) each conductively coupled to respective pixel circuits in the backplane to thereby form an array of active-matrix light emitting pixels (e.g., LED pixels). That is, before the integration, only the multi-layered light-emitting structure is fabricated, where the multiple layers are continuous films spanning over a top surface of the first semiconductor substrate. And the individual light-emitting elements (e.g., LEDs) are formed after the integration by patterning such as etching with mask. Thus, this technology enables to align the light-emitting structure on the first semiconductor substrate and the backplane on the second substrate, e.g., at a wafer-to-wafer level accuracy. This alignment has a much lower precision requirement than a chip-level alignment or device-level alignment, e.g., for chip-level CMOS backplane and LEDs bonding (or packaging) where both a CMOS backplane and LEDs are completely fabricated and functional before bonding. In comparison, this technology does not need the chip-level alignment as only the CMOS/TFT backplane is completely fabricated and the LEDs are not fully manufactured (or patterned) before the integration. In a particular example, chip-level CMOS and LEDs bonding requires sub-micron precision wafer alignment, while the wafer-level CMOS/TFT backplane and LED structure bonding in this technology requires only sub-millimeter precision wafer alignments, at least three orders of magnitudes lower in precision requirement or manufacturing difficulties.

Moreover, before the integration, the light-emitting structure can be formed by high-quality deposition at high temperatures, e.g., by Metal-Organic Chemical Vapor Deposition (MOCVD), molecular beam epitaxy (MBE), atomic layer deposition (ALD), physical vapor deposition (PVD), Chemical Vapor Deposition (CVD), or any other deposition methods in a vacuum chamber. The CMOS/TFT backplane can be fabricated by existing CMOS/TFT technologies, e.g., by an Original Equipment Manufacturer (OEM), which can greatly simplify the manufacture process. For the integration, this technology enables to use low temperature bonding, e.g., eutectic bonding, at a wafer-level alignment. The eutectic bonding can produce hermetically sealed packages and electrical interconnection within a single process and be conducted at low processing temperatures, low resultant stress induced in final assembly, high bonding strength, large fabrication yield and a good reliability.

Additionally, after the integration and before patterning the multi-layered LED structure to form the LED arrays, a protective mask can be formed to be aligned with drive electrodes in the respective pixel circuits of the CMOS/TFT backplane. As the drive electrodes in the CMOS/TFT backplane are also formed with a predetermined mask during the CMOS manufacturing process, the protective mask for the patterning can be determined based on information of the predetermined mask for the drive electrodes, thus enabling a high alignment accuracy.

The technology can use one or more quantum well layers of Group III-V compounds (e.g., GaN) as light emissive layers, which makes the LED arrays more energy efficient and more stable than OLED (organic LED) based arrays. For example, the LEDs can be ultraviolet (UV) or deep UV LEDs, blue LEDs, green LEDs or red LEDs, by controlling the quantum well layers such as InGaN/GaN. The technology can also use phosphor materials or quantum-dot materials deposited on the III-V compound based LED arrays to produce multi-color displays. The technology can use isolation spacers to isolate conductive connection of adjacent LEDs and/or deposited phosphor materials or quantum dot materials on the adjacent LEDs. The isolation spacers can include an opaque dielectric material (e.g., SiNx) or a black material and can be configured to block or eliminate light propagation between the adjacent LEDs to thereby eliminate cross-talk between the adjacent LEDs. The technology can also integrate non-volatile memories, e.g., SRAM (static random-access memory), with the LEDs to form active-matrix LED pixels, enabling higher efficiency and faster response time than passive-matrix LED pixels. Furthermore, the technology allows integrating non-volatile memories and drivers on the CMOS/TFT backplane, which greatly simplifies processing, achieves seamless integration and reduces cost. A touch-sensitive protective film can be formed on surfaces of the LED pixel arrays to form a capacitance sensitive screen.

In some implementations, the integrated LED structure and CMOS backplane on semiconductor substrates enable the use of standard semiconductor IC (integrated circuit) manufacturing equipment, facilities, and processes, resulting in reduced cost. The integrated LED arrays on the semiconductor substrate enables fabrication of an ultra-high resolution display, e.g., 100 µm per pixel, and/or micro-LED (µ-LED) displays with extremely high efficiency to save energy. The integrated LED pixel array-based display systems, particularly micro-display systems, can achieve low power consumption (e.g., one order of magnitude lower than current display devices), high resolution (e.g., 1080p), a thin device thickness (e.g., no more than 1 mm), a large view angle (e.g., no less than 160 degrees), fast response time (e.g., ns), a high luminance contrast modulation (e.g., 100%), and/or low cost due to integration. Particularly, the response time of the integrated LED systems can be three orders of magnitude faster than that of OLED systems, and can eliminate flickering issues existing in OLED displays, when pulse-width-modulation (PWM) technology is adopted.

The technology can use packaging techniques, e.g., conductive grid array packaging such as ball grid array (BGA) package, to form larger displays with multiple integrated LED pixel array micro-displays (display modules or panels), as described in a U.S. patent application Ser. No. 15/396, 135, entitled "LARGER DISPLAYS FORMED BY MULTIPLE INTEGRATED LED ARRAY MICRO-DISPLAYS" and filed on Dec. 30, 2016, whose content is hereby incorporated by reference in its entirety. On one hand, the larger displays can still have the advantages of integrated LED pixel array microarrays as noted above. On the other hand, this technology can overcome the current dimensional limit of displays fabricated by using standard silicon wafers. Using multiple LED pixel arrays based micro-displays to compose and assemble a larger micro-LED display, e.g., active-matrix, enables an unlimited size display at a significantly lower cost. Moreover, the integrated LED pixel array micro-displays can form LEDs or LED pixels all over areas of the micro-displays, including edges of the micro-displays, such that adjacent micro-displays have substantially no or little gap, e.g., less than 1 mm, which makes the larger display a whole piece to seamlessly display a single image or video. In some cases, the illumination areas over the physical areas of the larger displays can be about 50% or more, e.g., 90%, substantially larger than those of LCD displays or OLED displays.

In some implementations, CMOS backplanes based display systems can have a pixel size less than 5.0 μm, a response time faster than 0.1 μs, and/or an emitting light flux higher than 20 cd/mm^2. The display systems can have a thickness less than 1.0 mm, and/or a display area larger than 50 mm×50 mm. The display systems can be flexible.

Compared to CMOS backplanes formed on a semiconductor wafer, TFT backplanes can be formed on a larger substrate (e.g., glass) to form a larger display. Also TFT backplanes can be formed and connected on a flexible substrate (e.g., a polyimide film or a stainless steel) to form a flexible device. In some implementations, TFT backplanes based display systems can have a pixel size less than 10 μm, a respond time faster than 1.0 μs, and/or an emitting light flux higher than 10 cd/mm^2. The display systems can have a thickness less than 1.0 mm, and/or a display area larger than 100 mm×100 mm. The display systems can be flexible, rollable, and foldable.

The TFT backplanes can be low-temperature polysilicon (LTPS) active-matrix (AM) TFT control backplanes. For example, multiple LED structures formed on multiple wafers (e.g., silicon or sapphire) can be aligned and bonded to TFT backplanes formed on a polyimide film that is formed on a carrier glass. The wafers for the LED structures can be first removed, e.g., by laser lift-off. Then the LED structures can be patterned to form individual LED arrays to thereby form active-matrix LED pixel arrays. Phosphor materials or quantum-dot materials can be deposited on the LED pixel arrays to form multi-color LED pixel arrays.

After the integrated LED pixel arrays are formed, the carrier glass can be removed, e.g., by laser lift-off, to form a flexible device.

These integrated LED pixel arrays based devices or systems can be widely used in many applications, including portable electronic and communication devices, such as wearable devices (e.g., eyeglasses, watches, clothes, bracelets, rings), mobile devices, virtual reality (VR)/augmented reality (AR) displays, monitors, televisions (TVs), or any lighting or display applications.

The details of one or more disclosed implementations of the subject matter described in this specification are set forth in the accompanying drawings and the description below. Other features, aspects, and advantages will become apparent from the description, the drawings and the claims.

BRIEF DESCRIPTION OF THE DRAWINGS

FIGS. 4A-1 and 4A-2 are perspective views of a multi-layered LED structure formed on a substrate.

FIGS. 4A-3 and 4A-4 are schematic diagrams of example multi-layered LED structures on a sapphire substrate (FIG. 4A-3) and on a silicon substrate (FIG. 4A-4), respectively.

FIGS. 4B-1 and 4B-2 show schematic diagrams of an example CMOS backplane device.

FIG. 4B-3 is a cross-sectional view of the CMOS backplane device of FIG. 4B-2.

FIGS. 4C-1 and 4C-2 show schematic diagrams of an intermediate metal layer formed on the CMOS backplane device of FIG. 4B-2.

FIGS. 4D-1 and 4D-2 show schematic diagrams of bonding the multi-layered LED structure on the substrate of FIG. 4A-1 to the CMOS backplane device of FIG. 4B-1.

FIG. 4D-3 shows a cross-sectional diagram of the bonded device including the multi-layered LED structure and the CMOS backplane device.

FIG. 4F-1 is a perspective view of the bonded device after patterning the multi-layered LED structure.

FIG. 4F-2 shows a cross-sectional diagram of the patterned device of FIG. 4F-1.

FIGS. 6B-1 and 6B-2 show schematic diagrams of an example TFT backplane device formed on a polyimide film on a carrier glass.

FIGS. 6D-1 and 6D-2 show schematic diagrams of bonding an LED device of FIG. 6A and the TFT backplane device of FIGS. 6B-1 and 6B-2.

FIGS. 6D-3 shows a cross-sectional diagram of a bonded device including a rectangular shape LED structure on the TFT backplane device.

FIGS. 6D-4 shows a schematic diagram of multiple rectangular shape LED structures bonded on the TFT backplane device.

DETAILED DESCRIPTION

The following descriptions are example display devices or systems that include integrated light-emitting diode (LED) pixel arrays on rigid substrates or flexible substrates. However, the disclosed implementations can be adopted to any suitable system that needs forming integration of two separate components, e.g., arrays of light-emitting elements and backplanes including integrated circuits, e.g., non-volatile memories and/or drivers. For example, the substrates can be made of any suitable material, e.g., rigid substrates such as silicon, silicon oxide, silicon carbide, gallium nitride, sapphire, glass, or spinel, or flexible substrates such as a polyimide film or a stainless steel. The light-emitting elements can include any suitable light sources, e.g., semiconductor based LEDs, OLEDs, laser diodes, or lasers such as vertical-cavity surface-emitting laser (VCSELs). The backplane can be a CMOS backplane or a TFT array control backplane.

Figure 1:
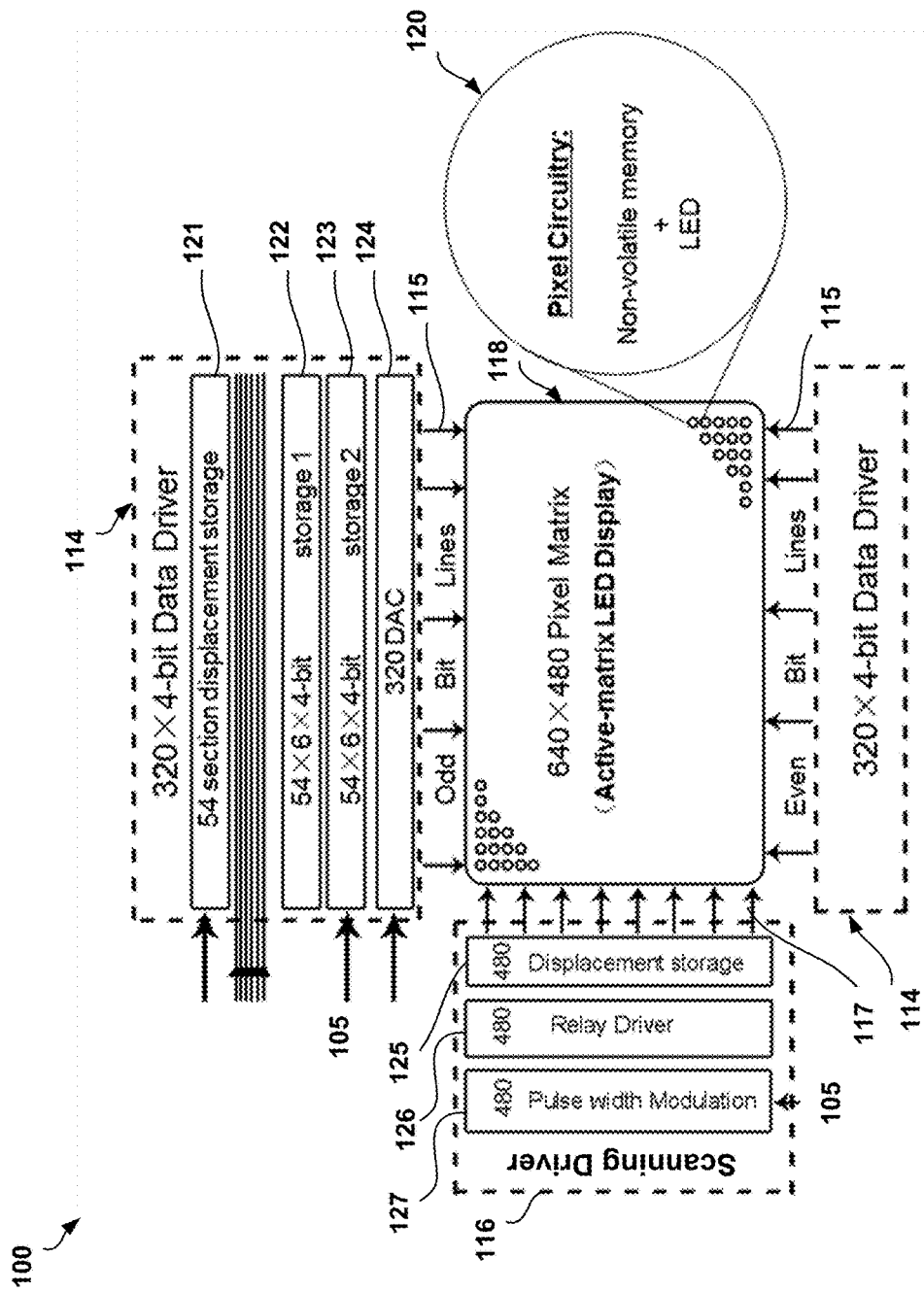
FIG. 1 is a schematic diagram of an example integrated LED pixel array based display system, according to one or more implementations of the present disclosure.
Figures 2A, 2B:
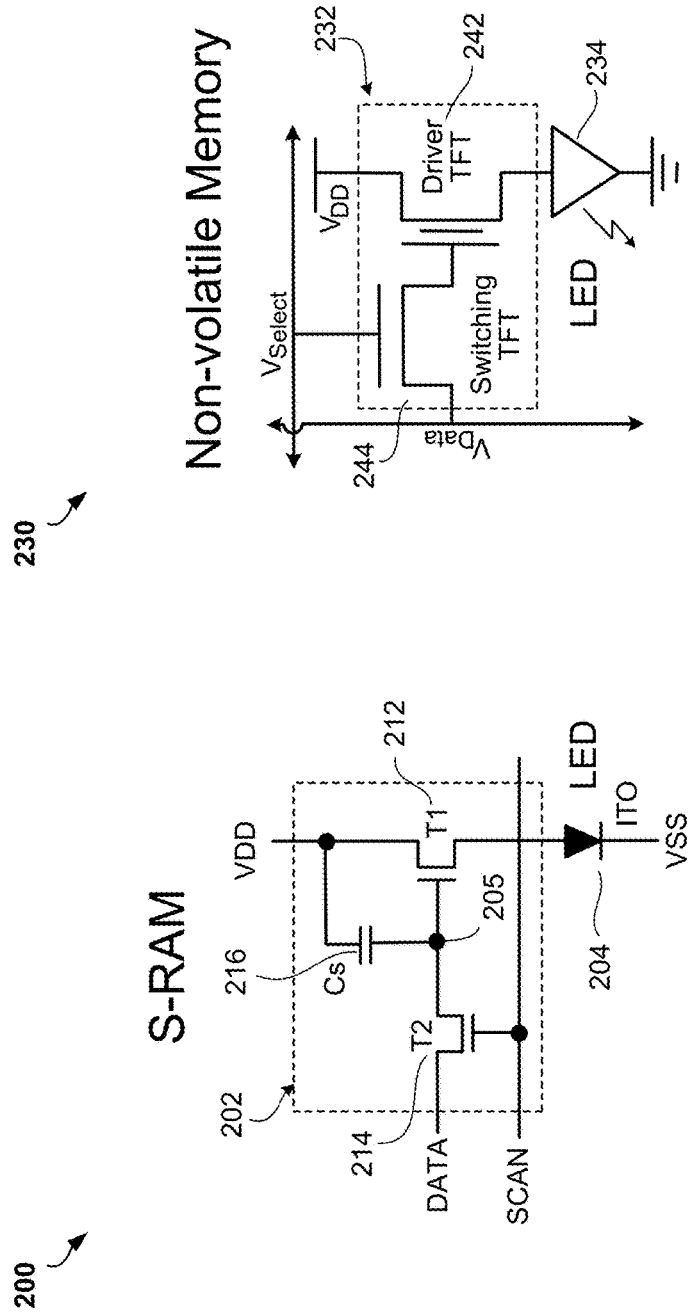
FIGS. 2A-2B are schematic diagrams of example active-matrix LED pixels, according to one or more implementations of the present disclosure.
Figure 3A:
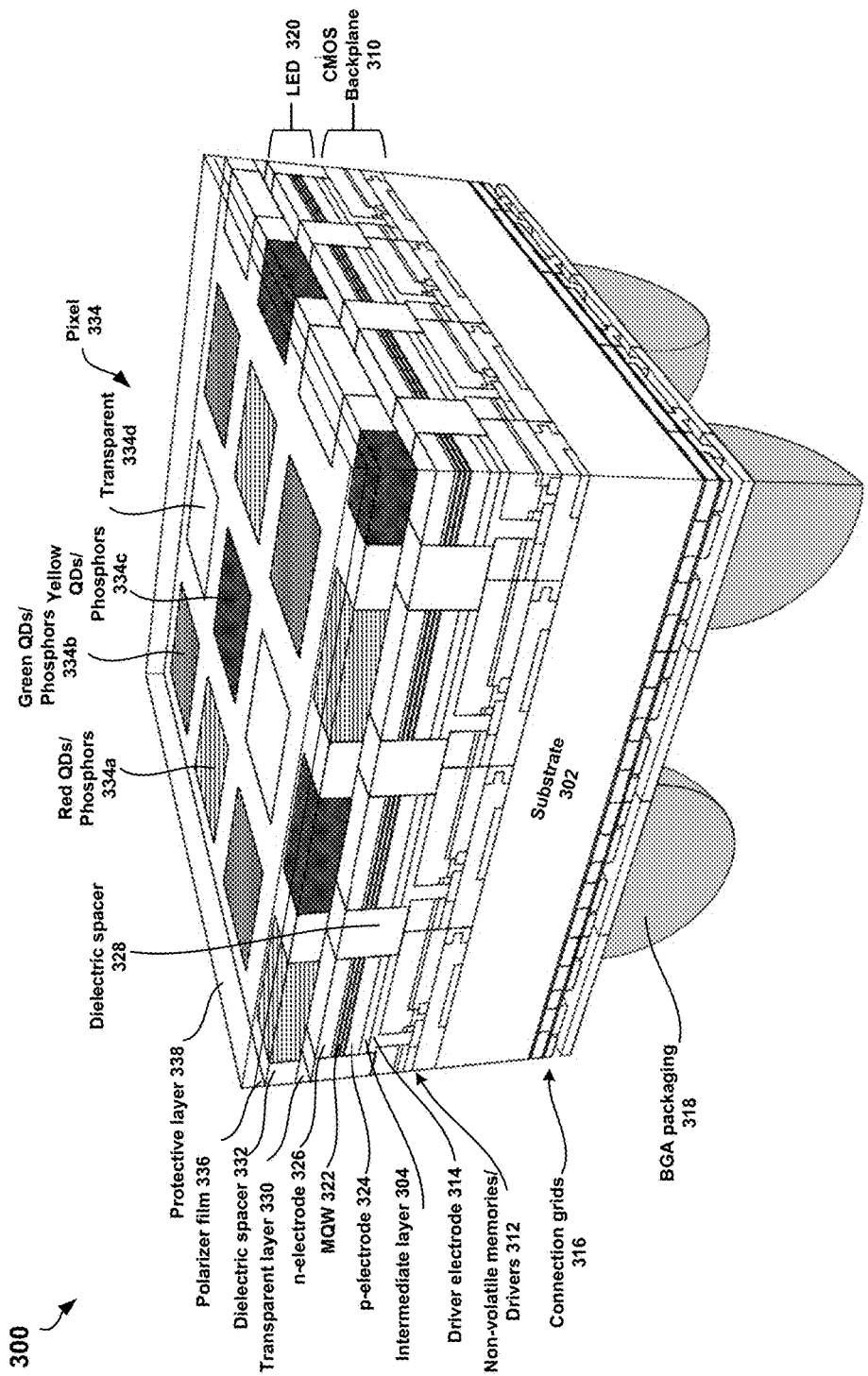
FIG. 3A is a perspective view of an example integrated display system using CMOS backplane and LED bonding, according to one or more implementations of the present disclosure.
Figure 3B:
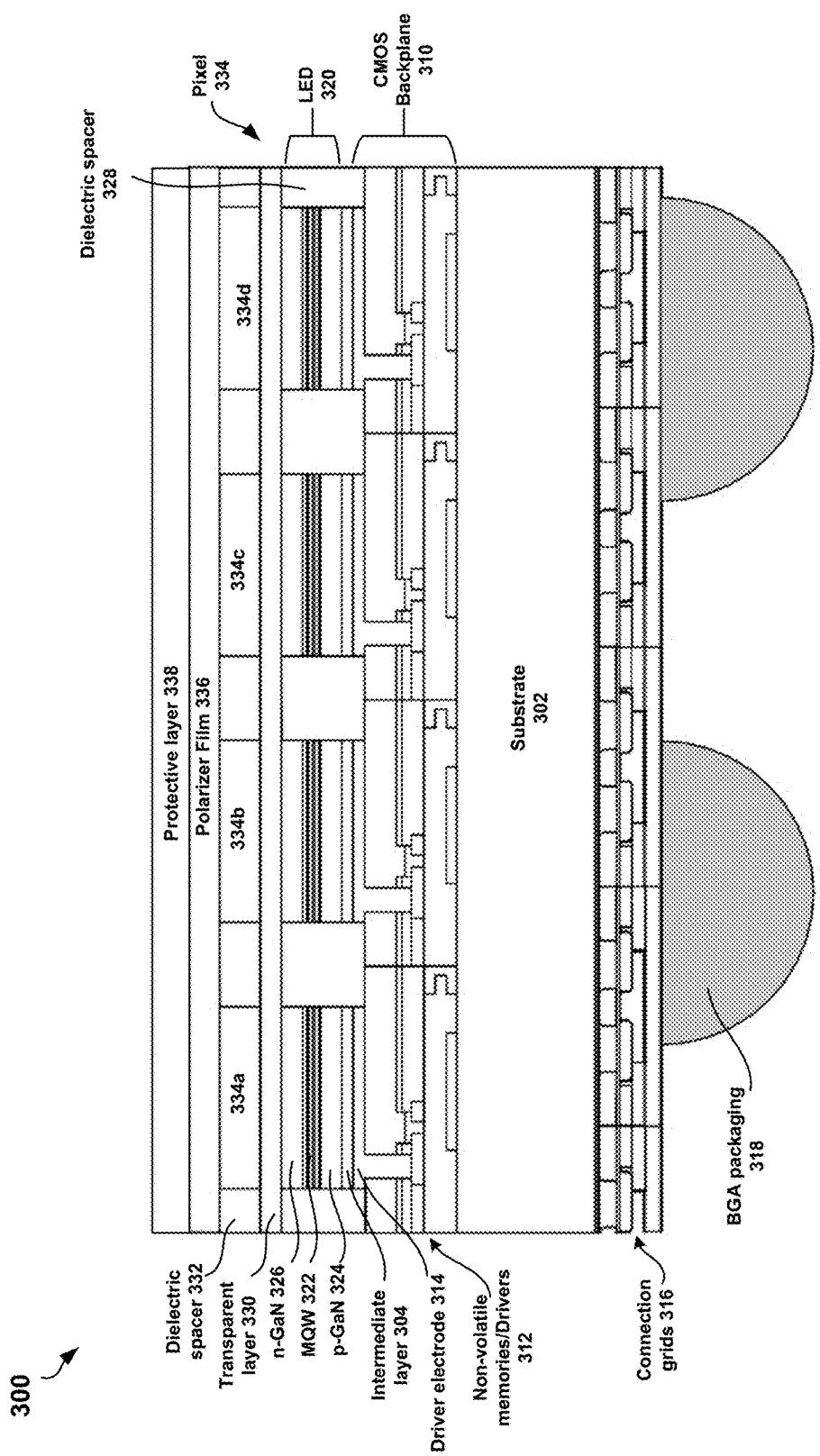
FIG. 3B is a cross-sectional view of the integrated display system of FIG. 3A.
Figures 2, 4A:
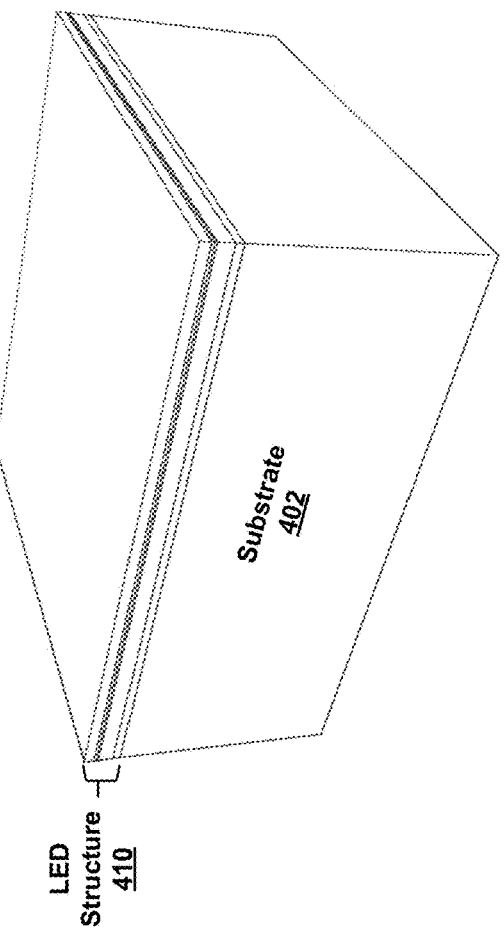
Figures 1, 4A:
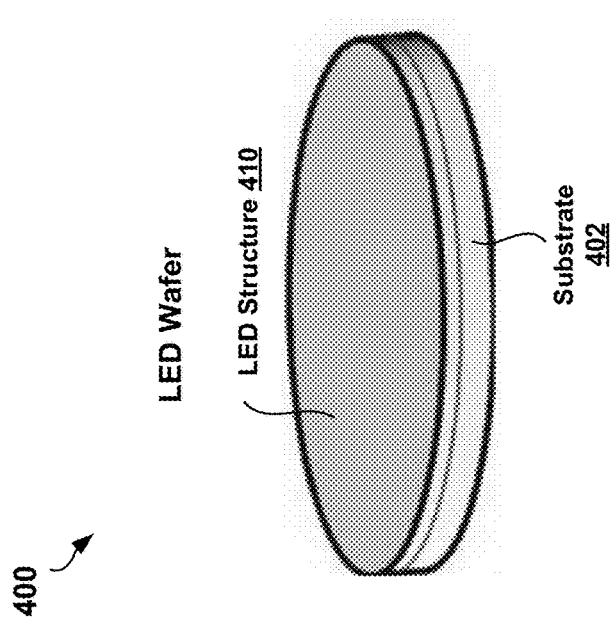
Figure 4I:
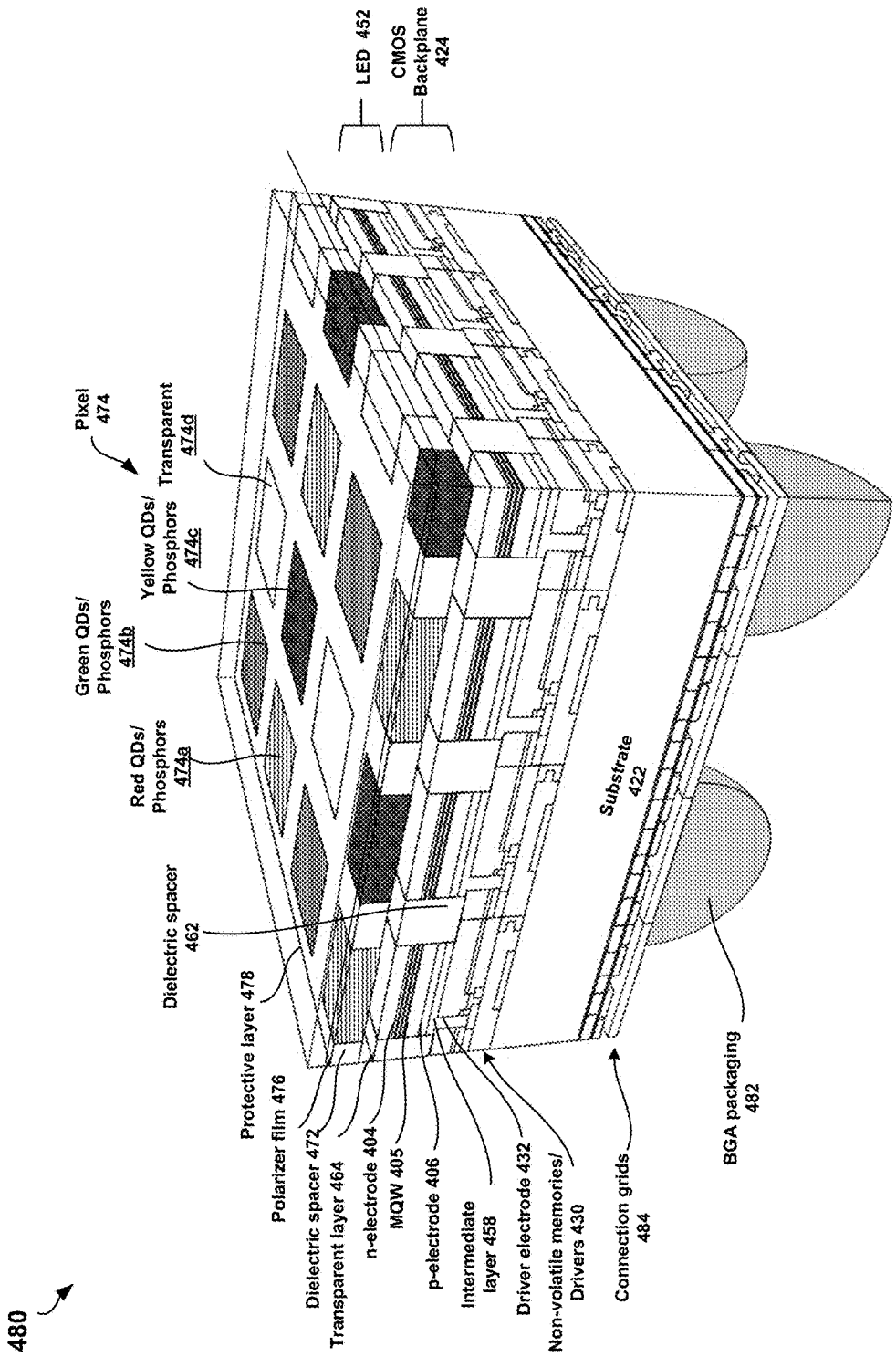
FIG. 4I is a perspective view of forming a BGA packaging on a bottom of the CMOS backplane device.
Figure 5A:
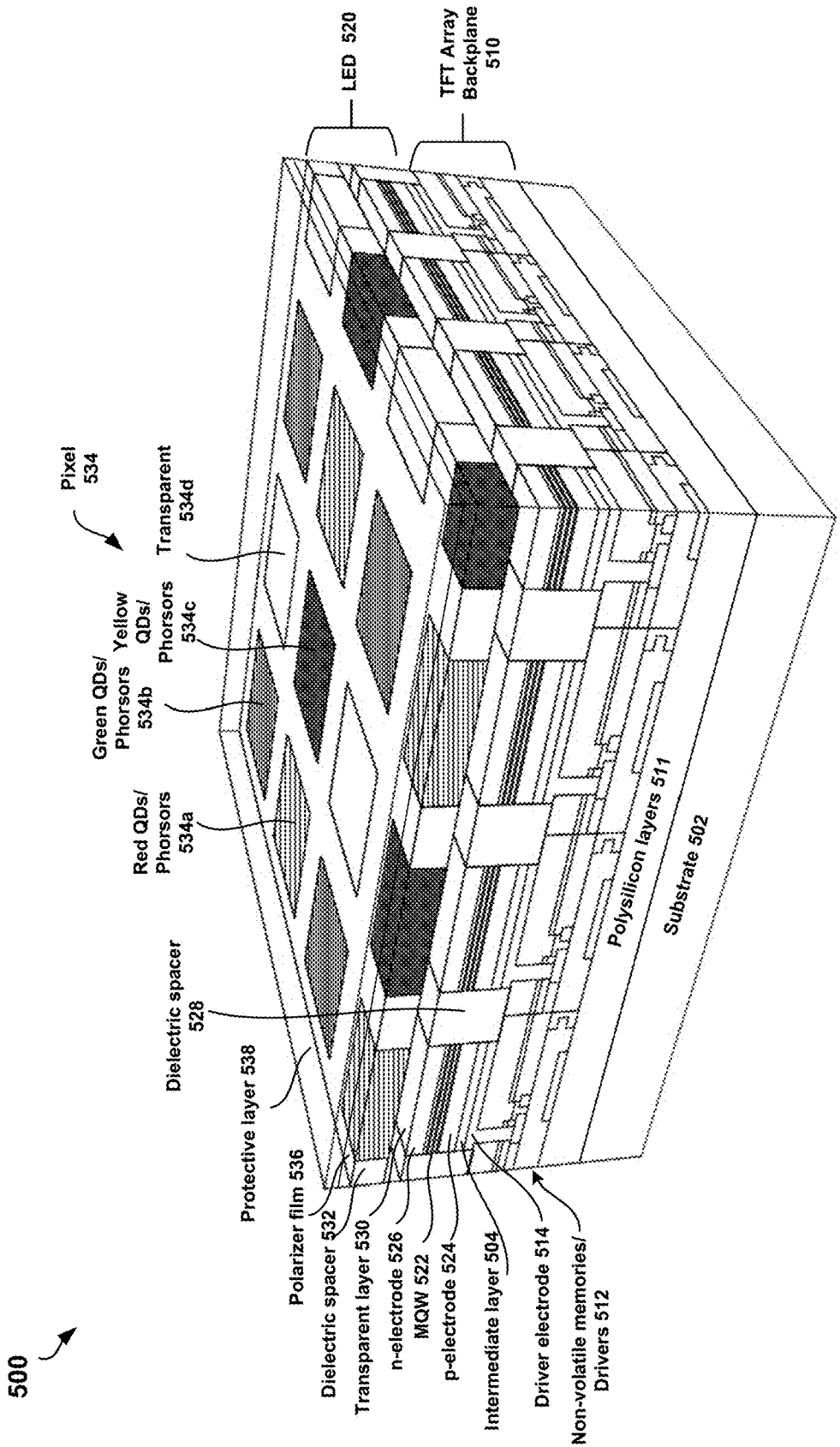
FIG. 5A is a perspective view of an example integrated display system with multi-color LED pixel arrays fabricated by TFT array control backplane and LED bonding, according to one or more implementations of the present disclosure.
Figure 5B:
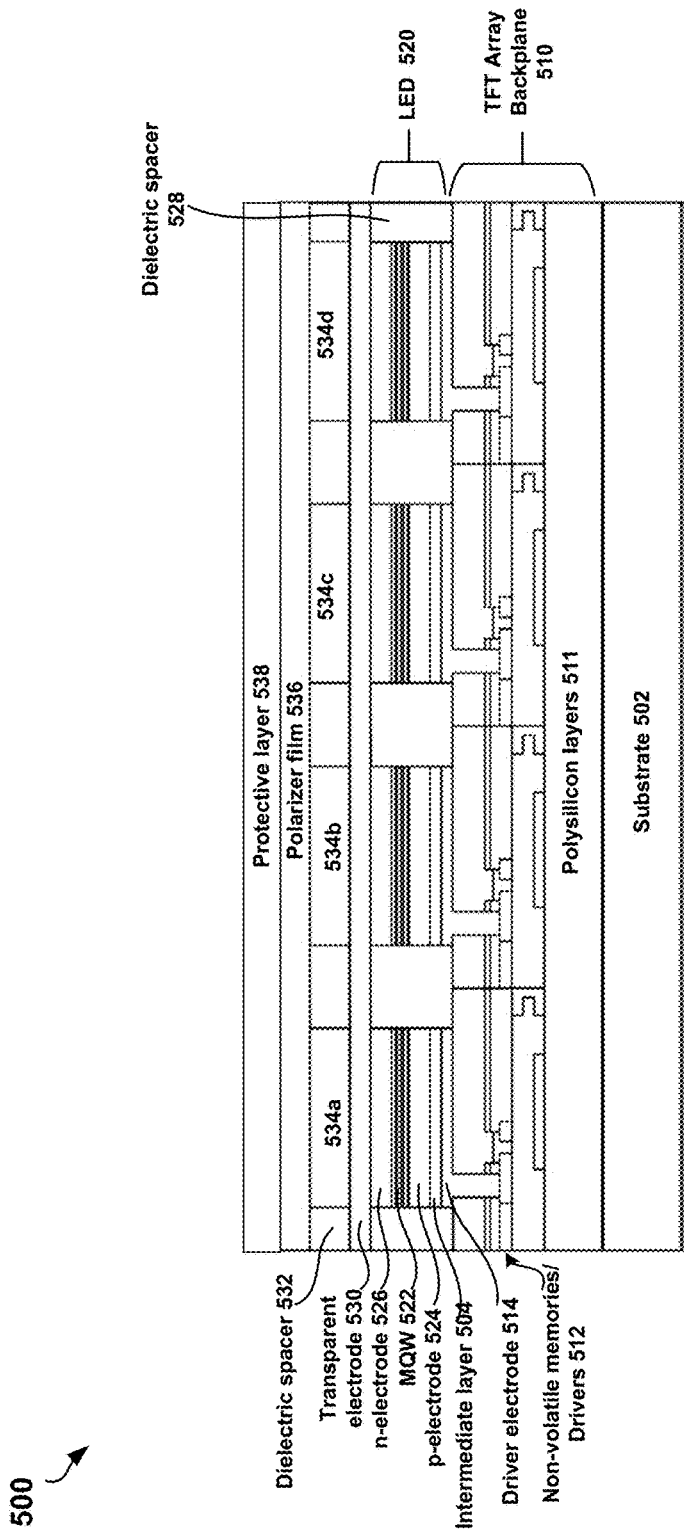
FIG. 5B is a cross-sectional view of the integrated display system of FIG. 5A.
Figure 6A:
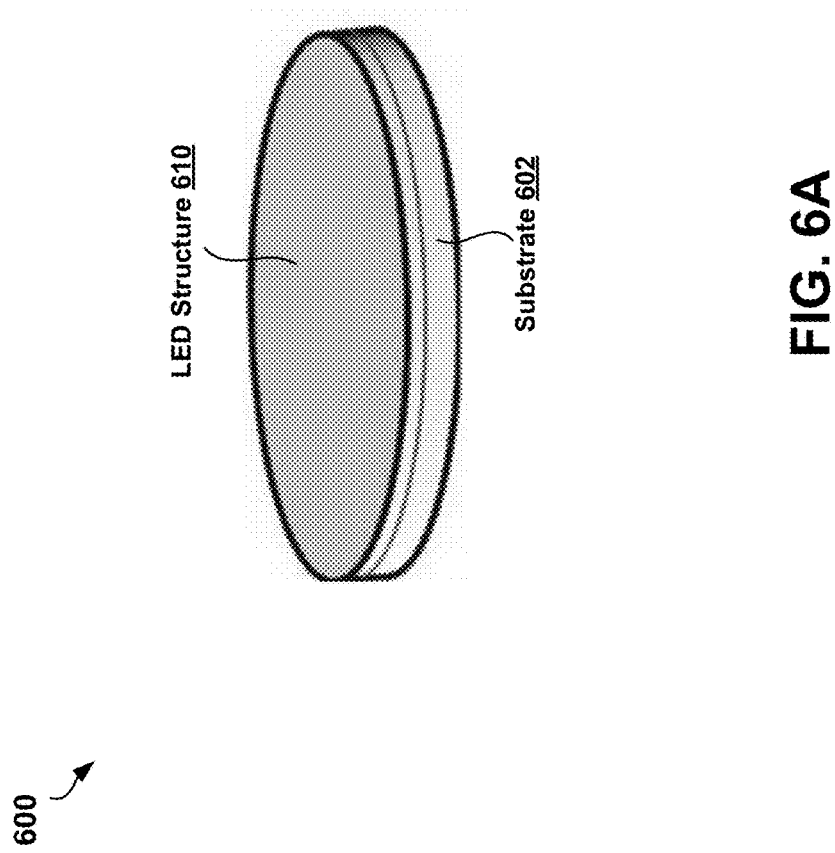
FIG. 6A is a schematic diagram of a multi-layered LED structure formed on a substrate.
Figure 6I:
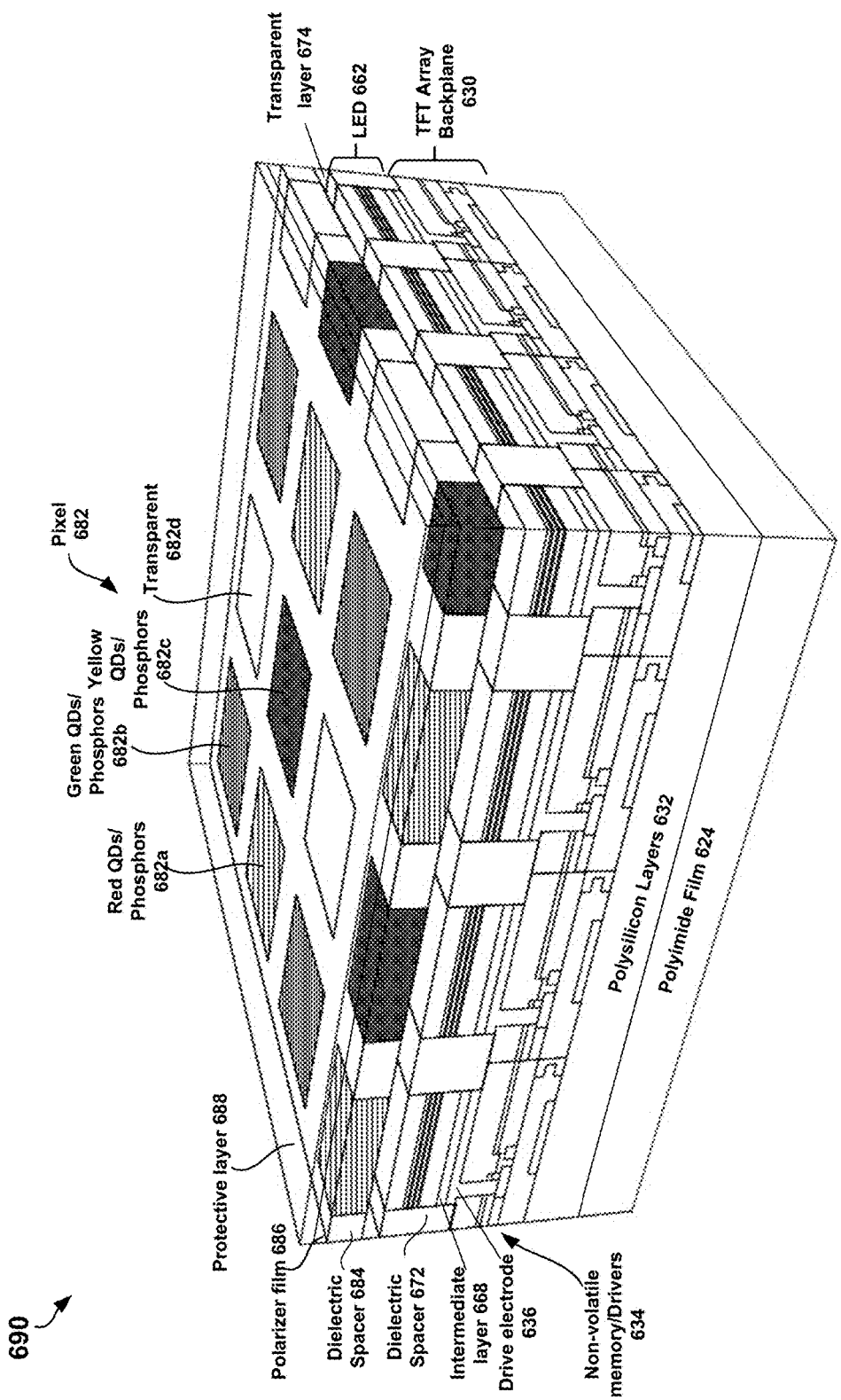
FIG. 6I is a perspective view of forming a flexible integrated active-matrix LED pixel array device after removing the carrier glass.
Figure 7:
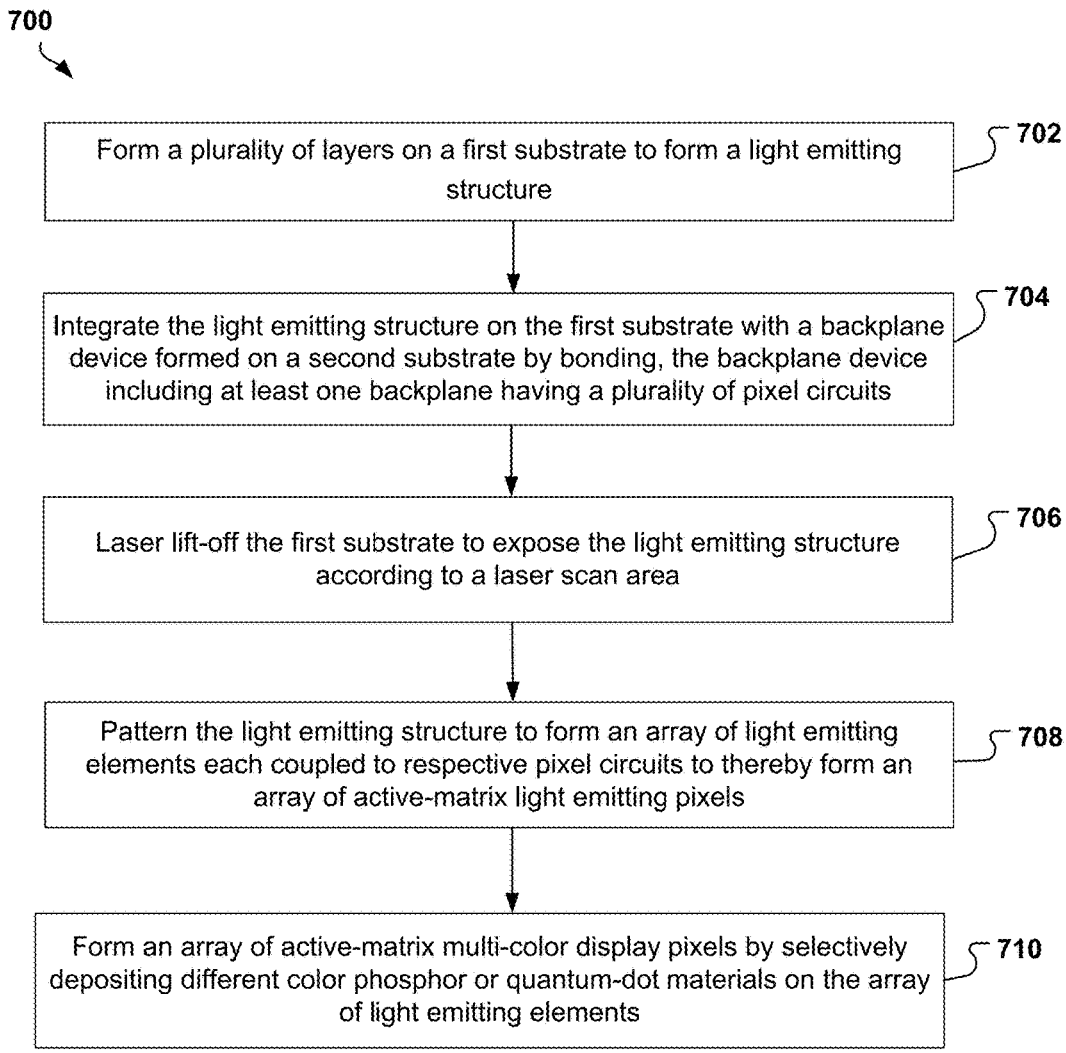
FIG. 7 is a flow diagram of an example process of forming an integrated active-matrix light-emitting pixel display system by bonding.

For illustration, in the following, FIG. 1 shows an example integrated LED pixel array based display system; FIGS. 2A-2B show example active-matrix LED pixels; FIGS. 3A-3B show an example integrated display system by CMOS backplane and LED bonding; FIGS. 4A-1 to 4I show steps of fabricating the display system of FIGS. 3A-3B; FIGS. 5A-5B show an example integrated display system by TFT array control backplane and LED bonding; FIGS. 6A-1 to 6I show different steps of fabricating the display systems of FIGS. 5A-5B; and FIG. 7 shows an example process of fabricating an integrated display system by bonding.

Example Display System

FIG. 1 is a schematic diagram of an example integrated LED pixel array based display system 100, according to one or more implementations of the present disclosure. The display system 100 can be a display module including LED pixel arrays and display drivers such as scanning drivers and data drivers. The display system 100 can be coupled to a control system, e.g., via a wired or wireless connection. The control system can control the display system 100 to operate to display images/videos.

In some implementations, the control system includes one or more processors and/or controllers, e.g., a central processing unit (CPU), a microcontroller unit (MCU), and/or integrated circuits (ICs), e.g., sensors, analog/digital converters (ADCs), digital/analog converters (DACs), amplifiers, drivers, and/or timers. The control system can also include a memory, e.g., a read-only memory (ROM) and/or a random-access memory (RAM). The processors and/or controllers can be coupled to the memory via connections, e.g., internal bus, conductive electrodes, wired connections, or wireless connections. The processors and/or controllers are configured to read data from or store data into the memory. For example, the processors and/or controllers can receive image or video data to be displayed, e.g., from external network or devices, process the image or video data, and/or store the processed image or video data in the memory. The memory can also store instructions to cause the processors and/or controllers to execute operations. Components of the control system can be monolithically manufactured on a semiconductor substrate.

In some implementations, the control system includes one or more digital signal processors including: a digital signal analyzer, a digital processor, an image processor, a volatile memory, a non-volatile memory, and/or a touch screen processor. The control system can also include one or more analog signal processors including a light signal sensor, an electrical signal sensor, a sound signal sensor, a sound signal processor, an analog signal amplifier, an ADC, a DAC, a touch screen signal processor, and/or any other associated electronic components. The analog signal processors are connected to and communicate with the digital signal processors through an ADC and/or a DAC. In operation, the analog signal processors can receive and process image or video signals from external devices or network or from the internal memory. The image or video signals may be analog signals which can be processed and converted into digital signals by an ADC. The digital signals are further processed and analyzed by the digital signal processors. Then the processed digital data can be further transmitted from the digital signal processors to particular data drivers and scanning drivers which then select particular LEDs and control the selected LEDs for display.

The display system 100 includes an active-matrix LED pixel array 118, a data driver 114 and a scanning driver 116. As illustrated in FIG. 1, the LED pixel array 118 is composed of 640 (columns)×480 (rows) pixel matrix arranged in columns and rows, respectively. Each pixel 120 is an active-matrix LED pixel. As illustrated in FIGS. 2A-2B below, an active-matrix LED pixel includes at least one LED and at least one non-volatile memory coupled to the at least one LED. Upon receiving the data instructions from the scanning driver 116 and/or the data driver 114, the non-voltage memory can enable each pixel to operate continuously and independently without waiting for the next instruction coming after a full scan.

The number of LEDs in the LED pixel array 118 is equal to n times of the number of pixels, where n is an integer. If each pixel includes one LED, n is 1; if each pixel includes two LEDs, n is 2; if each pixel includes three LEDs, n is 3; if each pixel includes four LEDs, n is 4.

In some examples, an LED pixel includes a plurality of LEDs, e.g., blue, red, and green LEDs, and a plurality of corresponding non-volatile memories. Each LED is coupled to a respective non-volatile memory. In some examples, the LED pixel includes a white LED. In some examples, the LED pixel includes four LEDs including three LEDs emitting basic light such as red, blue, and green, and a white LED emitting white light. In some examples, one non-volatile memory is coupled to one LED. In some example, one non-volatile memory is coupled to two or more LEDs emitting the same color, and the two or more LEDs can be in two or more different pixels.

In some implementations, the scanning driver 116 includes 480 displacement storages 125, 480 relay drivers 126, and 480 pulse width modulators 127. Each row of LED pixels is coupled to a respective displacement storage 125, a respective relay driver 126, and a respective pulse width modulator 127 through a respective word line (or scanning line) 117. The scanning driver 116 can receive instructions from the control system, e.g., the processors/controllers, and select one or more particular LED pixels based on those instructions.

In some implementations, the data driver 114 is divided into two sub-drivers positioned on top and bottom of the array 118 of LED pixels, respectively. Each sub-driver can be a 320×4-bit data driver and include 54 section displacement storage 121, 54×6×4-bit storages 122 and 123, and/or 320 digital-to-analog converters (DACs) 124. Each sub-driver is coupled to 320 columns of LED pixels through respective column bit lines. Particularly, the top sub-driver is coupled to 320 columns of LED pixels through odd column bit lines, and the bottom sub-driver is coupled to another 320 columns of LED pixels through even column bit lines. An intersection of an individual bit line 115 and an individual word line 117 is coupled to a respective LED pixel. That is, selecting the individual bit line 115 and the individual word line 117 can uniquely select the respective LED pixel. The sub-data drivers can receive instructions and/or data from the control system, e.g., the processors/controllers, and select one or more particular LED pixels with the scanning driver 116 based on the instructions and/or data and transmit data to the selected particular LED pixels through respective bit lines 115.

In some implementations, the active-matrix LED pixel array 118 is covered by a protective layer, as illustrated in FIGS. 3A and 3B below. The protective layer can be transparent. In some examples, the protective layer is made of glass coated with a conductive material like indium tin oxide (ITO). The protective layer defines an array of spots corresponding to the array of LEDs. Each spot covers an LED underneath and is coupled to a corresponding non-volatile memory coupled to the LED. The spot and the surface of the LED may form a capacitor, and/or one or more additional capacitors may be formed between the spot and the LED. When the spot is touched, e.g., by a fingertip on top of the spot or moving towards the spot, a capacitance of the capacitors can change. The capacitance change can be detected by a touch screen detector/processor in the control system through the non-volatile memory and a corresponding data driver 114/scanning driver 116 coupled to the non-volatile memory. Thus, the protective layer, the LED array, and the corresponding non-volatile memories can form a touch screen position sensor, which, together with the touch screen detector/processor in the control system, enables the LED pixel display system 100 to function as a touch screen display. Additional implementations of the touch screen sensor on the LEDs are also possible, e.g., using other technologies like resistive sensing, surface acoustic wave, infrared grid, infrared acrylic projection acoustic pulse recognition, or dispersive signal technology.

In some implementations, as discussed in further details below, the display system 100 is formed by integrating a multi-layered LED structure formed on a first substrate and a backplane device formed on a second substrate and then processing the integrated LED and backplane device. The data drivers, the scanning drivers, the non-volatile memories, and the connection lines including the bit lines and the word lines can be integrated in the backplane device. The LED array can be formed by patterning the multi-layered LED structure, and the LED array can be conductively coupled to the non-volatile memories in the backplane device to form active-matrix LED pixel arrays. Different color phosphor materials or quantum dots materials can be selectively deposited on surfaces of the LEDs in each of the active-matrix LED pixels to form active-matrix multi-color display pixel array. The backplane device can be configured to drive, e.g., transmit display data to, the active-matrix multi-color display pixel array by pulse-width-modulation (PWM) technology. Due to fast response time (e.g., nanoseconds) of the LEDs, flickering issues can be eliminated and the display system 100 can be flicker free.

Example Active Matrix LED Pixels

FIG. 2A shows an example active-matrix LED pixel 200 with non-volatile memory. The LED pixel 200 includes an S-RAM (static-random access memory) 202 and an LED 204. The S-RAM 202 includes a driver transistor (T1) 212, a switching transistor (T2) 214, and a storage capacitor (Cs) 216. During display operation, a word line (scanning line or select line) can be pulled high to allow a voltage on a bit line to propagate through the switching transistor 214 to a storage node 205, charging the storage capacitor 216 and setting a high voltage on a gate of the driver transistor 212. This allows a current to pass through the driver transistor 212 and the LED 204 is consequently lighted.

FIG. 2B shows another example active-matrix LED pixel 230 with non-volatile memory 232 and an LED 234. The non-volatile memory 232 includes a driver transistor 242 and a switching transistor 244, that can be thin-film transistors (TFTs). In some implementations, different from the LED pixel 200 in FIG. 2A, the brightness of the LED 234 is not controlled by varying $V_{Data}$ applied to a gate of the driver transistor 242 through the switching transistor 244. Instead, a constant $V_{Data}$ is applied to the gate of the driver transistor 242. The current through the driver transistor that causes the LED 234 to illuminate is controlled by changing a threshold voltage VT of the driver transistor 242, e.g., through programming. If low brightness is desired, the driver transistor 242 can be set to a high threshold voltage by programming with a large positive gate pulse. If high brightness is desired, the driver transistor 242 can be set to a low threshold voltage by programming with a small positive gate pulse, or not programming at all, the leaving it with the initial threshold voltage. Thus, an image or video can be displayed by controlling the brightness or on/off status of the LEDs of an array.

Figure 2C:
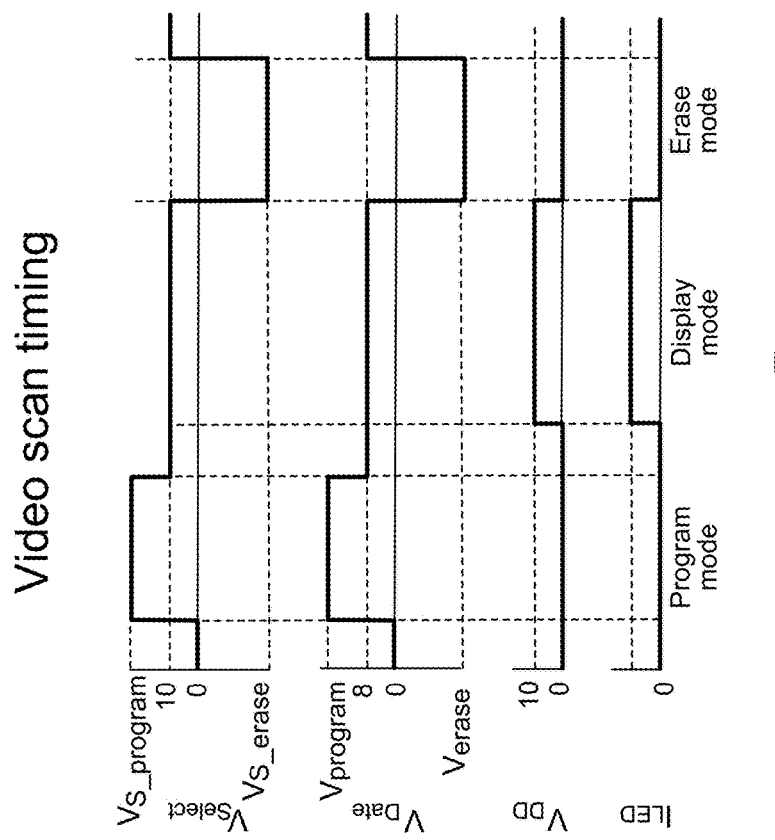
FIG. 2C shows an example timing diagram using active-matrix LED pixels for a video display, according to one or more implementations of the present disclosure.

FIG. 2C shows an example video scan timing 250 of a display using the active-matrix LED pixel 230 of FIG. 2B. After programming (i.e., programming mode), the display is activated by setting a supply voltage $V_{DD}$ to 10 V, $V_{Data}$ to 8 V on all the bit lines, and $V_{Select}$ to 10 V on all the word lines (select lines). The LED current and therefore brightness of the pixel 230 is determined by the programmed threshold voltage of the driver transistor 242. Both $V_{Data}$ and $V_{Select}$ are DC voltages in the display mode because a pixel refresh is not necessary to maintain a static image. The image information remains stored in the threshold voltage of the driver transistor 242 even if the power is turned off. To change the programmed image, the pixels can be first erased and then reprogrammed. Erase mode in FIG. 2C is identical to the program operation. The only difference is that the applied voltage pulse has a larger negative amplitude, instead of a positive one. This negative voltage forces the trapped electrons in the driver transistor 242 to tunnel back out, causing the threshold voltage to shift towards its original un-programmed value. For example, to erase a single pixel in the active matrix (instead of an entire column), all other select lines can be held at −30 V to prevent the erase pulse from propagating to the undesired pixel drivers.

Example Systems and Fabricating Processes Using CMOS Backplanes

FIGS. 3A-3B show an example integrated display system 300 using CMOS backplanes. The integrated display system 300 can be the display system 100 of FIG. 1. This integrated display system 300 can be formed according to steps described with further details in FIGS. 4A-1 to 4I.

As illustrated in FIGS. 3A-3B, the integrated display system 300 includes a backplane 310 on a first side of a semiconductor substrate 302. The semiconductor substrate 302 can be a silicon substrate, e.g., a silicon wafer. The backplane 310 can be a CMOS backplane formed in a CMOS backplane device. The CMOS backplane device can include one or more CMOS backplanes and can be manufactured by existing CMOS manufacturing technologies.

The backplane 310 includes integrated circuits having non-volatile memories and display drivers 312. In some implementations, the backplane 310 includes a number of pixel circuits. Each pixel circuit includes a non-volatile memory that has at least one transistor conductively coupled to a corresponding drive electrode 314 in a top layer of the backplane 310. The display drivers include scanning drivers and data drivers, and each of the non-volatile memories is coupled to one of the scanning drivers through at least one word line and to one of the data drivers through at least one bit line.

The integrated display system 300 includes an array of light-emitting elements such as LEDs 320. The LEDs 320 are separated (or isolated) by isolation spacers, e.g., dielectric spacers 328. The dielectric spacers 328 are configured to isolate the LEDs 320 such that the LEDs 320 are not conductively connected. The dielectric spacers 328 can include an opaque dielectric material or a dielectric material with a light-absorbing material such as a black material, such that light from an LED is blocked or eliminated from propagating to an adjacent LED and thus there is no or little cross-talk between the adjacent LEDs. The opaque dielectric material can include silicon nitride (SiNx). SiNx has a hexagonal crystal structure at an ambient pressure and sintered ceramic of this phase is opaque. Each LED 320 can include a first contact electrode such as p-electrode 324 (e.g., p-GaN layer), a second contact electrode such as n-electrode 326 (e.g., n-GaN layer), and multiple quantum well (MQW) semiconductor layers 322 between the p-electrode 324 and the n-electrode 326. The MQW layers 322 can include group III-V nitrides (e.g., GaN) and each of the LEDs 320 is operable to emit light with a primary color, e.g., blue, green, or red.

The emitted wavelength of the LEDs is dependent on the MQW materials' band gap and can be controlled by a thickness of InGaN layer (e.g., in a range of 2-3 nm) and GaN/InN ratio, from near ultraviolet for 0.02In/0.98Ga through 390 nm for 0.1In/0.9Ga, violet-blue 420 nm for 0.2In/0.8Ga, blue 440 nm for 0.3In/0.7Ga, green 532 nm for 0.5In/0.5Ga, to red for higher ratios In/Ga. The LEDs can also be ultraviolet (UV) or deep UV LEDs with an emitted wavelength within a range from 100 nm to 450 nm. The MQW material can include AlGaN, InAlGaN, or AlN.

For illustration, in FIGS. 3A and 3B, the LEDs 320 are blue color LEDs operable to emit light with a blue color. The MQW layers can include multiple pairs of In(0.3)Ga(0.7)N/GaN layers. In some other implementations, the LEDs can be UV or deep UV LEDs operable to emit light with a wavelength between 100 nm to 450 nm. The MQW layers can include multiple pairs of GaN/AlxGa(1−x)N layers. In some other implementations, the LEDs can be green color LEDs operable to emit light with a green color. The MQW layers can include multiple pairs of In(0.5)Ga(0.5)N/GaN layers. In some other implementations, the LEDs can be red color LEDs operable to emit light with a red color. The MQW layers can include multiple pairs of InN/GaN layers.

Each LED 320 is coupled to a respective pixel circuit, e.g., a non-volatile memory, in the backplane 310 by conductively connecting the p-electrode 324 to a drive electrode 314 of the pixel circuit, e.g., through a respective intermediate conductive layer 304. In such a way, the array of LEDs 320 is coupled to respective pixel circuits in the backplane 310 to form an array of active-matrix LED pixels. As discussed with further details in FIGS. 4D-1 to 4D-3, the p-electrode 324 and the drive electrode 314 can be bonded together, e.g., by low temperature bonding such as eutectic bonding, through the intermediate conductive layer 304, e.g., a metallic layer such as ITO/Ti, Cu/Ta, Al/Sn, or Au/Cr films. Each LED 320 can be aligned, e.g., self-aligned, with the respective bonded drive electrode 314, e.g., by patterning as illustrated in FIG. 4F. In some cases, the LED 320 has a same area size as the drive electrode 314. In some cases, the LED 320 has a larger area size than the drive electrode 314. Underneath the LED 320, there may be dielectric material around the drive electrode 314. Each LED 320 is self-aligned with its respective intermediate layer 304 and has a same area size as the respective intermediate layer 304, due to simultaneous patterning, e.g., as illustrated in FIG. 4F.

A transparent conductive layer 330, e.g., an indium tin oxide (ITO) layer, is on top of the array of LEDs 320. The transparent conductive layer 330 is in contact with the n-electrodes 326 of the LEDs 320 to form a common electrode of the LEDs 320.

A phosphor material or a quantum dot material can be deposited on the transparent conductive layer 330 above at least one LED 320 and operable to emit a secondary light when excited by the light emitted from the LED 320. The secondary light can have a secondary color different from a primary color from the LED 320. As illustrated in FIGS. 3A-3B, red color quantum dot (QD) materials or phosphor materials 334a, green color QDs/phosphors 334b, and yellow color QDs/phosphors 334c can be deposited on the LEDs 320 and operable to emit light with red, green, and white colors, respectively, when excited by the blue color LEDs 320. The yellow color QDs/phosphors 334c on the blue LEDs 320 can form a white color LED to emit white color to increase a sharpness of displayed images/videos.

As an example, each pixel 334 in FIGS. 3A-3B includes a blue LED sub-pixel with a transparent layer 334d on the blue LED 320, a red LED sub-pixel with the red QDs/phosphor 334a on the blue LED 320, a green LED sub-pixel with green QDs/phosphors 334b on the blue LED 320, and a white LED sub-pixel with yellow QDs/phosphors 334c on the blue LED 320. Each sub-pixel includes a non-volatile memory in the backplane 310 coupled to the blue LED 320 via the drive electrode 314, the intermediate layer 304, and the p-electrode 324. The red QDs/phosphors 334a, green QDs/phosphors 334b, yellow QDs/phosphors 334c, and transparent layers 334d are isolated from each other by isolation spacers such as dielectric spacers 332. As noted above, the dielectric spacers 332 can include an opaque dielectric material SiNx or a dielectric material with a light-absorbing material such as a black material. The four LED sub-pixels can be arranged in a rectangular shape or a square shape. Each LED sub-pixel can have a size of about 30 μm or less. Each LED pixel can have a size of about 100 μm or less. In some implementations, a ratio between an area of light emission from the pixels and a physical area of the pixels is higher than 50%. In some other implementations, each LED pixel can also include three LED sub-pixels including a blue LED sub-pixel, a red LED sub-pixel, and a green LED sub-pixel.

As described above, in the system 300, a number of the LEDs 320 is larger than a number of the LEDs covered with the phosphor materials or quantum dots materials, and the number of the LEDs 320 is equal to at least two times of a number of the LED pixels. For example, each LED 320 is operable as a light-emitting diode (LED) to emit light with a blue color, e.g., with a wavelength between 450 nm and 500 nm, and, for each of the active-matrix light emitting pixels, at least two blue color LEDs are configured to optically excite at least two other colors, e.g., green and red, by secondary light emission of the phosphor materials or quantum dots materials on the at least two blue color LEDs. Thus, each of the active-matrix light emitting pixels is configured to be a multi-color display pixel including one blue color LED operable to provide a blue color and the at least two blue color LEDs with the phosphor materials or quantum dots materials operable to respectively provide a red color and a green color.

In some other implementations, each of the LEDs is operable as a UV or deep UV LED operable to emit light with a wavelength between 100 nm and 450 nm, and, for each of the active-matrix light emitting pixels, at least three UV or deep UV LEDs are configured to optically excite at least three colors, e.g., red, green, and blue, by secondary light emission of the phosphor materials or quantum dots materials on the at least three UV or deep UV LEDs. The pixel can also include a UV or deep UV LED deposited with yellow color phosphor materials or quantum dots materials operable to emit a white color.

Different color phosphor materials or quantum dots materials can have different secondary conversion efficiencies when excited by LEDs. In an example, for UV or deep UV LEDs, red color quantum dots materials can have 50% light conversion efficiency, green color quantum dots materials can have 60% light conversion efficiency, and blue color quantum dots materials can have 90% light conversion efficiency. In another example, for blue color LEDs, red color quantum dots materials can have 70% light conversion efficiency and green color quantum dots materials can have 80% light conversion efficiency. Also a blue color LED itself can have 100% light efficiency to emit a blue color.

To make a display have uniform brightness, e.g., each pixel element in a display pixel has the same intensity, methods can be adopted to compensate the different secondary conversion efficiencies from different color phosphor materials or quantum dots materials on LEDs.

In some implementations, differences between different light conversion efficiencies of different pixel elements in each display pixel can be compensated by controlling pixel area ratios among the different pixel elements in the display pixel. A pixel element having a larger light conversion efficiency can have a smaller area, and a pixel element having a smaller light conversion efficiency can have a larger area. Different areas of the different pixel elements can be achieved by preparing different areas of LEDs for different color pixel elements. As discussed in FIG. 4F-1 below, when patterning the LED structure into an array of LEDs, LEDs to be deposited with a phosphor or quantum dot material having a smaller light conversion efficiency can be designed and fabricated to have a larger area than LEDs to be deposited with a phosphor or quantum dot material having a larger light conversion efficiency or than LEDs to be deposited with a transparent layer.

In some implementations, differences between different light conversion efficiencies among different pixel elements in each display pixel can be compensated by controlling different drive currents for the different pixel elements in the display pixel, e.g., by the CMOS backplane 310. A pixel element having a larger light conversion efficiency can be driven by a smaller current, and a pixel element having a smaller light conversion efficiency can be driven by a larger current.

In some implementations, differences between different light conversion efficiencies among different pixel elements in each display pixel can be compensated by controlling pixel area ratios among the different pixel elements in the display pixel and controlling different drive currents for the different pixel elements in the display pixel together. For example, the pixel areas ratios among the different pixel elements can be designed for a larger compensation, and the drive currents for the different pixel elements can be designed for a smaller compensation, e.g., for fine tuning.

A polarizer film 336 is deposited on surfaces of the pixels 334 and the dielectric spacers 332. The polarizer film 336 is configured to allow light from the pixels 334 to propagate through along a polarization direction to become a polarized light.

A protective layer 338 is then formed on the polarizer film 336. As noted above, the protective layer 338 can be a touch-sensitive transparent layer and can form, together with the transparent conductive layer 330 (as the common electrode), a capacitive touch screen position sensor.

A conductive grid array package 318, e.g., ball grid array (BGA) package, can be formed on a bottom side of the substrate 302 through connection grids 316. The BGA package 318 is conductively coupled to the CMOS backplane 310. The BGA package 318 can include a number of BGA solider balls. A larger number of BGA solider balls with corresponding grid lines enables a higher connection resolution for the CMOS backplane 310. The BGA package 318 can function as conductive interconnects to connect the CMOS backplane 310 (thus the integrated display system 300) to other displays or to a control unit of a larger display.

In some implementations, each of the intermediate conductive layers 304 forms a highly-reflective mirror for a corresponding LED 320 bonded with the intermediate conductive layer 304. The mirror can have a reflectivity higher than 80%. The intermediate conductive layer 304 can have a same area size as the corresponding LED 320. The contact electrode p-GaN 324 can include a metal film with a high reflectivity and can be configured to enhance a brightness of light emitted from the LED 320. Each of the active-matrix light-emitting pixels 334 is operable to output a light flux in one direction that is larger than 80% of light flux in two directions output from each of the at least one LED 320 in the pixel 334.

Referring now to FIGS. 4A-1 to 4I, steps of fabricating a display system, e.g., the display system 300 of FIGS. 3A-3B, are illustrated.

FIGS. 4A-1 and 4A-2 show an LED device 400 (e.g., an LED wafer) having a multi-layered LED structure 410 formed on a substrate 402 (e.g., a wafer). The substrate 402 can be pre-treated, e.g., by cleaning a top surface of the substrate 402. Then the multi-layered LED structure 410 is formed by depositing multiple layers on the top surface of the substrate 402. The multiple layers can include a buffer layer, a first contact electrode, light-emitting layers, and a second contact electrode that are sequentially formed on the substrate 402. The multiple layers can be deposited by Metal-Organic Chemical Vapor Deposition (MOCVD), molecular beam epitaxy (MBE), atomic layer deposition (ALD), physical vapor deposition (PVD), Chemical Vapor Deposition (CVD), or any other suitable deposition methods in a vacuum chamber with a certain temperature. The light-emitting layers can include one or more quantum well layers of group III-V compounds for emitting light with a specified wavelength. For illustration only, FIGS. 4A-3 and 4A-4 show III-V blue light LED structures formed on different substrates.

Figures 3, 4, 4A:
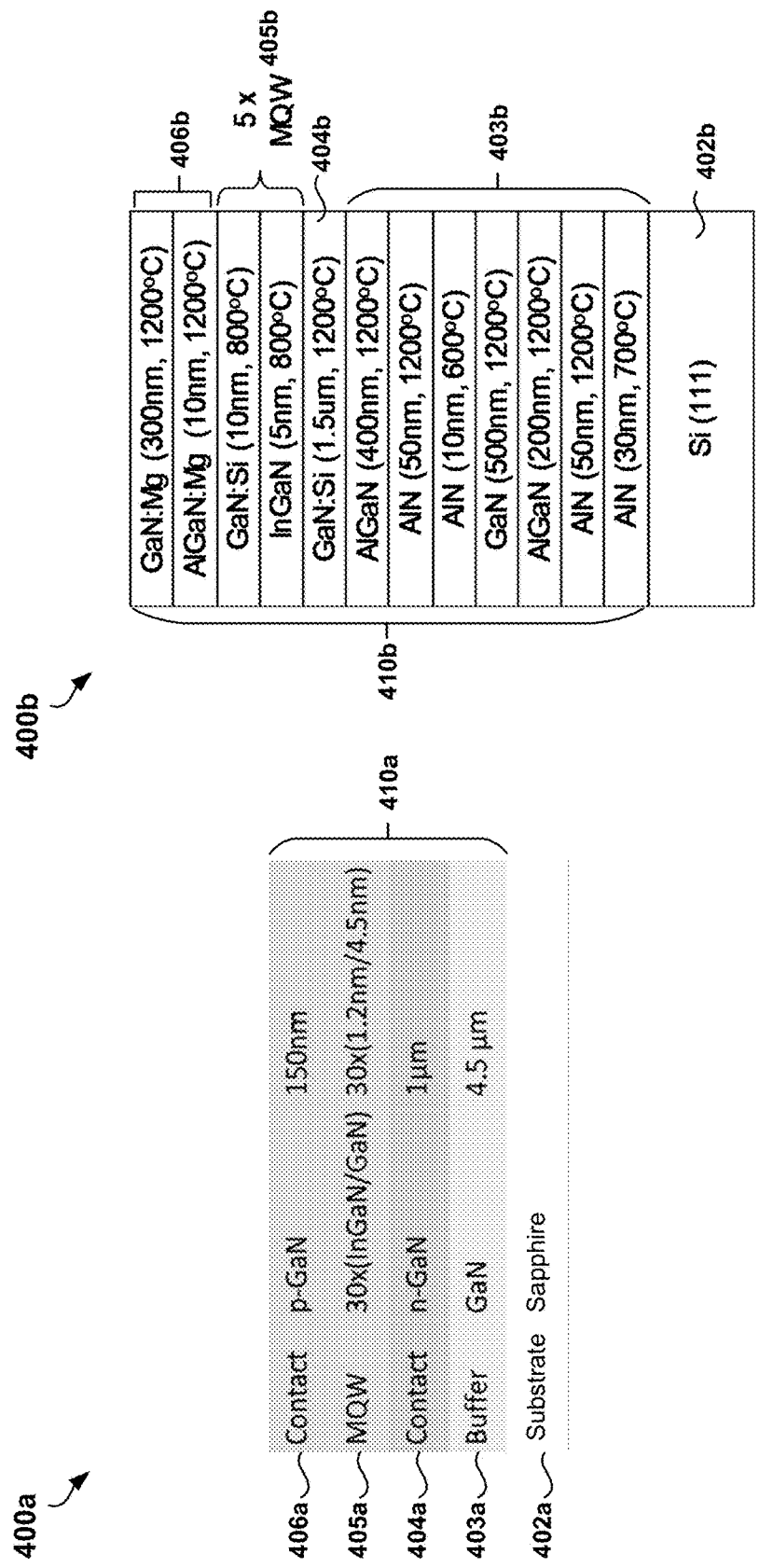

FIG. 4A-3 shows an example LED wafer 400a based on a sapphire substrate 402a. III-V blue light LED structure 410a is formed on the sapphire substrate 402a. The III-V blue light LED structure 410a can be formed by sequentially growing epitaxial layers including a buffer layer 403a, e.g., 4.5 μm-GaN layer, a n-type contact electrode 404a, e.g., 1 μm n doped GaN layer, MQW 405a, e.g., 30 pairs of 1.2 nm-InGaN/4.5 nm-GaN layers, and a p-type contact electrode, e.g., 150-nm p doped GaN layer on the sapphire substrate 402a.

FIG. 4A-4 shows an example LED wafer 400b based on a silicon substrate 402b. The silicon substrate 402b can be a silicon (111) substrate, where a surface of the silicon (111) substrate can be parallel to a (111) crystalline plane. III-V blue light LED structure 410b is formed on the silicon (111) substrate 402b by using alternating pairs of InGaN layer and GaN:Si layer as the quantum well (MQW) layers 405b. The LED structure 400b can include one or more buffer layers 403b deposited on the silicon (111) substrate, one or more lower Group III-V compound layers 404b as a first contact electrode on the buffer layers 403b, one or more MQW layers 405b on the lower Group III-V compound layers 404b, and one or more upper Group III-V compound layers 406b as a second contact electrode.

In a particular example, the blue light LED structure 410b is formed by sequentially epitaxially growing with MOCVD (or MBE or ALD): 30 nm-AlN layer under 700° C., 50 nm-AlN layer under 1200° C., 200 nm-AlGaN layer under 1200° C., 500 nm-GaN layer under 1200° C., 10 nm-AlN layer under 600° C., 50 nm-AlN layer under 1200° C., 400 nm-AlGaN layer under 1200° C., 1.5 μm-GaN:Si layer under 1200° C., 5 pairs of 5-nm InGaN layer and 10 nm-GaN:Si layer under 800° C., 10 nm-AlGaN:Mg layer under 1200° C., and 300 nm-GaN:Mg layer under 1200° C.

In some implementations, the LED structure 410 can be a UV or deep UV LED structure. The UV or deep UV LED structure can include n-GaN/(AlGaN/GaN) MQWs/p-GaN structure, which can be grown on a sapphire substrate.

Figures 1, 4B:
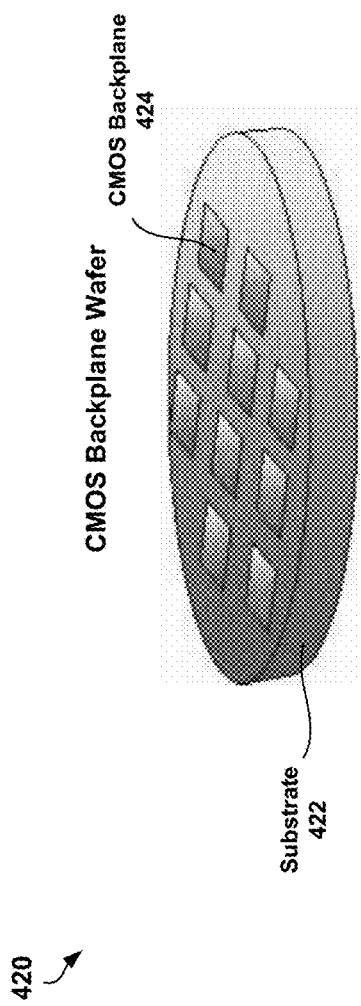
Figures 2, 4B:
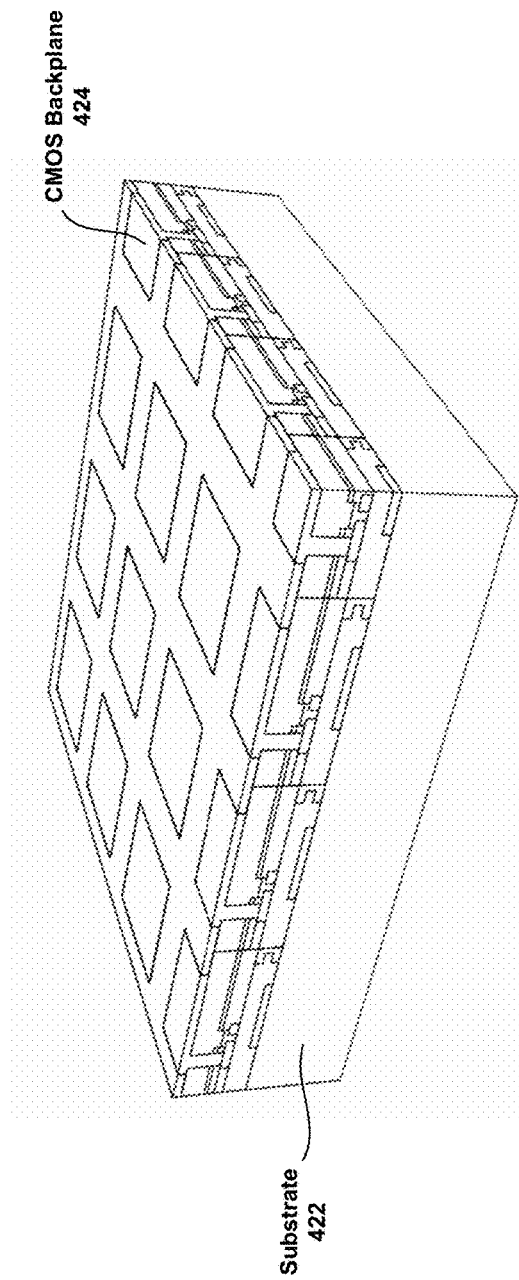
Figures 3, 4B:
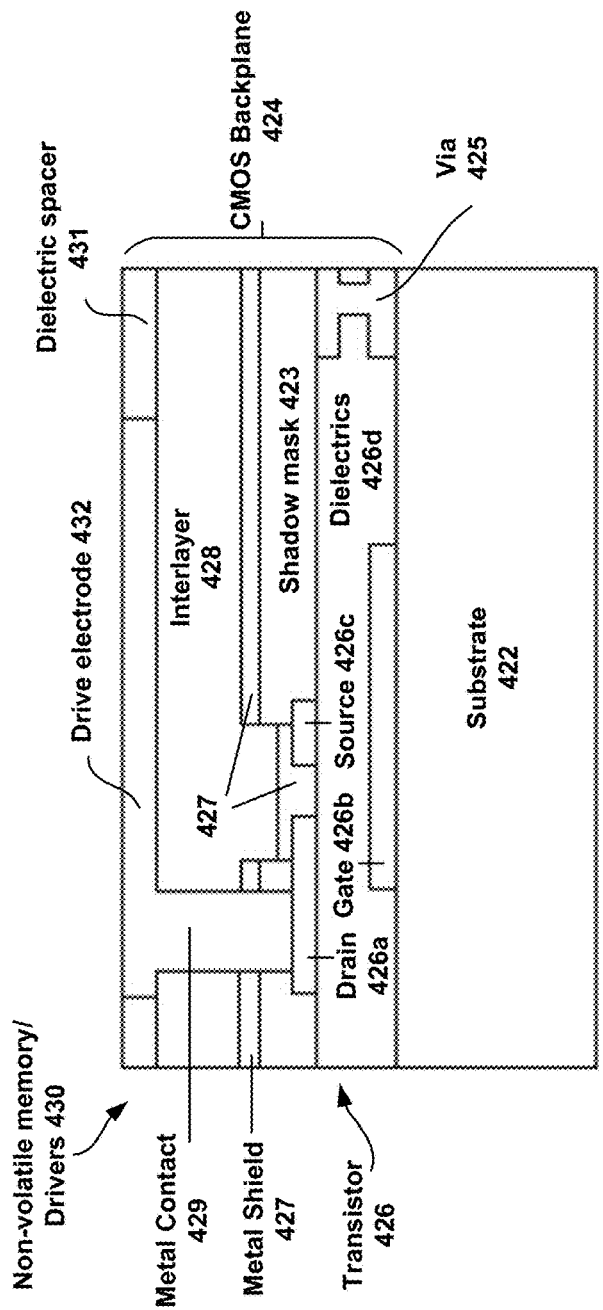
Figures 1, 4C:
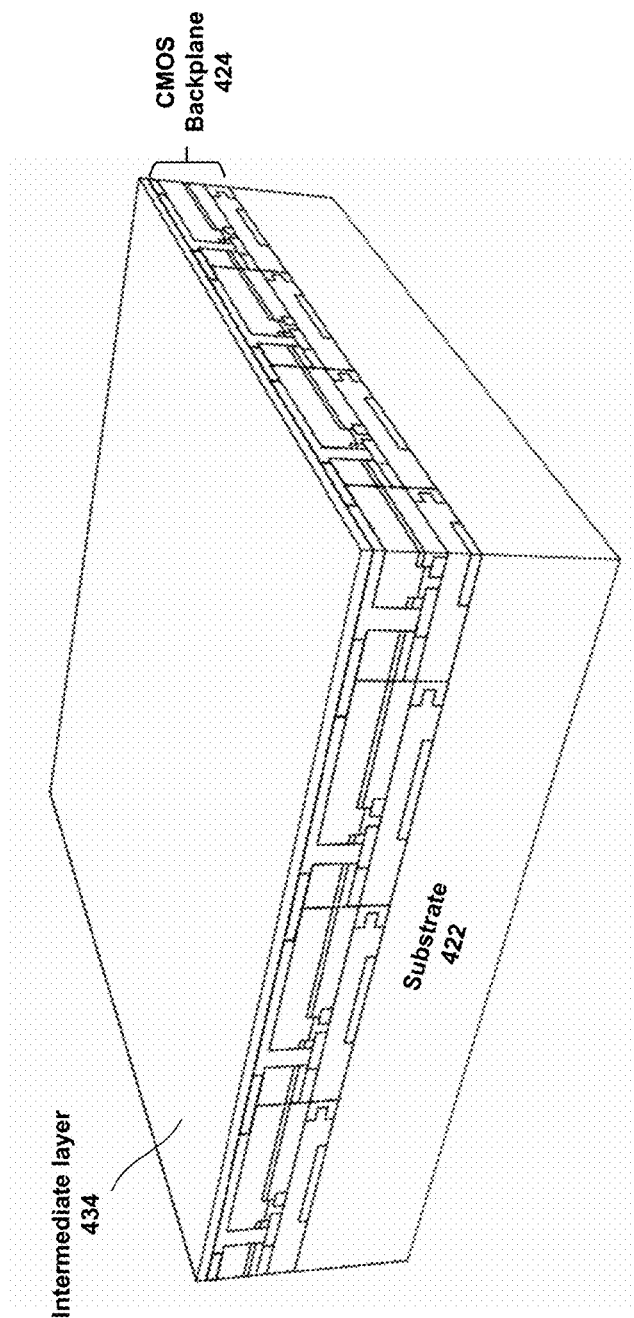
Figures 2, 4C:
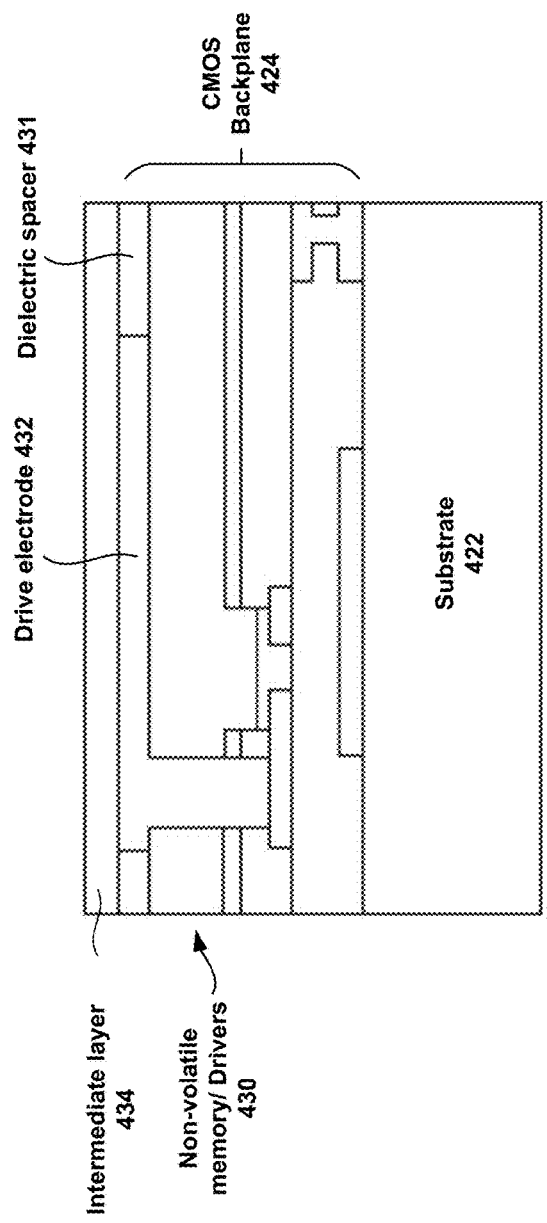

FIGS. 4B-1 and 4B-2 show schematic diagrams of an example CMOS backplane device 420 (e.g., a CMOS backplane wafer). The CMOS backplane device 420 can be fabricated on a semiconductor substrate 422, e.g., a silicon wafer, using standard CMOS manufacturing processes, e.g., by OEM. The CMOS backplane device 420 can include one or more CMOS backplanes 424 on a top side of the substrate 422. The CMOS backplanes 424 can be arranged in an array on the substrate 422.

FIG. 4B-3 is a cross-sectional view of the CMOS backplane device 420. Each CMOS backplane 424 can include a number of non-volatile memories and drivers 430. The drivers include scanning drivers, e.g., the scanning drivers 116 of FIG. 1, and data drivers, e.g., the data drivers 114 of FIG. 1. Each non-volatile memory is coupled to one of the scanning drivers through at least one word line, e.g., the word line 117 of FIG. 1, and to one of the data drivers through at least one bit line, e.g., the bit line 115 of FIG. 1.

Each non-volatile memory includes at least one transistor 426. The transistor 426 has drain 426a, gate 426b, and source 426c, which are separated by dielectrics 426d. The transistor 426 is coupled to a respective drive electrode 432 on top of the backplane 424 through metal contact 429. Adjacent drive electrodes 432 are isolated from each other by dielectric spacers 431. Via 425 can be formed between adjacent transistors 426. A shadow mask 423 is formed on top of the transistor 426. Then a metal shield 427 is formed on the shadow mask 423. An interlayer 428 including dielectric material is formed between the metal shield 427 and the drive electrodes 432 for isolation.

Figures 3, 4D:
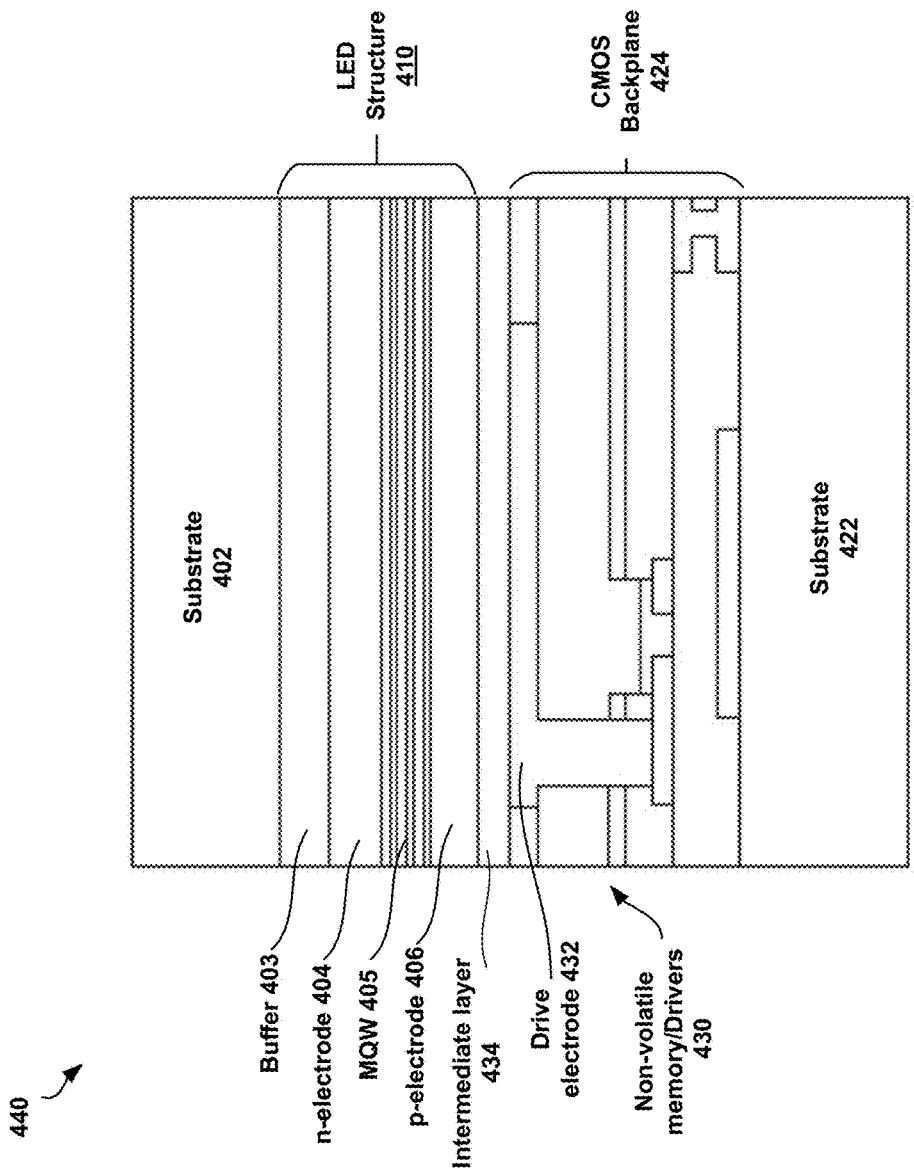

To integrate the LED wafer 400 and the CMOS backplane wafer 420 together, low-temperature bonding, e.g., eutectic bonding, can be used. An intermediate layer 434, e.g., a metal layer, can be disposed between two wafers for bonding. A top surface of the LED wafer 400, e.g., a surface of p-electrode layer 406 as illustrated in FIG. 4D-3, can be a bonding surface of the LED wafer 400; a top surface of the CMOS backplane wafer 420, e.g., surfaces of the drive electrodes 432, can be a bonding surface of the CMOS backplane wafer 420.

To achieve good bonding, both bonding surfaces can be pre-treated to remove any contamination and/or oxide film that can hamper diffusion of intermediate metals diffusing into the bonding surfaces, e.g., p+ region of the p-electrode 406. The bonding surfaces can be pre-treated to be smooth and uniform. For example, a root mean square (rms) roughness of the p-electrode 406 of the LED wafer 400 can be estimated to be around 1.5 nm, e.g., from an atomic force microscopy (AFM) scan.

In some implementations, the pre-treatment includes: I) treating the bonding surfaces by a 10 min piranha ($H_2O_2$: $H_2SO_4$=1:3 by volume) solution pre-clean followed by deionized water rinse and spin-dry prior to metallization; II) treating the bonding surfaces with an ultraviolet (UV)-ozone pre-clean to remove the organic surface contamination; and III) before bonding, applying a low energy plasma activation of the bonding surface, e.g., the p+ surface, of the LED wafer 400, to enhance diffusion of the intermediate metals.

The intermediate layer 434 can be first deposited onto the bonding surface of the CMOS backplane wafer 420. FIGS.

4C-1 and 4C-2 show schematic diagrams of an intermediate metal layer 434 formed on the CMOS backplane wafer 420. The intermediate layer 434 can be a continuous film across the CMOS backplane wafer 420. As discussed with details below, the intermediate layer 434 can include one or more intermediate metallic layers. The metallic layers can include one of: an iridium-tin-oxide (ITO) film with a titanium (Ti) film, a cupper (Cu) film with a Tantalum (Ta) film, an aluminum (Al) film with a Tin (Sn) film, and a gold (Au) or silver (Ag) film with at least one adhesive film including chromium (Cr), Platinum (Pt), Palladium (Pd), or Titanium (Ti).

FIGS. 4D-1 and 4D-2 show schematic diagrams of bonding the LED wafer 400 and the CMOS backplane wafer 420 via the intermediate layer 434 to obtain a bonded device 440. Before bonding, the LED wafer 400 and the CMOS backplane wafer 420 are aligned with each other in a vacuum chamber. As the LED structure 410 includes continuous layers across the LED wafer 400, the LED wafer 400 and the CMOS backplane wafer 420 can be aligned at a wafer-to-wafer level alignment accuracy, e.g., at a sub-millimeter precision wafer alignment. As illustrated in FIG. 4D-1, the LED wafer 400 is flipped over with the p-electrode 406 facing to the intermediate layer 434 and aligned with the CMOS backplane wafer 420. Then the aligned two wafers are clamped together on a bonding chuck, and a pressure is applied on both sides of the wafers when the wafers are in a full contact at a low temperature for a period of time. The bonded wafers can be optionally annealed to another low temperature for another period of time.

Examples of Low Temperature Bonding

Example 1. Bonding Using Cupper-Tantalm Intermediate Layers

The low temperature bonding, e.g., eutectic bonding, of the LED wafer 400 onto the CMOS backplane wafer 420 can use a cupper (Cu) film and a thin Tantalum (Ta) film as the intermediate layers. The following is an example bonding process.

First, a 50-nm Ta thin-film is deposited onto the top surface of the CMOS backplane wafer 420, e.g., surfaces of the drive electrodes 432 and the dielectric spacers 431, and a 300-nm Cu thin-film is deposited on top of the Ta film in a vacuum chamber with pressures lower than $1\times10^{-6}$ Torr.

Second, both wafers are placed in a vacuum chamber with pressures near $1\times10^{-3}$ Torr or in an atmosphere pressure nitrogen (N2) environments.

Third, the two wafers are aligned face-to-face and clamped together on a bonding chuck.

Fourth, a pressure of 30 psi is applied on both sides of the bonded wafers when the wafers are in a full contact at 300° C. for 1 hour.

Fifth, the bonded wafers are annealed to a temperature near 400° C. for about 1 hour.

Example 2. Bonding Using Aluminum-Tin Intermediate Layers

The low temperature bonding, e.g., eutectic bonding, of the LED wafer 400 onto the CMOS backplane wafer 420 can use an Aluminum (Al) film and a thin Tin (Sn) film as the intermediate layers. The following is an example bonding process.

First, a 50-nm Sn thin-film is deposited onto the top surface of the CMOS backplane wafer 420, e.g., surfaces of the drive electrodes 432 and the dielectric spacers 431, and a 300-nm Al thin-film is deposited on top of the Sn film in a vacuum chamber with pressures lower than $1\times10^{-6}$ Torr.

Second, both wafers are placed in a vacuum chamber with pressures near $1\times10^{-3}$ Torr or in an atmosphere pressure nitrogen (N2) environments.

Third, the two wafers are aligned face-to-face and clamped together on a bonding chuck.

Fourth, a pressure of 21.6 psi is applied on both sides of the bonded wafers when the wafers are in a full contact at 300° C. for 1 hour.

Fifth, the bonded wafers are annealed to a temperature near 400° C. for about 1 hour.

Example 3. Bonding Using Gold or Silver Intermediate Layers

The low temperature bonding, e.g., eutectic bonding, can be also performed by evaporating and plating gold (Au) or silver (Ag) on to one of the wafers and then exposing the gold or silver to UV light just before bonding to remove organic contaminants that preclude gold surfaces contact with the other wafer into which it is bonded. The following is an example process.

First, approximately 1-µm thick Au film with a suitable adhesion layer of (Cr, Pt, Pd) is deposited on each of the LED wafer 400 and the CMOS backplane wafer 420 to be bonded.

Second, a 300 Angstroms of Ti adhesive layer, an optional diffusion barrier layer, and 1400 Angstroms of Au (Au—Pt—Ti) or (Au—Ti) are subsequently electron-beam (E-beam) evaporated onto the surface of the CMOS backplane wafer 420.

Third, the two wafers are aligned face-to-face and clamped together on a bonding chuck.

Fourth, a pressure of 30 psi is applied on the bonded area for 5-10 minutes at a temperature of 200° C. to 350° C.

Fifth, optionally, the bonded wafers can be annealed to a temperature below 400° C. for about 1 hour. Note that annealing temperature beyond 400° C. may result a damage to integrated circuitry in the CMOS backplane wafer 420.

Referring now to FIG. 4D-3, a cross-sectional diagram of the bonded device 440 including the LED wafer 400 and the CMOS backplane wafer 420 is shown. The LED structure 410 includes continuous layers having a buffer layer 403, an n-electrode layer 404, MQW layer 405, and p-electrode layer 406 sequentially formed on the substrate 402. The continuous p-electrode layer 406 is bonded with the drive electrodes 432 of the CMOS backplanes 424 through the continuous intermediate layer 434.

For further processing, the substrate 402 of the LED wafer 400 is first removed from the bonded device 440 to expose the LED structure 410, and then the LED structure 410 is polished, e.g., by a chemical-mechanical polishing (CMP) process, to remove the buffer layer 403 (e.g., GaN layer) until stopping at the n-electrode layer 404 (e.g., n-GaN layer). In some cases, the n-electrode layer 404 is further thinned by polishing to remove a portion of the n-electrode layer 404.

Removing the substrate 402 can be performed by a peeling-off process, a lifting-off process, a splitting process, a detaching process, or a laser scribing process. Techniques of ion implantation, laser annealing, thermal annealing, and mechanical clipping can be used individually or in combination to weaken interfaces of the separation. In one example, a laser scribing is used to scribe the substrate 402 to a depth of the interfaces of separation as a partial cut, and followed by a subsequent snapping (either manual or fully-automated). The scribing speed can be in a range of 300 to 700 mm/s.

In another example, a laser lifting-off process is used. The substrate 402 can be a sapphire substrate. The LED structure 410 can be a blue color LED structure or a UV or deep UV LED structure. Since sapphire is transparent and GaN (the material of the buffer layer 403) is opaque (which absorbs light), a GaN film can be lifted off from the sapphire substrate by a short pulse KrF UV excimer laser with a wavelength of 248 nm or 308 nm, e.g., in a power range of 0.4-0.8 J/cm$^2$. The short pulse laser is absorbed by the GaN film to generate a high temperature, e.g., more than 1000° C. Even a brief heating of an interface between the sapphire substrate and the GaN film to >1000° C. can result in decomposition of GaN into Ga, a low melting-point metal, and nitrogen which remains trapped at the interface.

In some implementations, the LED structure 410 is a red color LED structure. In some cases, the red color LED structure is formed on a GaP substrate, which can be delaminated by UV Excimer Laser (with a wavelength at 248 nm or 308 nm) lift-off. The epitaxial layer-selective delamination is achieved by photochemical decomposition of an intermediate opaque layer next to the transparent GaP substrate.

In some cases, the red color LED structure is formed on GaAs substrate. The GaAs substrate can be delaminated by Chemical Lift-Offs (CLO). Since GaAs is opaque, an intermediate sacrificial layer of AlAs or InAlP can be grown on the GaAs substrates before AlGaAs or InAlGaP multiple quantum wells. By selective etching AlAs intermediate sacrificial layers using HF, the GaAs substrate can be lifted off; and by selective etching InAlP intermediate sacrificial layers using HCl, the GaAs substrate can be lifted off. The GaAs substrate can be also delaminated by Nd:YAG Laser (with a wavelength of 1064 nm) lift-off. The epitaxial layer of InGaAsN can be used as an intermediate sacrificial layers for selective photodecomposition and substrates lift off. By tuning the composition of the InGaAsN layer such that its bandgap is lower than 1.165 eV (energy of a 1064 nm photon), the InGaAsN layer strongly absorbs 1064 nm laser light to which the GaAs substrate is effectively transparent. Upon absorption of the laser pulse, ablation occurs along the InGaAsN layer, separating the GaAs film from its GaAs growth substrate, producing a crack-free GaAs layer adhered to a flexible polymer substrate. In a particular example, a Q-switched Nd:YAG laser with a pulse duration (full width at half maximum—FWHM) of 8-9 ns, GaAs substrate wafer lift-off is achieved over a large range of average fluences from ~0.6 J/cm^2 to −3.5 J/cm^2.

Figure 4E:
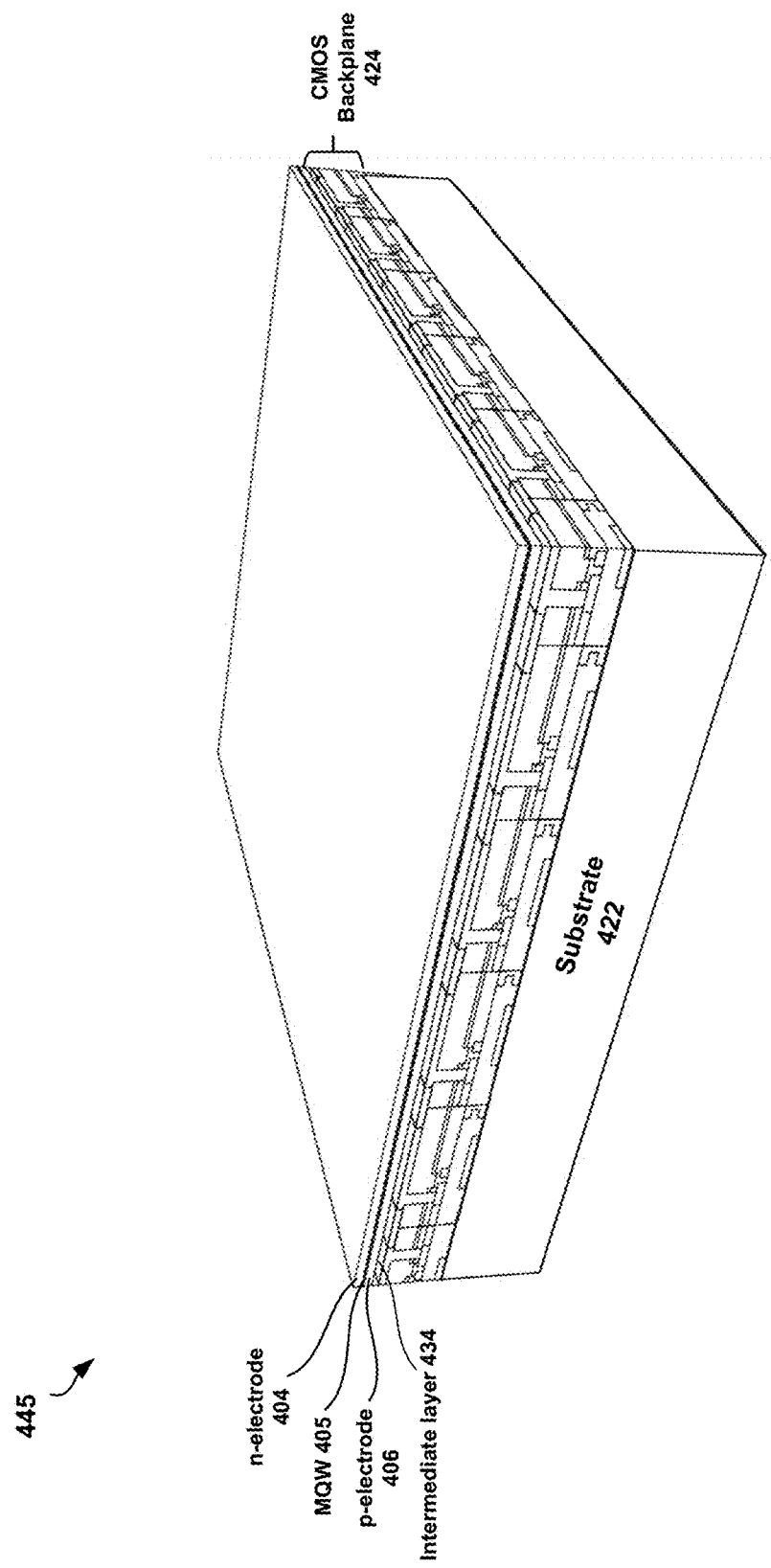
FIG. 4E is a perspective view of the bonded device after removing the substrate of the LED structure.
Figures 1, 4F:
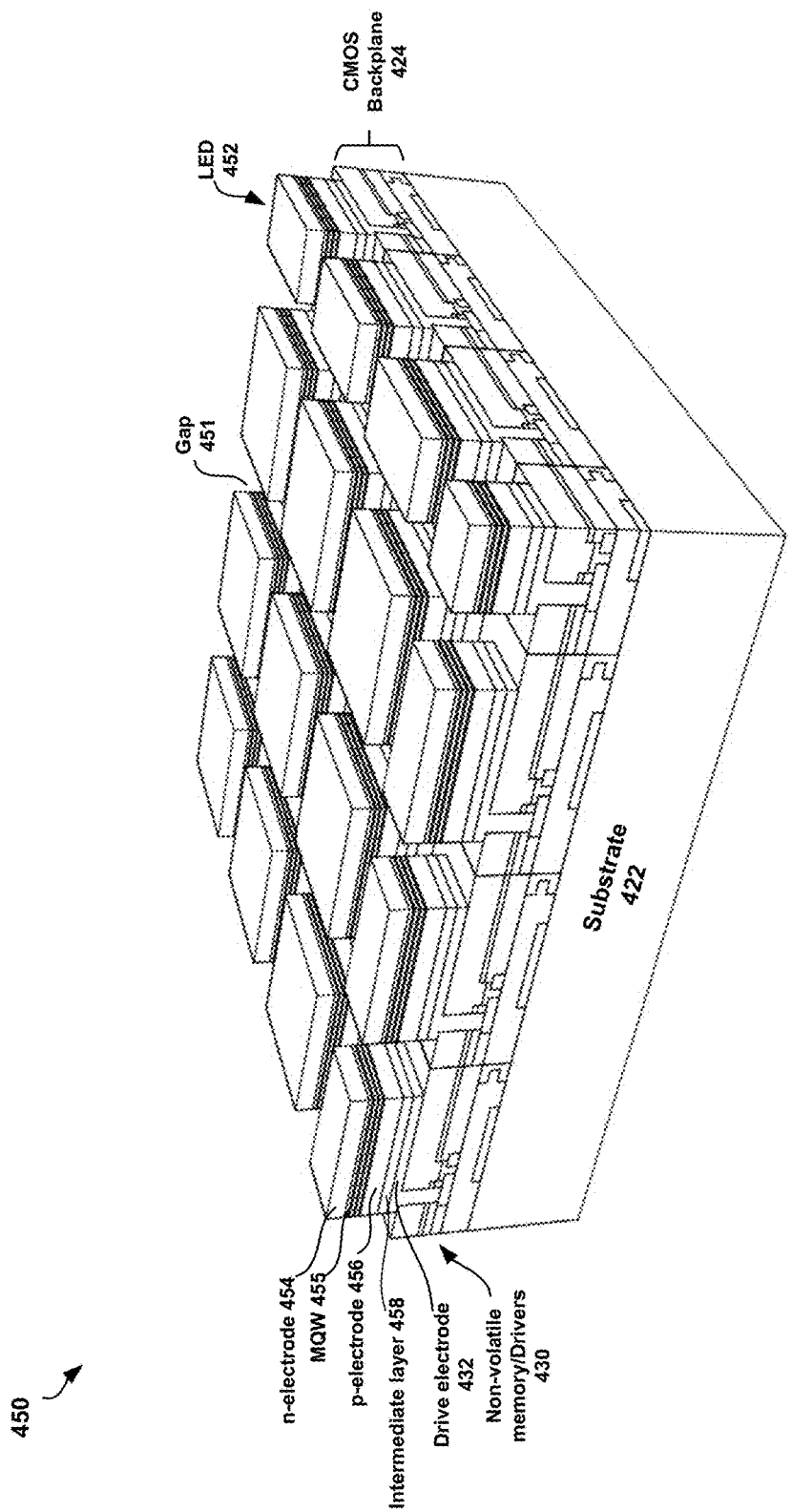
Figures 2, 4F:
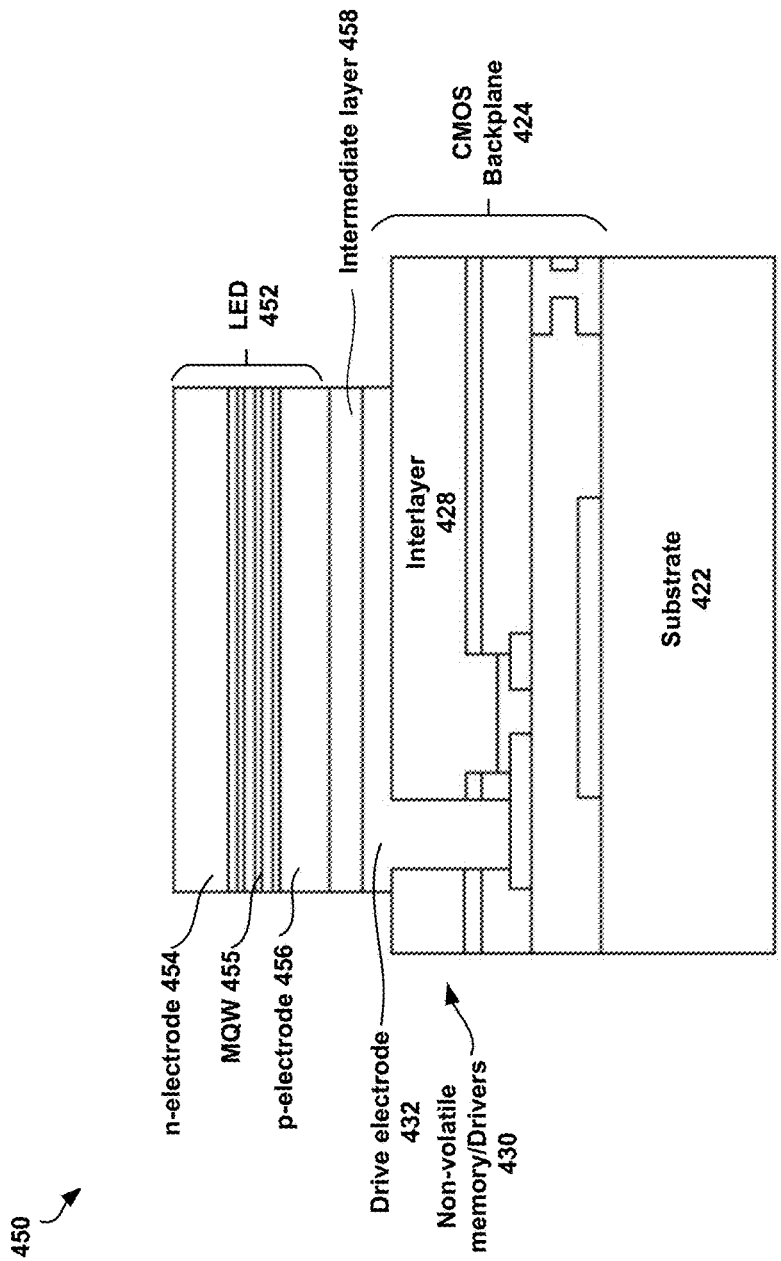

FIG. 4E is a perspective view of a bonded device 445 obtained by removing the substrate 402 of the LED wafer 400 from the bonded device 440. The LED structure 410 is exposed for patterning.

Before patterning, a protective mask is aligned with the drive electrodes 432 in the top layer of the CMOS backplanes 424, such that the dielectric spacers 431 between the drive electrodes 432 are selectively etched away after the patterning. The protective mask can be determined based on information fabricating the drive electrodes 432 in the CMOS backplanes 424. For example, the drive electrodes 432 are fabricated by forming a protective mask (e.g., photoresist or hard mask), depositing materials of the drive electrodes, and removing the protective mask layer. The protective mask for patterning the LED structure 410 can be determined based on the protective mask for fabricating the drive electrodes 432. In this way, the protective mask for patterning the LED structure 410 can be aligned with the drive electrodes 432 with high accuracy but low effort.

After the alignment, the patterning can be performed with the following steps: 1) patterning a hard mask layer, e.g., SiNx such as Si$_3$N$_4$, on top of the LED structure 410, e.g., on the n-electrode layer 404 (e.g., n-GaN) of the LED structure 410; 2) etching through the layers of the LED structure 410, the intermediate layer 434, and the dielectric spacers 431 to the interplayer 428 of the CMOS backplanes 424; 3) removing the remaining hard mask layer. Particularly, as the intermediate layer 434 can include metal, etching the intermediate layer 434 can be separately performed from etching the LED structure 410 and the dielectric spacers 431.

As illustrated in FIGS. 4F-1 and 4F-2, the LED structure 410 is patterned to form an array of LEDs 452. Adjacent LEDs 452 and adjacent intermediate layer 458 are separated from each other by gaps 451. Each LED 452 can have a size larger than a size of the respective drive electrode 432. The LED 452 and the intermediate layer 458 are aligned, e.g., self-aligned, with the respective drive electrode 432. The LED 452 and the respective intermediate layer 458 can have the same size and are self-signed with each other due to simultaneous patterning.

Each LED 452 includes n-electrode 454, MQW 455, and p-electrode 456. The LED 452 is conductively coupled to a respective non-volatile memory via the bonded p-electrode 456 and the drive electrode 432 by the intermediate layer 458, such that an active-matrix pixel is formed. Accordingly, an array of active-matrix LED pixels are formed after the patterning.

In some implementations, as noted above, differences between different light conversion efficiencies among different pixel elements in each display pixel can be compensated by controlling pixel area ratios among the different pixel elements in the display pixel. The LED structure 410 can be first patterned to form a plurality of first LEDs to be used as blue sub-pixels for emitting a blue color, then patterned to form a plurality of second LEDs to be used as green sub-pixels for emitting a green color, and then patterned to form a plurality of third LEDs to be used as red sub-pixels for emitting a red color. An area ratio between the first LED, the second LED, and the third LEDs can be based on a ratio between the different light conversion efficiencies of the sub-pixels. For example, the first LED can have an area smaller than the second LED that can have a smaller area than the third LED.

Figure 4G:
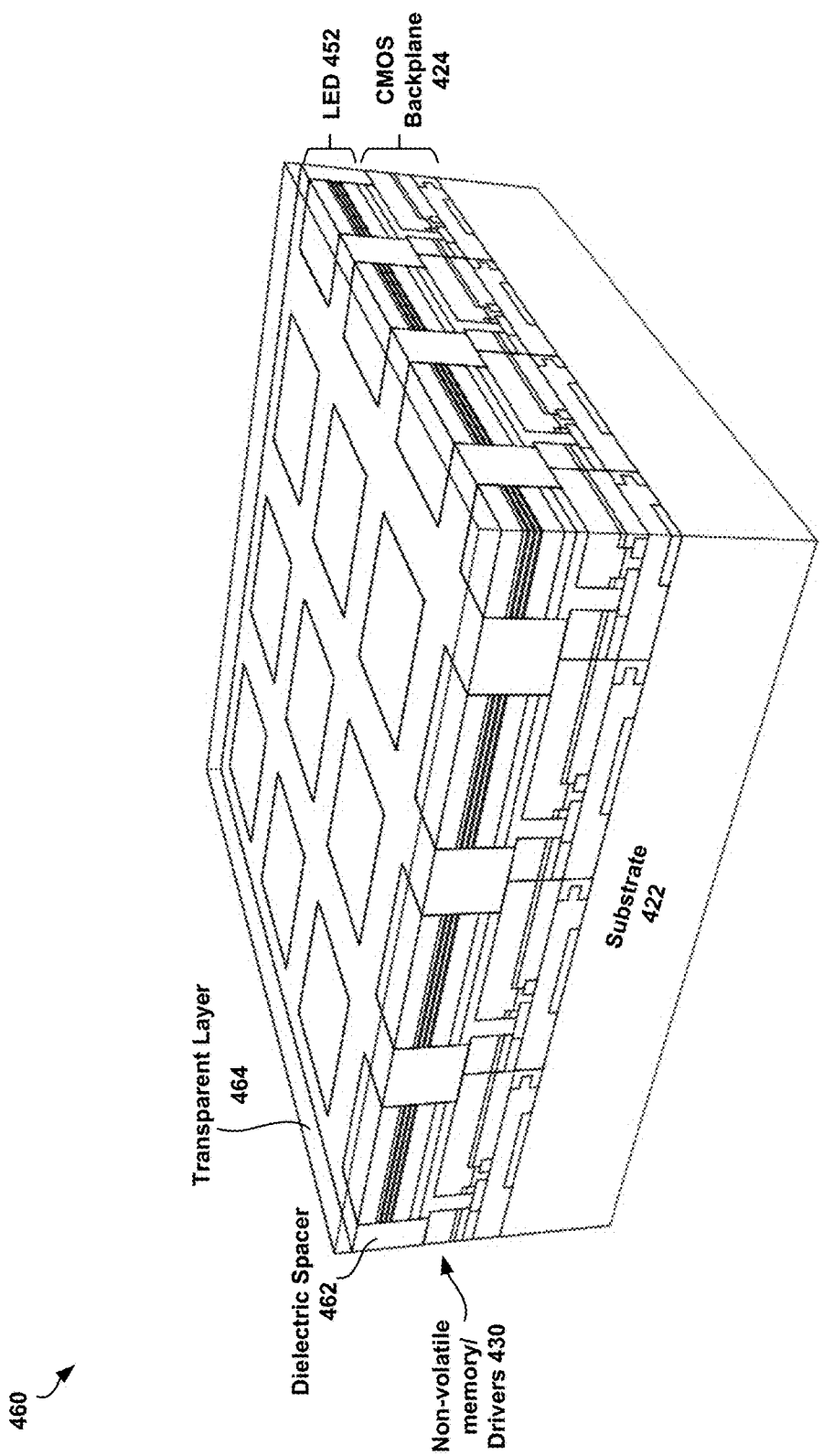
FIG. 4G is a perspective view of forming dielectric spacers and a transparent electrode on the patterned device of FIG. 4F-1.

Then, an opaque isolation material is filled into the gaps 451 between the LEDs 452. For example, an opaque dielectric material such as SiNx can be deposited in the gaps 451 by chemical vapor deposition (CVD). Topology planarization, e.g., polishing by chemical-mechanical polishing (CMP), is performed to form a flat surface across the array of LEDs 452. The deposited dielectric layer can be polished to expose doped surfaces of the LEDs 452, e.g., to the n-electrodes 454 of the LEDs 452. That is, the flat surface can include surfaces of the n-electrodes 454 of the LEDs 452. A transparent conductive layer 464, e.g., an ITO layer, is deposited on top of the flat surface including the surfaces of the n-electrodes 454 of the LEDs 452 to form a common electrode, e.g., an electrical common ground. As illustrated in FIG. 4G, in the formed device 460, dielectric spacers 462 are formed in the gaps 451, and the transparent conductive layer 464 are on the LEDs 452.

Figure 4H:
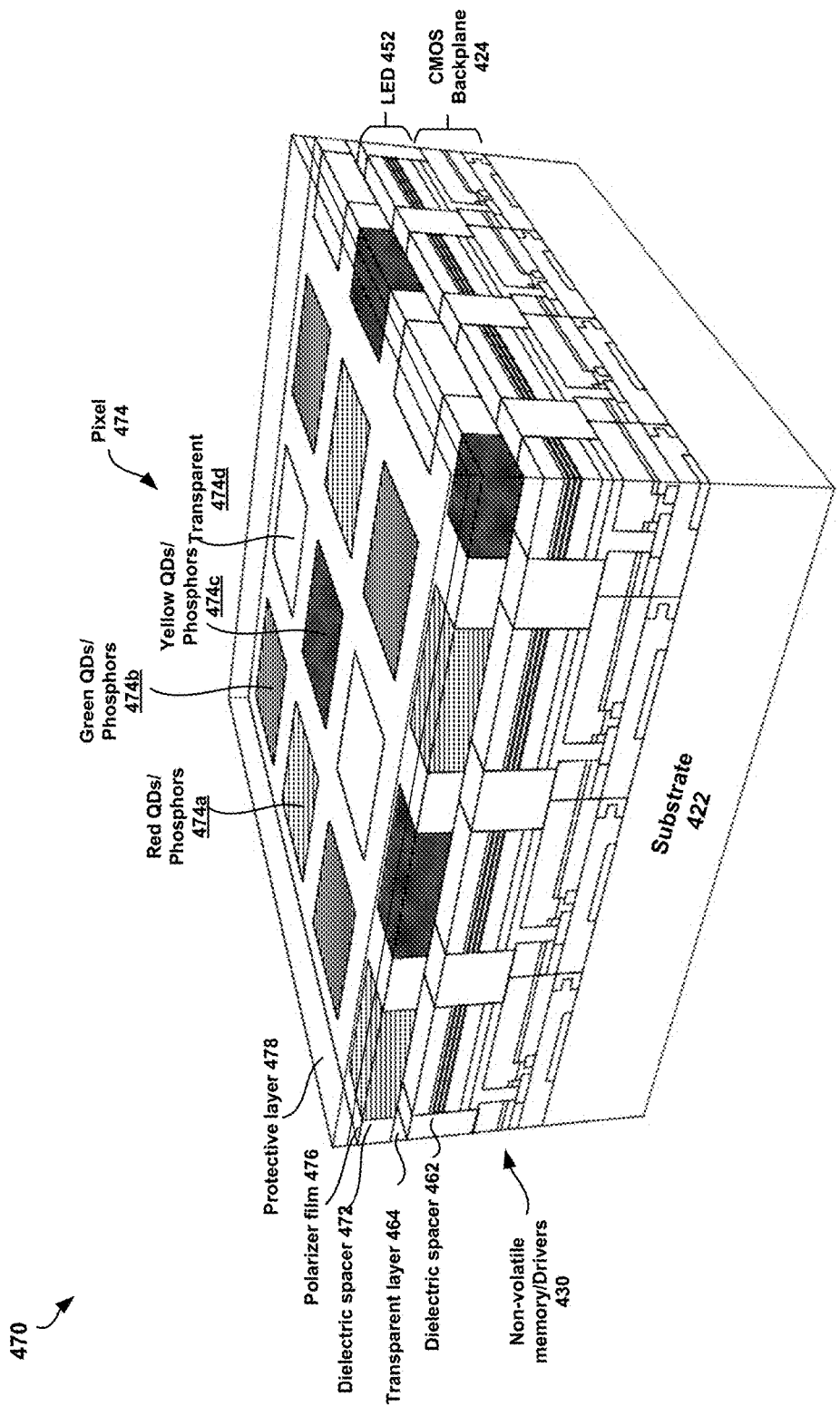
FIG. 4H is a perspective view of forming multi-color phosphor layers and a protective layer on the formed device of FIG. 4G.

As shown in FIG. 4H, secondary color LEDs, e.g., red color LEDs, green color LEDs, and white color LEDs, can be formed based on the previously-formed LEDs, e.g., blue color LEDs 452. The different color LEDs can form multi-color LED pixels 474. Each pixel 474 can include a blue color LED, a red color LED, a green color LED, and a white color LED. As discussed above in FIGS. 3A-3B, the secondary color LEDs can be formed on surface of the LEDs 452 by using different color phosphor materials or different size quantum-dot (QD) materials.

For example, potassium fluorosilicate (PFS)/$K_2SiF_6$ (KSF) phosphors can be used to make red color LEDs with an emission wavelength of about 630 nm. Aluminate, or silicate, or green garnet (GNYAG) phosphors can be used to make green color LEDs with an emission wavelength of about 530 nm. Cerium (III)-doped YAG phosphors can be used to make white color LEDs.

In some implementations, an array of the multi-color LED pixels 474 is formed by the following processes: 1) patterning using photoresist for specific color LEDs, e.g., red LEDs; 2) depositing, e.g., by ink-jet printing, specific color phosphor films or specific size QD thin-films for the specific color, e.g., red QDs/phosphors 474a (red phosphor films or red QD thin-films); 3) lifting off to remove the photoresist to form specific color phosphors/Quantum-dot arrays thus to form the specific color LED arrays, e.g., red LED arrays; 4) repeating the same processes above to form another specific color LED arrays, e.g., green LED arrays, but with another specific color phosphor films or another specific size QD thin-films, e.g., green QDs/phosphors 474b (green phosphor films or green QD thin-films); and 5) repeating the same processes above to form another specific color LED arrays, e.g., white LED arrays, but with another specific color phosphor films or another specific size QD thin-films, e.g., yellow QDs/phosphors 474c (yellow phosphor films or yellow QD thin-films). In some examples, blue color LEDs in the pixels 474 can be also formed by depositing corresponding blue color phosphor film or corresponding size QD thin film on the formed blue LEDs 452.

In some examples, as illustrated in FIG. 4H, transparent layers 474d are formed on the blue color LEDs 452 in the pixels 474. Isolation spacers, e.g., dielectric spacers 472, are formed between the deposited phosphors or QDs for different color LEDs. The dielectric spacers 472 can include an opaque dielectric material, e.g., SiNx. For example, after depositing the red QDs/Phosphors 474a, green QDs/Phosphors 474b, and yellow QDs/Phosphors 474c, and transparent layers 474d on the LEDs 452, the dielectric material is deposited on top of the device. Topology planarization, e.g., polishing by CMP, can be performed to form a flat surface across the array of pixels 474.

A polarizer film 476 can be deposited on the flat surface across the array of pixels 474 and the dielectric spacers 472. The polarizer film 476 is configured to allow light from the pixels 474 to propagate through along a polarization direction to become a polarized light, which can also reduce scattering and get more uniform light. A protective layer 478 can be then formed on the polarizer film 476. As noted above, the protective layer 478 can be a touch-sensitive transparent layer and can form, together with the transparent conductive layer 464 (as the common electrode), a capacitive touch screen position sensor. The protective layer 478 can be made of transparent material, e.g., glass or plastic, coated with a conductive material, e.g., indium tin oxide (ITO). FIG. 4H shows the formed integrated device 470 including the array of multi-color active-matrix LED pixels 474 formed on the CMOS backplanes 474 and covered with the polarizer film 476 and the protective layer 478.

A conductive grid array package 482, e.g., ball grid array (BGA) package, can be formed on a bottom side of the substrate 422 of the CMOS backplane device 420. The BGA package 482 is conductively coupled to the CMOS backplane 424 via connection grids 484. The BGA package 482 can include a number of BGA solider balls. The BGA package 482 can function as conductive interconnects to connect the CMOS backplane 420 to other displays for seamless integration to form a larger display or to a control unit of a larger display.

FIG. 4I shows an integrated active-matrix LED pixel array based device 480 formed by the above fabrication process. As described in FIGS. 3A and 3B, the CMOS backplanes 424 are formed on a top side of the substrate 422 and include a number of non-volatile memories/drivers 430 each conductively coupled to the respective drive electrodes 432 of the CMOS backplanes 424. An array of LEDs 452 is bonded to the CMOS backplanes 424 through the intermediate layers 458 to form an array of active-matrix LED pixels. Each LED pixel includes four LEDs 452 and four non-volatile memories conductively coupled to the four LEDs 452. Each LED includes epitaxial semiconductor layers having one or more quantum well layers MQW 405 between a first contact electrode (p-electrode 406) and a second contact electrode (n-electrode 404). The p-electrodes 406 of the LEDs 452 are respectively bonded and conductively coupled to the drive electrodes 432 via the intermediate layers 458. Each LED 452 is aligned with the respective bonded drive electrode 432 and can have a larger size than the respective drive electrode 432. The LED 452 can have the same size as the respective intermediate layer 458 and be self-aligned with the respective intermediate layer 458 due to simultaneous patterning. The dielectric spacers 462 are disposed between adjacent LEDs 452 and the respective bonded drive electrodes 432 for connection isolation. The dielectric spacers 462 can also be configured to block light propagation between adjacent LEDs 452, e.g., by using an opaque dielectric materials such as SiNx. The transparent conductive layer 464 is on a flat surface of the array of the LEDs 452 and in contact with the n-electrodes 404 of the LEDs 452 to form a common ground of the active-matrix LED pixels. Patterns of different color phosphor materials or quantum dots materials 474a, 474b, and 474c are formed above the array of LEDs 452 to form an array of multi-color display pixels 474. Each display pixel 474 including four sub-pixels operable to emit light with four different colors including blue, red, green, and white when excited by the corresponding four LEDs in the display pixel. The blue color can be directly generated by the blue LEDs 452 through the transparent layers 474d. The sub-pixels can be isolated by the dielectric spacers 472 that can include an opaque dielectric material such as SiNx. The transparent protective layer 478 is used to protect surfaces of the array of active-matrix multi-color display pixels 474, and the polarizer film 476 can be arranged between the pixels 474 and the transparent protective layer 478. The ball grid array (BGA) package 482 is formed on a bottom side of the substrate 422 and conductively coupled to the CMOS backplanes 424.

In some implementations, the integrated active-matrix LED pixel array based device 470 in FIG. 4H can be processed to become flexible, e.g., by thinning the substrate 422. Then the flexible device 470 can be arranged on a flexible substrate, e.g., a polyimide film or a stainless steel.

Example Systems and Fabricating Processes Using TFT Backplanes

Compared to a CMOS backplane formed on a semiconductor substrate (e.g., a semiconductor wafer such as a silicon wafer), a thin-film transistor (TFT) backplane (also called as a TFT array backplane or a TFT array control backplane) can be formed either on a rigid substrate (e.g., glass) or a flexible substrate (e.g., a polyimide film or a stainless steel). The TFT backplane can have a larger size than a CMOS backplane formed on the semiconductor substrate. In some implementations, TFT backplanes are formed on a larger substrate without BGA packaging that is used for connecting CMOS backplanes on different smaller substrates.

The TFT backplane can be based on a silicon substrate, e.g., amorphous silicon (a-Si) or polysilicon such as low temperature polysilicon (LTPS). For example, the TFT backplane can be a low temperature polysilicon (LTPS) active-matrix (AM) thin-film transistors (TFT) array control backplane. The LTPS substrate can be achieved by UV excimer laser annealing of a-Si to form LTPS. The TFT backplane can be fabricated by depositing polysilicon layers on a substrate and forming integrated circuits (e.g., non-volatile memories and/or drivers) on the polysilicon layers.

Similar to CMOS backplanes, LED structures having continuous multiple layers formed on wafers (e.g., silicon or sapphire wafers) can be bonded to one or more TFT backplanes formed on a substrate (e.g., a glass substrate or a polyimide film on a carrier glass). The wafers for the LED structures can be first removed, e.g., by laser lift-off. Then the LED structures can be patterned to form an array of LEDs to thereby form an array of active-matrix LED pixels with each of the LEDs conductively connected to a respective non-volatile memory in the TFT backplanes. Phosphor materials or quantum-dot materials can be deposited on the array of LED pixels to form an array of multi-color LED pixels. After the integrated LED pixel array is formed, the carrier glass can be removed, e.g., by laser lift-off, to form a flexible display.

FIGS. 5A-5B show an example integrated display system 500 fabricated by TFT array control backplane and LED bonding. The integrated display system 500 can be the display system 100 of FIG. 1. This integrated display system 500 can be formed according to steps described with further details in FIGS. 6A to 6I.

As illustrated in FIGS. 5A-5B, the integrated display system 500 includes a TFT array backplane 510 on a first side of a substrate 502. The substrate 502 can be a glass substrate or a flexible substrate (e.g., a polyimide film or a stainless steel) on a carrier glass. The TFT array backplane 510 can be formed in a TFT backplane device. The TFT backplane device can include one or more TFT backplanes and can be manufactured by existing TFT manufacturing technologies, e.g., by OEMs.

The TFT array backplane 510 can be a low temperature polysilicon (LTPS) thin-film transistors (TFT) array control backplane. The TFT array backplane 510 includes integrated circuits having non-volatile memories and/or display drivers 512 formed on polysilicon layers 511. In some implementations, the TFT array backplane 510 includes a number of pixel circuits. Each pixel circuit includes a non-volatile memory that has at least one transistor conductively coupled to a corresponding drive electrode 514 in a top layer of the TFT array backplane 510. The display drivers include scanning drivers and data drivers and each of the non-volatile memories is coupled to one of the scanning drivers through at least one word line and to one of the data drivers through at least one bit line.

The integrated display system 500 includes an array of light-emitting elements such as LEDs 520. The LEDs 520 are separated (or isolated) by opaque dielectric spacers 528, e.g., SiNx. Each LED 520 can include a first contact electrode p-electrode 524, e.g., p-GaN layer, a second contact electrode n-electrode 526, e.g., n-GaN layer, and multiple quantum well (MQW) semiconductor layers 522 between the p-electrode 524 and the n-electrode 526. The MQW layers 522 can include group III-V compounds and each of the LEDs 520 is operable to emit light with a primary color, e.g., blue, green, or red.

For illustration, in FIGS. 5A and 5B, the LEDs 520 are blue LEDs operable to emit light with a blue color. The MQW layers can include multiple pairs of In(0.3)Ga(0.7)N/GaN layers. In some other implementations, the LEDs can be a UV or deep UV LED. The MQW layers can include multiple pairs of AlGaN/GaN layers. In some other implementations, the LEDs can be green LEDs operable to emit light with a green color. The MQW layers can include multiple pairs of In(0.5)Ga(0.5)N/GaN layers. In some other implementations, the LEDs can be red LEDs operable to emit light with a red color. The MQW layers can include multiple pairs of InN/GaN layers.

Each LED 520 is coupled to a respective pixel circuit, e.g., a non-volatile memory, in the TFT array backplane 510 by conductively connecting the p-electrode 524 to a drive electrode 514 of the pixel circuit, e.g., through a respective intermediate conductive layer 504. In such a way, the array of LEDs 520 is coupled to respective pixel circuits in the TFT array backplane 510 to form an array of active-matrix LED pixels 534. As discussed with further details in FIGS. 6D-1 to 6D-4, the p-electrode 524 and the drive electrode 514 can be bonded together, e.g., by low temperature bonding, through the intermediate conductive layer 504, e.g., a metallic layer such as ITO/Ti, Cu/Ta, Al/Sn, or Au/Cr. Each LED 520 can be aligned with the respective bonded drive electrode 514 in the top layer of the backplane 510, e.g., by patterning as illustrated in FIG. 6F, and can have a size no smaller than (same as or larger than) the respective bonded drive electrode 514. Each LED 520 is self-aligned with its respective intermediate layer 504, e.g., by simultaneous patterning as illustrated in FIG. 6F. The LED 520 can have the same size as the respective intermediate layer 504.

A transparent conductive layer 530, e.g., an indium tin oxide (ITO) layer, is on top of the array of LEDs 520. The transparent conductive layer 530 is in contact with the n-electrodes 526 of the LEDs 520 to form a common electrode of the LEDs 520.

A phosphor material or a quantum dot material can be deposited on the transparent conductive layer 530 above at least one LED 520 and operable to emit a secondary light when excited by the light emitted from the LED 520. The secondary light can have a secondary color different from a primary color from the LED 320. As illustrated in FIGS. 5A-5B, red color quantum dot (QD) materials or phosphor materials 534a, green color QDs/phosphors 534b, and yellow color QDs/phosphors 534c can be deposited on the blue LEDs 520 and operable to emit light with red, green, and white colors, respectively.

As an example, each LED pixel 534 in FIGS. 5A-5B includes a blue LED sub-pixel with a transparent layer 534d on the blue LED 520, a red LED sub-pixel with the red QDs/phosphor 534a on the blue LED 520, a green LED sub-pixel with green QDs/phosphors 534b on the blue LED 320, and a white LED sub-pixel with yellow QDs/phosphors 534c on the blue LED 520. Each sub-pixel includes a non-volatile memory in the TFT array backplane 510 coupled to the blue LED 520 via the drive electrode 514, the intermediate layer 504, and the p-electrode 524. The red QDs/phosphors 534a, green QDs/phosphors 534b, yellow QDs/phosphors 534c, and transparent layers 534d are isolated from each other by opaque dielectric spacers 532, e.g., SiOx. In some examples, the transparent layers 534d can be formed by the same material as the dielectric spacers 532. The four LED sub-pixels can be arranged in a rectangular shape or a square shape. Each LED sub-pixel can have a size of about 30 μm or less. Each LED pixel can have a size of about 100 μm or less. In some implementations, a ratio between an area of light emission from the pixels and a physical area of the pixels is higher than 50%. In some other implementations, each LED pixel can also include three LED sub-pixels including a blue LED sub-pixel, a red LED sub-pixel, and a green LED sub-pixel.

As described above, in the system 500, a number of the LEDs 520 is larger than a number of the LEDs covered with the phosphor materials or quantum dots materials, and the number of the LEDs 520 is equal to at least two times of a number of the LED pixels 534. For example, each LED is operable as a light-emitting diode (LED) to emit light with a blue color, e.g., with a wavelength between 450 nm and 500 nm, and, for each of the active-matrix light emitting pixels, at least two blue color LEDs are configured to optically excite at least two other colors, e.g., green and red, by secondary light emission of the phosphor materials or quantum dots materials on the at least two blue color LEDs. Thus, each of the active-matrix light emitting pixels is configured to be a multi-color display pixel including one blue color LED operable to provide a blue color and the at least two blue color LEDs with the phosphor materials or quantum dots materials operable to respectively provide a red color and a green color.

In some other implementations, each of the LEDs is operable as a UV or deep UV LED operable to emit light with a wavelength between 100 nm and 450 nm, and, for each of the active-matrix light emitting pixels, at least three UV or deep UV LEDs are configured to optically excite at least three colors, e.g., red, green, and blue, by secondary light emission of the phosphor materials or quantum dots materials on the at least three UV or deep UV LEDs. The pixel can also include a UV or deep UV LED deposited with yellow color phosphor materials or quantum dots materials to emit a white color.

As discussed above, differences between different light conversion efficiencies among different pixel elements in each display pixel can be compensated by controlling pixel area ratios among the different pixel elements in the display pixel, or controlling different drive currents for the different pixel elements in the display pixel, or both. For example, the pixel areas ratios among the different pixel elements can be designed for a larger compensation, and the drive currents for the different pixel elements can be designed for a smaller compensation, e.g., for fine tuning.

A polarizer film 536 can be deposited on surfaces of the pixels 534 and the opaque dielectric spacers 532. The polarizer film 536 is configured to allow light from the pixels 534 to propagate through along a polarization direction to become a polarized light.

A protective layer 538 can be formed on the polarizer film 536. As noted above, the protective layer can be a touch-sensitive transparent layer and can form, together with the transparent layer 530 (as the common electrode), a capacitive touch screen position sensor.

Note that, compared to the integrated system 300 including the BGA package 318 formed on a bottom side of the substrate 302, the integrated system 500 can have a large substrate 502 to accommodate a number of TFT backplanes which can be conductively interconnected, e.g., through connection lines.

In some implementations, each of the intermediate conductive layers 504 forms a highly-reflective mirror for a corresponding LED 520 bonded with the intermediate conductive layer 504. The mirror can have a reflectivity higher than 80%. The intermediate conductive layer 504 can have a same area size as the corresponding LED 520. The contact electrode p-GaN 524 can include a metal film with a high reflectivity and can be configured to enhance a brightness of light emitted from the LED 520. Each of the active-matrix light-emitting pixels 534 is operable to output a light flux in one direction that is larger than 80% of light flux in two directions output from each of the at least one LED 520 in the pixel 534.

Referring now to FIGS. 6A to 6I, steps of fabricating an integrated display system, e.g., the display system 500 of FIGS. 5A-5B, are illustrated.

FIG. 6A shows an LED device 600 (e.g., an LED wafer) having a multi-layered LED structure 610 formed on a substrate 602 (e.g., a wafer). The substrate 402 can be pre-treated, e.g., by cleaning a top surface of the substrate 602. Then the multi-layered LED structure 610 is formed by depositing multiple layers on the top surface of the substrate 602. The multiple layers can include a buffer layer, a first contact electrode, light-emitting layers, and a second contact electrode that are sequentially formed on the substrate 602. The multiple layers can be deposited by Metal-Organic Chemical Vapor Deposition (MOCVD), molecular beam epitaxy (MBE), atomic layer deposition (ALD), physical vapor deposition (PVD), Chemical Vapor Deposition (CVD), or any other suitable deposition methods in a vacuum chamber with a certain temperature. The light-emitting layers can include one or more quantum well layers of group III-V compounds for emitting light with a specified wavelength.

In some examples, the substrate 602 is a sapphire substrate. The LED structure 610 can be III-V blue light LED structure, e.g., the LED structure 410a in FIG. 4A-3. In some examples, the substrate 602 is a silicon substrate. The LED structure 610 can be III-V blue light LED structure, e.g., the LED structure 410b in FIG. 4A-4.

In some implementations, the LED structure 610 can be a UV or deep UV LED structure. The UV or deep UV LED structure can include GaN/(AlGaN/GaN) MQWs/p-GaN structure, which can be grown on a sapphire substrate.

Figures 1, 6B:
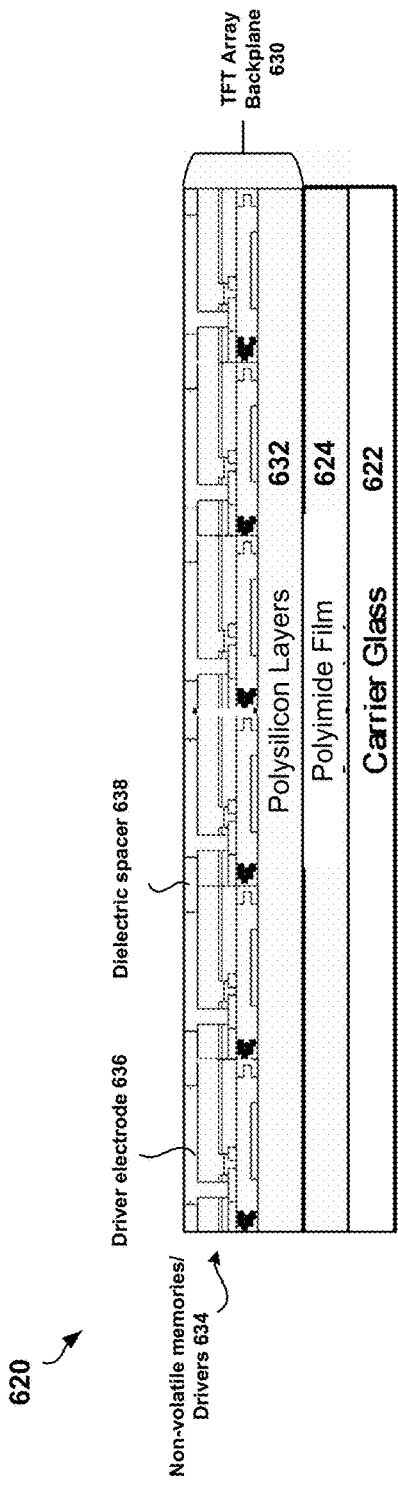
Figures 2, 6B:
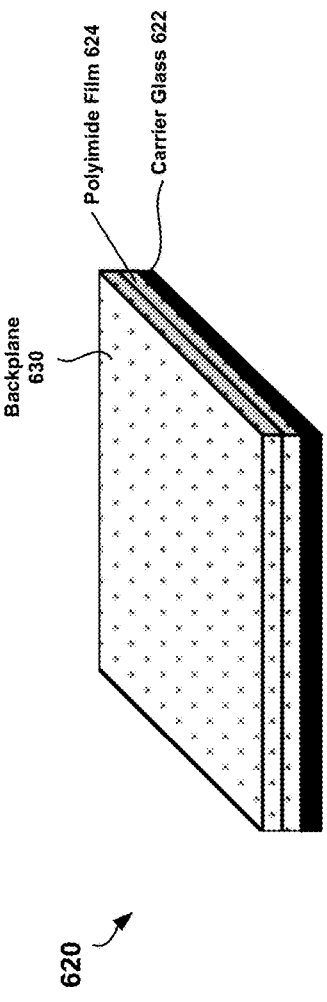

FIGS. 6B-1 and 6B-2 show schematic diagrams of an example TFT array backplane device 620. The TFT array backplane device 620 can be fabricated on a polyimide film 624 on a carrier glass 622, using standard TFT manufacturing processes, e.g., by OEMs. The TFT backplane device 620 can include one or more TFT backplanes 630 on a top side of the polyimide film 624.

Each TFT array backplane 630 can include polysilicon layer 632 and integrated circuits (including a number of non-volatile memories and drivers 634) formed on the polysilicon layers 632. The drivers include scanning drivers, e.g., the scanning drivers 116 of FIG. 1, and data drivers, e.g., the data drivers 114 of FIG. 1. Each non-volatile memory is coupled to one of the scanning drivers through at least one word line, e.g., the word line 117 of FIG. 1, and to one of the data drivers through at least one bit line, e.g., the bit line 115 of FIG. 1.

Each non-volatile memory includes at least one transistor coupled to a respective drive electrode 636 on top of the TFT array backplane 630 The transistor can have a structure similar to that of the transistor 426 of FIG. 4B-3. Adjacent drive electrodes 636 are isolated from each other by dielectric spacers 638.

To integrate the LED device 600 and the TFT array backplane device 620 together, low-temperature bonding can be used. An intermediate layer 642, e.g., a metal layer, can be disposed between the two devices for bonding, as illustrated in FIG. 6D-3. A top surface of the LED device 600, e.g., a surface of p-electrode layer 616 as illustrated in FIG. 6D-3, can be a bonding surface of the LED device 600; a top surface pf the TFT array backplane device 620, e.g., a surface of the drive electrodes 636, can be a bonding surface of the TFT array backplane device 620.

To achieve good bonding, both bonding surfaces can be pre-treated to remove any contamination and/or oxide film that can hamper diffusion of intermediate metals diffusing into the bonding surfaces, e.g., p+ region of the p-electrode layer 616. The bonding surfaces can be pre-treated to be smooth and uniform. For example, a root mean square (rms) roughness of the p-electrode layer 606 of the LED device 600 can be estimated to be around 1.5 nm, e.g., from an atomic force microscopy (AFM) scan.

In some implementations, the pre-treatment includes: I) treating the bonding surfaces by a 10 min piranha (H2O2: H2SO4=1:3 by volume) solution pre-clean followed by deionized water rinse and spin-dry prior to metallization; II) treating the bonding surfaces with an ultraviolet (UV)-ozone pre-clean to remove the organic surface contamination; and III) before bonding, applying a low energy plasma activation of the bonding surface, e.g., the p+ surface, of the LED device 600, to enhance diffusion of the intermediate metals.

Figure 6C:
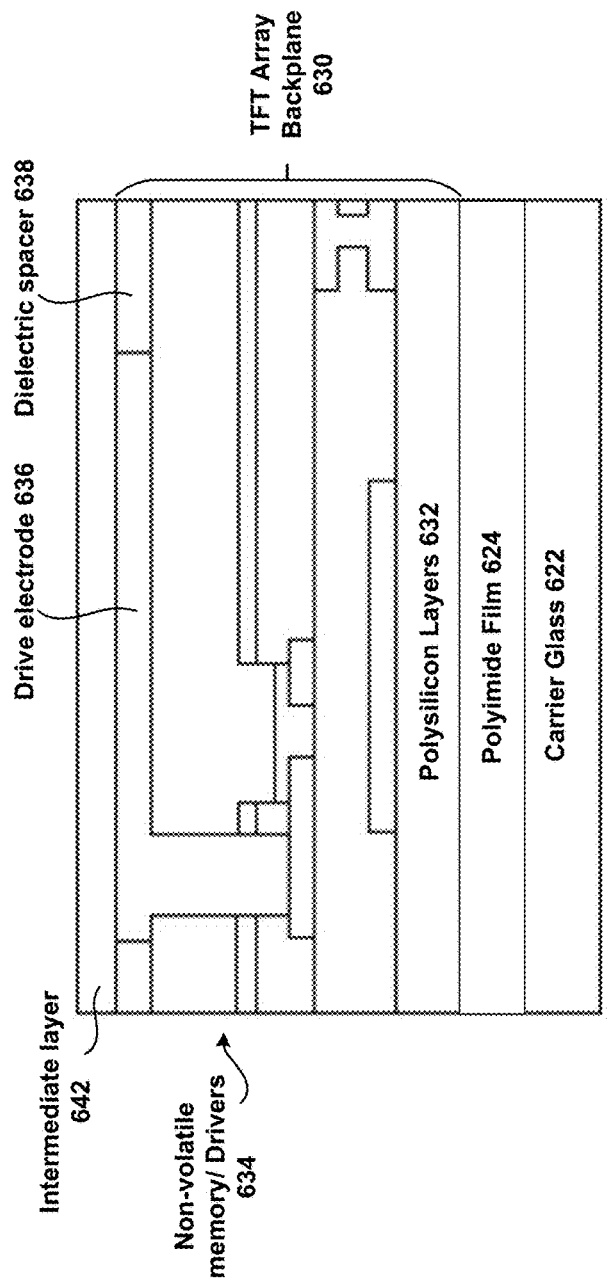
FIG. 6C shows a schematic diagram of an intermediate metal layer formed on the TFT backplane device of FIGS. 6B-1 and 6B-2.
Figures 2, 6D:
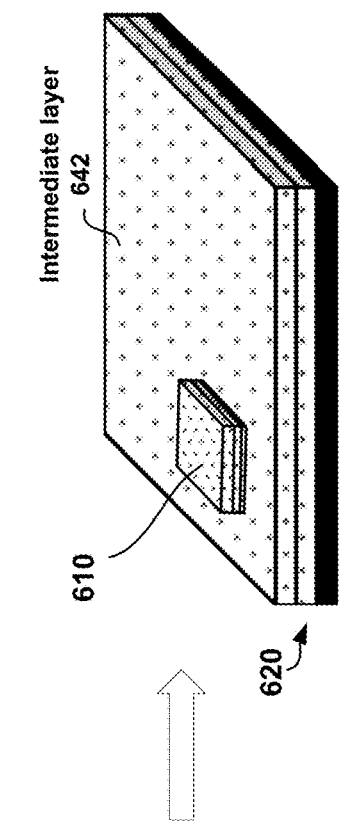
Figures 1, 6D:
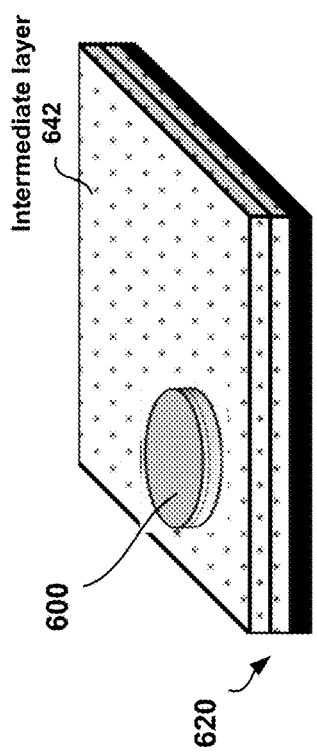
Figures 3, 6D:
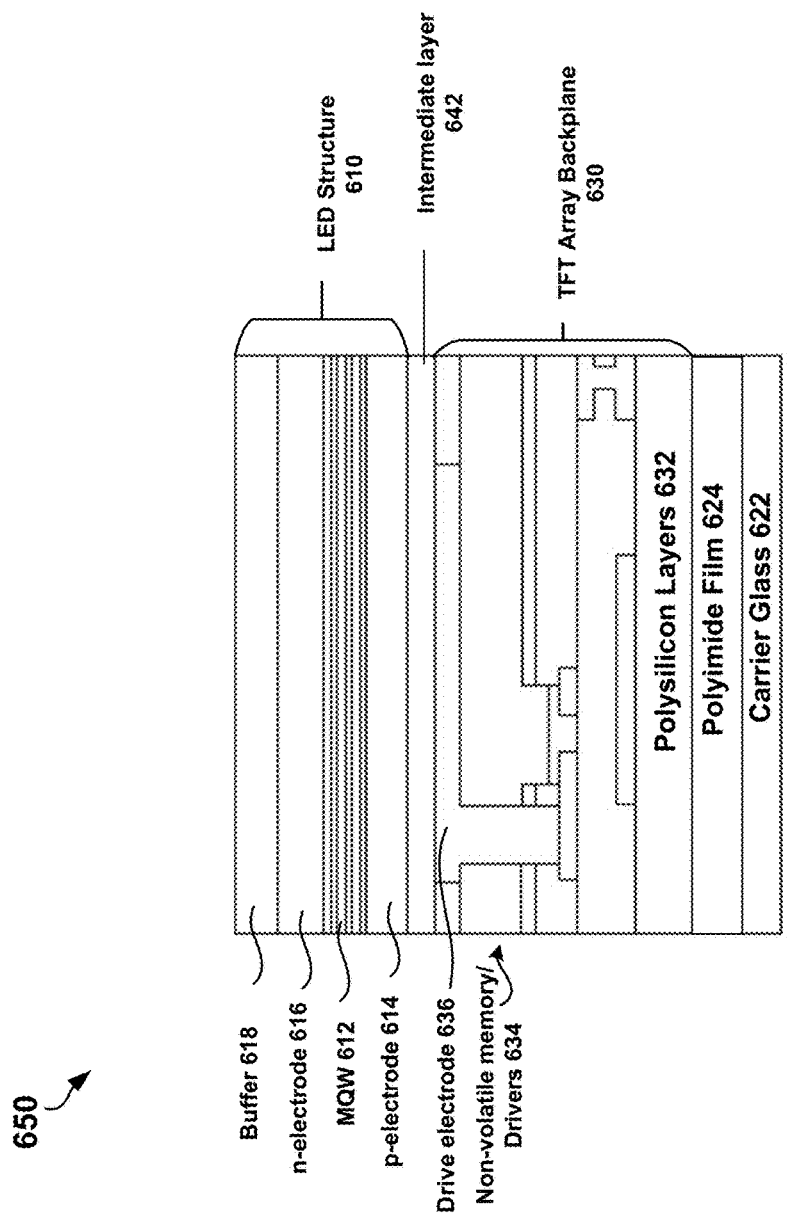
Figures 4, 6D:
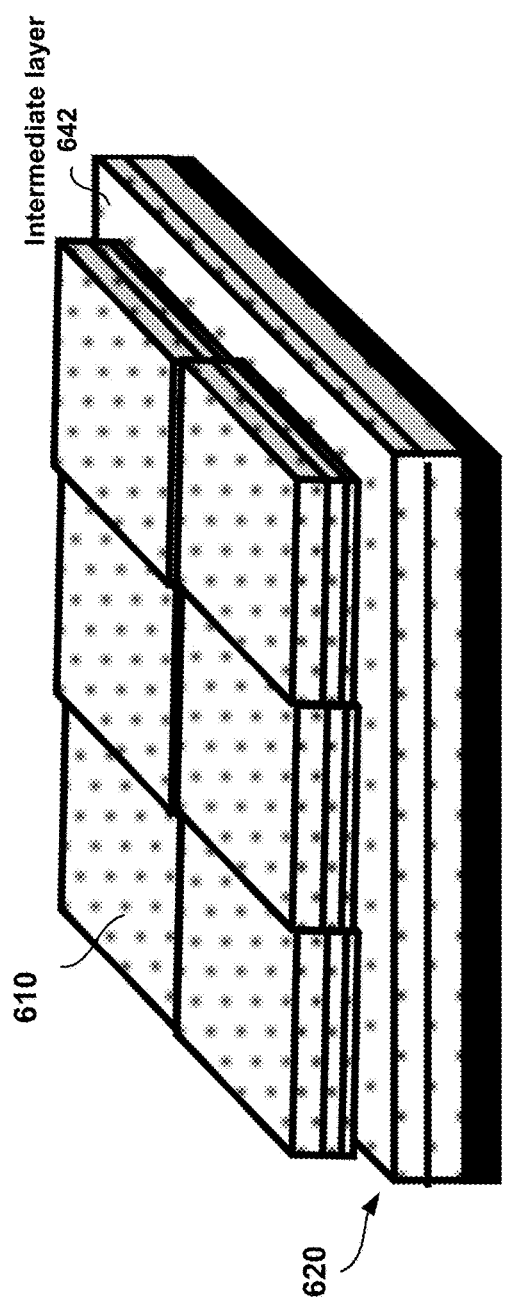

As illustrated in FIG. 6C, the intermediate layer 642 can be first deposited onto the bonding surface of the TFT array backplane device 620. The intermediate layer 642 can be a continuous layer across the TFT array backplane device 620. As discussed with details below, the intermediate layer 642 can include one or more intermediate metallic layers. The metallic layers can include one of: an iridium-tin-oxide (ITO) film with a titanium (Ti) film, a cupper (Cu) film with a Tantalum (Ta) film, an aluminum (Al) film with a Tin (Sn) film, and a gold (Au) or silver (Ag) film with at least one adhesive film including chromium (Cr), Platinum (Pt), Palladium (Pd), or Titanium (Ti).

FIG. 6D-1 shows a schematic diagram of bonding the LED device 600 to the TFT backplane device 620. As the TFT backplane device 620 can have a larger area than the LED device 600, multiple LED devices can be arranged on the TFT backplane device 620. Before bonding, the LED device 600 can be aligned to a particular region on the TFT backplane device 620, e.g., in a vacuum chamber. As the LED structure 610 includes continuous layers across the LED device 600, the LED device 600 can be aligned with the particular region of the TFT backplane device 620 at a low alignment accuracy, e.g., at a sub-millimeter precision. As illustrated in FIG. 6D-1, the LED device 600 is flipped over with the p-electrode layer 616 facing to the intermediate layer 642 and aligned with the particular region on the TFT backplane device 620. Then the aligned two wafers are clamped together on a bonding chuck, and a pressure is applied on both sides of the wafers when the wafers are in a full contact at a low temperature for a period of time. The bonded devices can be annealed to another low temperature for another period of time.

The following shows examples of low temperature bonding for bonding an LED device to a TFT backplane, which is similar to the low temperature bonding for bonding an LED device to a CMOS backplane, but with an even lower temperature.

Examples of Low Temperature Bonding

Example 1. Bonding Using Cupper-Tantalm Intermediate Layers

The low temperature bonding of the LED device 600 onto the TFT array backplane device 620 can use a cupper (Cu) film and a thin Tantalum (Ta) film as the intermediate layers. The following is an example bonding process.

First, a 50-nm Ta thin-film is deposited onto the top surface of the TFT array backplane device 620, e.g., surfaces of the drive electrodes 636 and the dielectric spacers 638, and a 300-nm Cu thin-film is deposited on top of the Ta film in a vacuum chamber with pressures lower than $1\times10^{-6}$ Torr.

Second, both devices are placed in a vacuum chamber with pressures near $1\times10^{-3}$ Torr or in an atmosphere pressure nitrogen (N2) environments.

Third, the LED device 600 is aligned to a particular region of the TFT backplane device 620 face-to-face and clamped together on a bonding chuck.

Fourth, a pressure of 30 psi is applied on both sides of the bonded devices when the devices are in a full contact at 200° C. for 1 hour.

Fifth, the bonded devices are annealed to a temperature near 300° C. for about 1 hour.

Example 2. Bonding Using Aluminum-Tin Intermediate Layers

The low temperature bonding of the LED device 600 onto the TFT array backplane device 620 can use an Aluminum (Al) film and a thin Tin (Sn) film as the intermediate layers. The following is an example bonding process.

First, a 50-nm Sn thin-film is deposited onto the top surface of the TFT array backplane device 620, and a 300-nm Al thin-film is deposited on top of the Sn film in a vacuum chamber with pressures lower than $1\times10^{-6}$ Torr.

Second, both devices are placed in a vacuum chamber with pressures near $1\times10^{-3}$ Torr or in an atmosphere pressure nitrogen (N2) environments.

Third, the LED device 600 is aligned to a particular region of the TFT array backplane device 620 face-to-face and clamped together on a bonding chuck.

Fourth, a pressure of 21.6 psi is applied on both sides of the bonded devices when the devices are in a full contact at 200° C. for 1 hour.

Fifth, the bonded devices are annealed to a temperature near 300° C. for about 1 hour.

Example 3. Bonding Using Gold or Silver Intermediate Layers

The low temperature bonding can be also performed by evaporating and plating gold (Au) or silver (Ag) on to one of the devices and then exposing the gold or silver to UV light just before bonding to remove organic contaminants that preclude gold surfaces contact with the other device into which it is bonded. The following is an example process.

First, approximately 1-μm thick Au film with a suitable adhesion layer of (Cr, Pt, Pd) is deposited on each of the LED device 600 and the TFT array backplane device 620 to be bonded.

Second, a 300 Angstroms of Ti adhesive layer, an optional diffusion barrier layer, and 1400 Angstroms of Au (Au—Pt—Ti) or (Au—Ti) are subsequently electron-beam (E-beam) evaporated onto the surface of the TFT array backplane device 620.

Third, the LED device 600 is aligned to a particular region of the TFT backplane device 620 face-to-face and clamped together on a bonding chuck.

Fourth, a pressure of 30 psi is applied on the bonded area for 5-10 minutes at a temperature of 150° C. to 200° C.

Fifth, optionally, the bonded devices can be annealed to a temperature below 300° C. for about 1 hour. Note that annealing temperature beyond 300° C. may result a damage to integrated circuitry in the TFT array backplane device 620.

Example 4. Bonding Using Iridium-Tin-Oxide (ITO)-Titanium (Ti) Intermediate Layers The low temperature bonding of the LED device 600 onto the TFT array backplane device 620 can use a transparent metal ITO film and a thin Ti film as the intermediate layers. The following is an example bonding process.

First, a 300 Angstroms of Ti adhesive layer, as an optional diffusion barrier layer, and 1400 Angstroms of ITO are subsequently sputtered onto surfaces of the TFT array backplane devices in a vacuum chamber with pressures lower than $1\times10^{-6}$ Torr.

Second, both devices are placed in a vacuum chamber with pressures near $1\times10^{-3}$ Torr or in an atmosphere pressure nitrogen (N2) environments.

Third, the LED device 600 is aligned to a particular region of the TFT backplane device 620 face-to-face and clamped together on a bonding chuck.

Fourth, a pressure of 30 psi is applied on both sides of the bonded devices when the devices are in a full contact at 200° C. for 1 hour.

Fifth, the bonded devices are annealed to a temperature near 300° C. for about 1 hour.

Referring back to FIG. 6D-1, the LED structure 610 can be formed on a wafer substrate 602 having a circular shape, e.g., a sapphire wafer. To accommodate a number of LED structures 610 on the same TFT array backplane device 620, different methods can be adopted.

In some implementations, the LED device 600 on the wafer substrate 602 can be first cut into a rectangular shape and then bonded to the TFT array backplane device 620.

In some implementations, a step and scan lift-off method can be adopted. After one LED device 600 is bonded to the TFT array backplane device 620, laser lift-off is performed on a rectangular area in the LED device 600, so that the LED structure (e.g., the LED multi-epitaxial layers) in the rectangular area scanned by the laser is separated from the wafer substrate 602 and remains bonded to the TFT array backplane device 620. The LED structure in the non-scanned area of the LED device 600 remains with the wafer substrate 602 and can be moved away from the TFT array backplane device 620. Thus, a rectangular shape LED structure 610 is bonded on the TFT array backplane device 620, as illustrated in FIG. 6D-2. The wafer substrate 602 can be cleaned and reused.

FIG. 6D-3 shows a cross-sectional diagram of a bonded device 650 including the rectangular shape LED structure 610 and the TFT backplane device 620. The LED structure 610 includes continuous layers having a buffer layer 618, an n-electrode layer 616, an MQW layer 612, and a p-electrode layer 614. The substrate 602 was lifted off as noted above. The continuous p-electrode layer 614 is bonded with the drive electrodes 636 of the TFT backplane 630 through the continuous intermediate layer 642.

Using the same step and scan lift-off method, one or more rectangular shape LED structures 610 can be bonded on the TFT backplane device 620 via the intermediate layer 642, as illustrated in FIG. 6D-4. The rectangular shaped LED structures 610 can be arranged adjacent to each other to form a large display. In some implementations, after a first rectangular shape LED structure 610 is bonded on the TFT array backplane device 620, a second LED device 600 is positioned on the TFT array backplane device 620. The second LED device 600 is aligned with a particular area of the TFT array backplane device 620, such that a second rectangular shape LED structure 610 to be obtained from the second LED device 600 is adjacent to the first rectangular shape LED structure 610. A periphery of the second LED device 600 may be over a part of the first rectangular shape LED structure 610. As the periphery is taken away from the TFT array backplane device 620 later, there is no or little effect on the first rectangular shape LED structure 610. Note that a rectangular shape is used herein for illustration only, other suitable shapes can be also used, e.g., a hexagon shape.

Figure 6E:
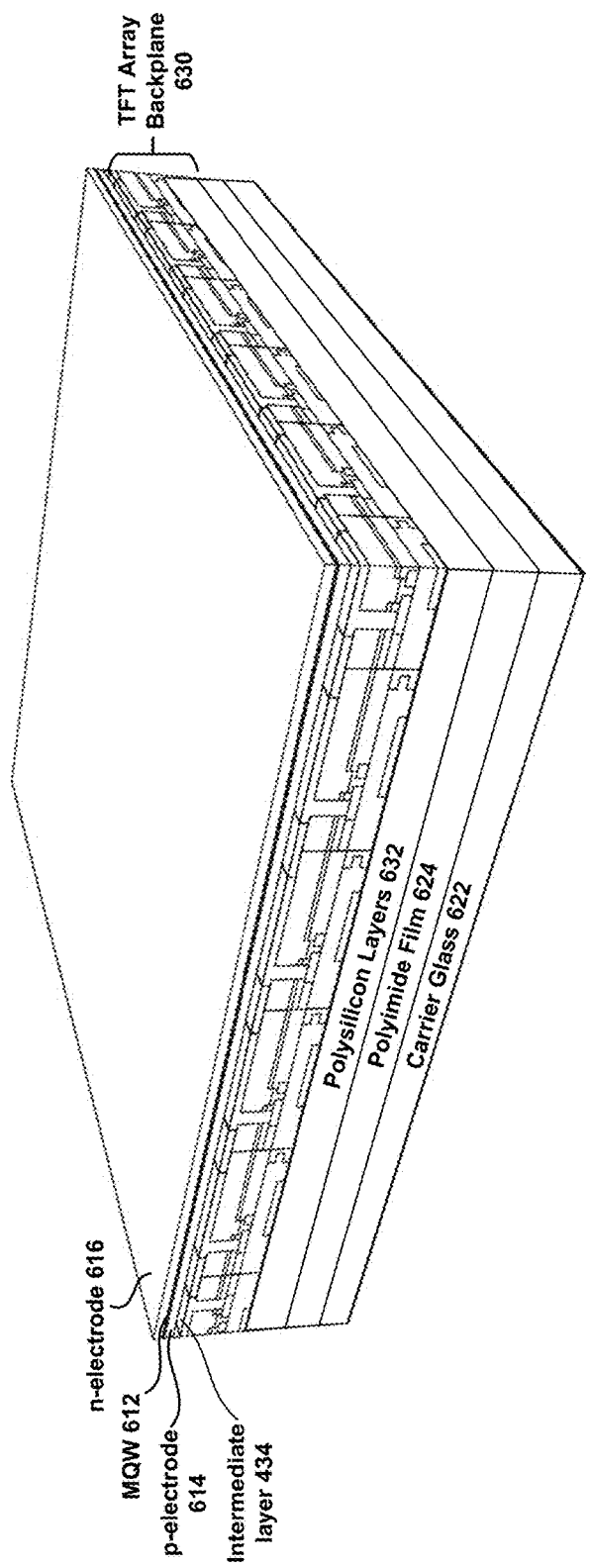
FIG. 6E is a perspective view of the bonded device after removing the substrate of the LED structure.
Figure 6F:
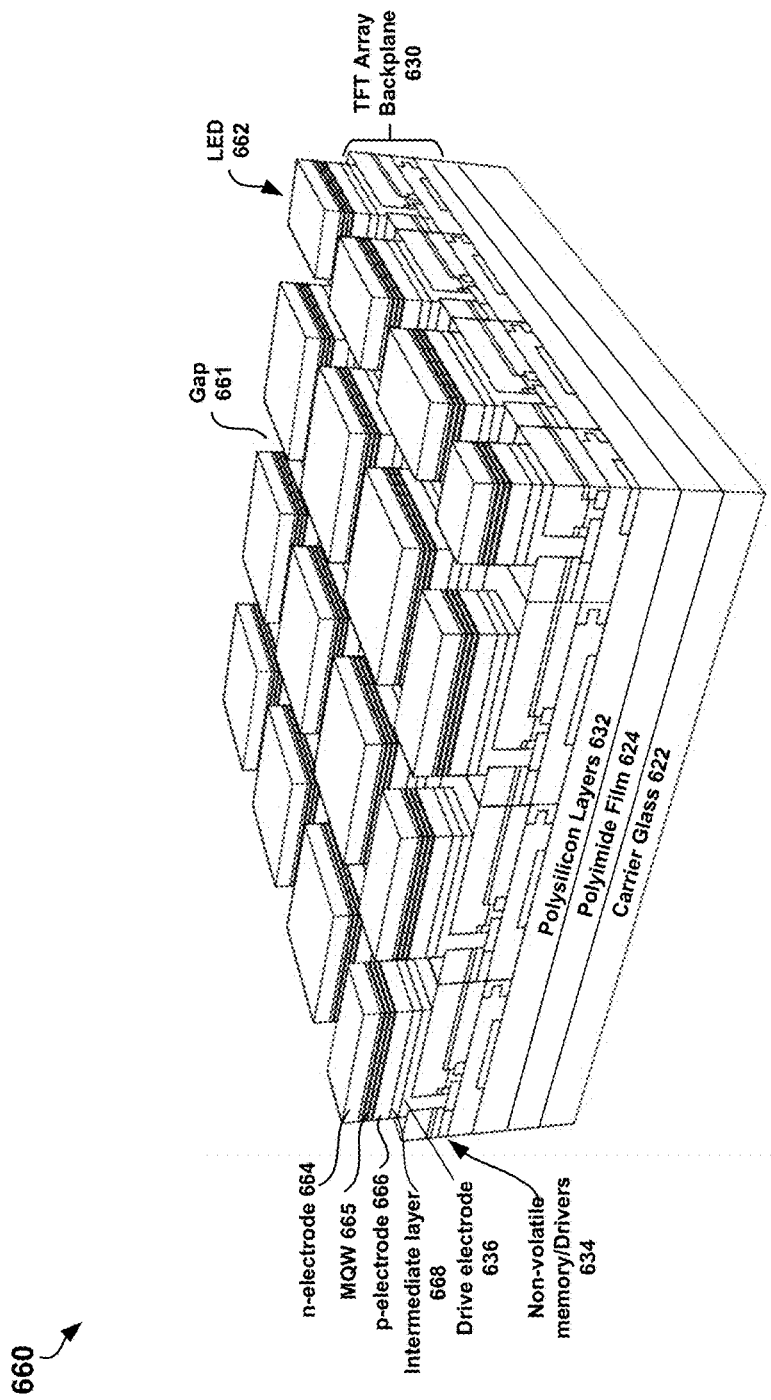
FIG. 6F is a perspective view of the bonded device after patterning the multi-layered LED structure.

For further processing, the LED structures 610 on the TFT array backplane device 620 can be polished, e.g., by a chemical-mechanical polishing (CMP) process, to remove the buffer layer (e.g., GaN layer) 618 until stopping at the n-electrode layer 616 (e.g., n-GaN layer). In some implementations, the n-electrode layer 616 is further thinned by polishing to remove a portion of the n-electrode layer 616, as illustrated in FIG. 6E.

The polished (and/or thinned) LED structures 610 can be patterned to form an array of LEDs. Before patterning, a protective mask can be aligned with the drive electrodes 636 in the top layer of the TFT array backplanes 630, such that the dielectric spacers 638 between the drive electrodes 636 are also selectively etched away. The protective mask can be determined based on information fabricating the drive electrodes 636 in the TFT array backplanes 630. For example, the drive electrodes 636 are fabricated by forming a protective mask (e.g., photoresist or hard mask), depositing materials of the drive electrodes, and removing the protective mask layer. The protective mask for patterning the LED structures 610 can be determined based on the protective mask for fabricating the drive electrodes 636. In this way, the protective mask for patterning the LED structures 610 can be aligned with the drive electrodes 636 with high accuracy but low effort.

After the alignment, the patterning can be performed with the following steps: 1) patterning a hard mask layer, e.g., SiNx such as $Si_3N_4$, on top of the LED structures, e.g., on the n-electrode layers 616 (e.g., n-GaN) of the LED structures 610; 2) etching through the layers of the LED structures 610, the intermediate layer 668, and the dielectric spacers 638 of the TFT array backplanes 630; 3) removing the remaining hard mask layer. Particularly, as the intermediate layer 668 can include metal, etching the intermediate layer 668 can be separately performed from etching the epitaxial layers of the LED structures 610 and the dielectric spacers 638 of the TFT array backplanes 630.

FIG. 6F shows a perspective view of the patterned device 660. The LED structure 610 is patterned to form an array of LEDs 662. Adjacent LEDs 662 and adjacent intermediate layer 668 are separated from each other by gaps 661. Each LED 662 can have a size no smaller than (e.g., same as or larger than) a size of the respective drive electrode 636. The LED 662 and the intermediate layer 668 are aligned with the respective drive electrode 636. The LED 662 and the respective intermediate layer 668 can have the same size and be self-signed with each other due to simultaneous patterning.

Each LED 662 includes n-electrode 664, MQW 665, and p-electrode 666. The LED 662 is conductively coupled to a respective non-volatile memory via the bonded p-electrode 666 and the drive electrode 636 by the intermediate layer 668, such that an active-matrix pixel is formed. Accordingly, an array of active-matrix LED pixels is formed after the patterning.

In some implementations, as noted above, differences between different light conversion efficiencies among different pixel elements in each display pixel can be compensated by controlling pixel area ratios among the different pixel elements in the display pixel. The LED structure 610 can be first patterned to form a plurality of first LEDs to be used as blue sub-pixels for emitting a blue color, then patterned to form a plurality of second LEDs to be used as green sub-pixels for emitting a green color, and then patterned to form a plurality of third LEDs to be used as red sub-pixels for emitting a red color. An area ratio between the first LED, the second LED, and the third LEDs can be based on a ratio of different light conversion efficiencies of the sub-pixels.

Figure 6G:
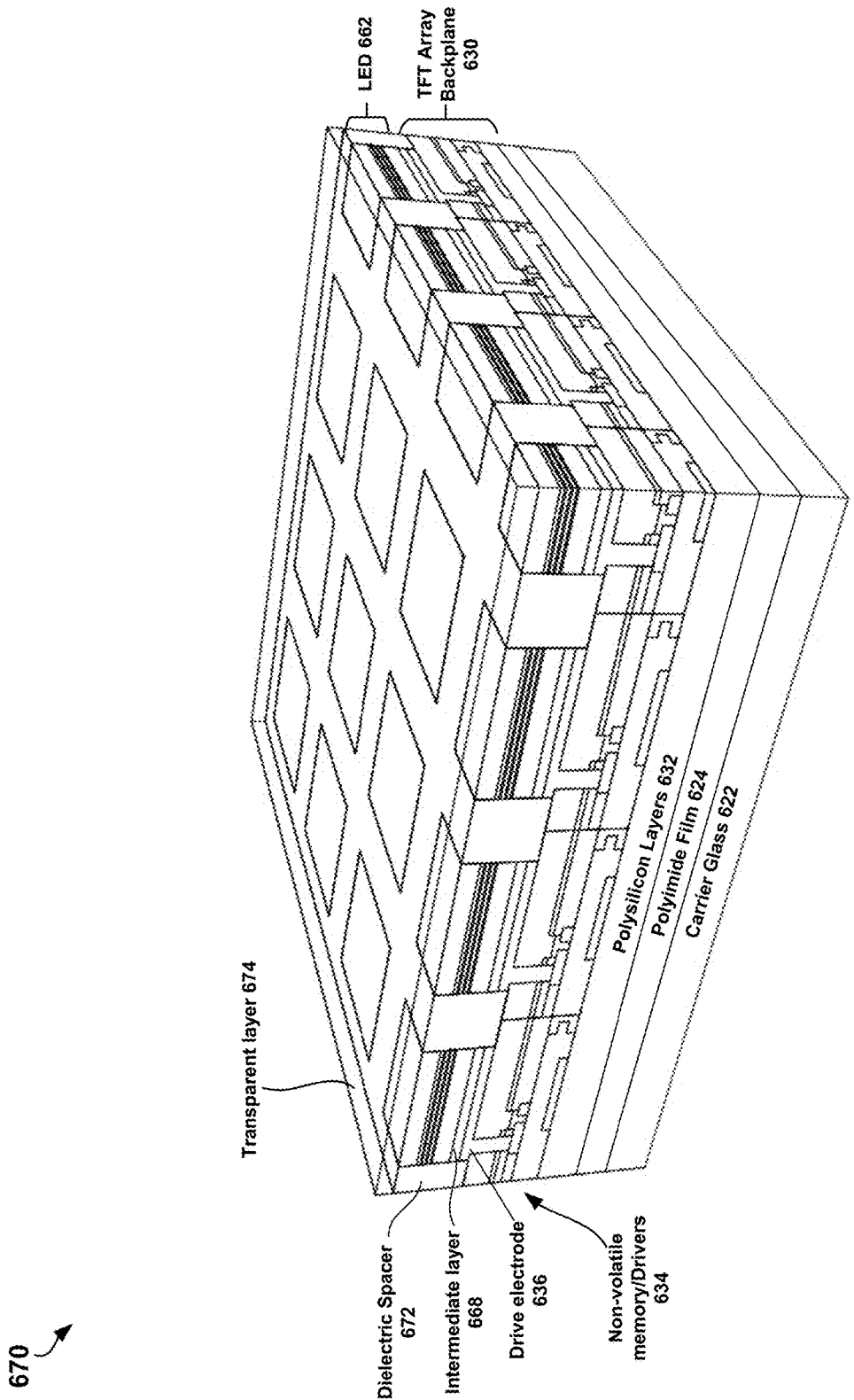
FIG. 6G is a perspective view of forming dielectric spacers and a transparent electrode on the patterned device of FIG. 6F.

Then, an isolation material is filled into the gaps 661 between the LEDs 662. For example, an opaque dielectric material such as SiNx can be deposited in the gaps 661 by chemical vapor deposition (CVD). Topology planarization, e.g., polishing by chemical-mechanical polishing (CMP), is performed to form a flat surface across the array of LEDs 662. The deposited dielectric material can be polished to expose doped surfaces of the LEDs 662, e.g., to the n-electrodes 664 of the LEDs 662. That is, the flat surface can include surfaces of the n-electrodes 664 of the LEDs 662. A transparent conductive layer 674, e.g., an ITO layer, is deposited on top of the flat surface including the surfaces of the n-electrodes 664 of the LEDs 662 to form a common electrode, e.g., an electrical common ground. FIG. 6G shows a perspective view of the formed device 670, where dielectric spacers 672 are formed in the gaps 661, and the transparent conductive layer 674 are formed on the LEDs 662. The dielectric spacers 672 can include an opaque dielectric material.

Figure 6H:
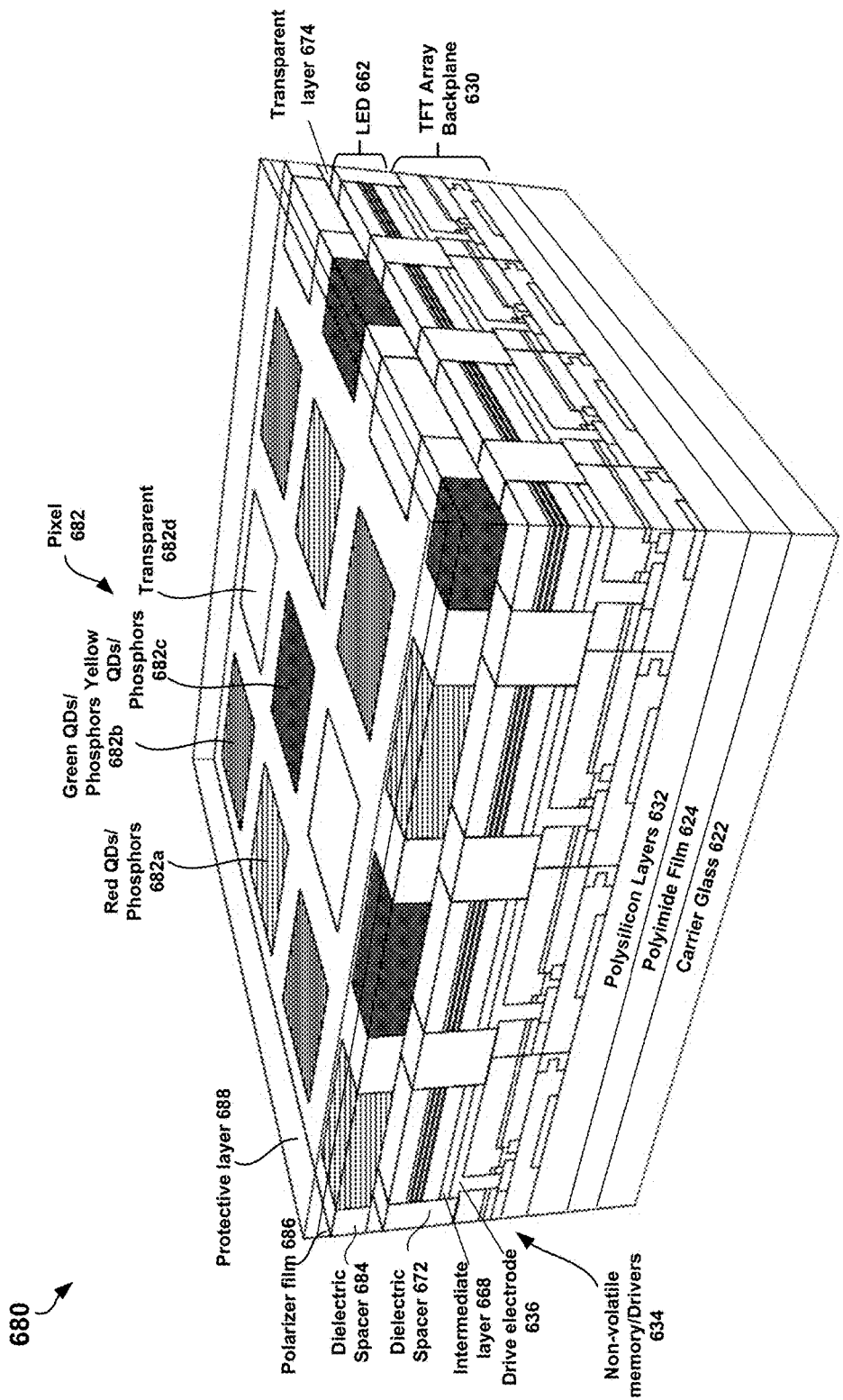
FIG. 6H is a perspective view of forming multi-color phosphor layers and a protective layer on the formed device of FIG. 6G.

As shown in FIG. 6H, secondary color LEDs, e.g., red color LEDs, green color LEDs, and white color LEDs, can be formed based on the previously-formed LEDs, e.g., blue color LEDs 452. The different color LEDs can form multi-color LED pixels 682. Each pixel 682 can include a blue color LED, a red color LED, a green color LED, and a white color LED. As discussed above, the secondary color LEDs can be formed on surface of the LEDs 662 by using different color phosphor materials or different size quantum-dot (QD) materials.

In some implementations, an array of the multi-color LED pixels 682 is formed by the following processes: 1) patterning using photoresist for specific color LEDs, e.g., red LEDs; 2) depositing, e.g., by ink-jet printing, specific color phosphor films or specific size QD thin-films for the specific color, e.g., red QDs/phosphors 682a (red phosphor films or red QD thin-films); 3) lifting off to remove the photoresist to form specific color phosphors/Quantum-dot arrays thus to form the specific color LED arrays, e.g., red LED arrays; 4) repeating the same processes above to form another specific color LED arrays, e.g., green LED arrays, but with another specific color phosphor films or another specific size QD thin-films, e.g., green QDs/phosphors 682b (green phosphor films or green QD thin-films); and 5) repeating the same processes above to form another specific color LED arrays, e.g., white LED arrays, but with another specific color phosphor films or another specific size QD thin-films, e.g., yellow QDs/phosphors 682c (yellow phosphor films or yellow QD thin-films). In some examples, blue color LEDs in the pixels 682 can be also formed by depositing corresponding blue color phosphor film or corresponding size QD thin film on the formed blue LEDs 662.

In some examples, as illustrated in FIG. 6H, transparent layers 682d are formed on the blue color LEDs 662 in the pixels 682. Dielectric spacers 684 are formed between the deposited phosphors or QDs for different color LEDs. The dielectric spacers 684 can include an opaque dielectric material such as SiNx. For example, after depositing the red QDs/Phosphors 682a, green QDs/Phosphors 682b, yellow QDs/Phosphors 682c, and transparent layers 682d on the LEDs 662, the dielectric material is deposited on top of the bonded device. Topology planarization, e.g., polishing by CMP, can be performed to form a flat surface across the array of pixels 682.

A polarizer film 686 can be deposited on the flat surface across the array of pixels 682 and the dielectric spacers 684. The polarizer film 686 is configured to allow light from the pixels 682 to propagate through along a polarization direction to become a polarized light, which can also reduce scattering and get more uniform light. A protective layer 688 can be then formed on the polarizer film 686. As noted above, the protective layer 688 can be a touch-sensitive transparent layer and can form, together with the transparent layer 674 (as the common electrode), a capacitive touch screen position sensor. The protective layer 688 can be made of transparent material, e.g., glass or plastic, coated with a conductive material, e.g., indium tin oxide (ITO). FIG. 6H shows the formed integrated device 680 including the arrays of multi-color active-matrix LED pixels 682 formed on the TFT array backplanes 630 and covered with the polarizer film 686 and the protective layer 688.

The integrated device 680 has the polyimide film 624 on the carrier glass 622 as the substrate. To form a flexible device, the carrier glass 622 can be removed from the integrated device 680, e.g., by laser lift-off. For example, the polyimide-coated carrier glass 622 can be delaminated via UV excimer laser lift-off, e.g., at 308 nm, with an ablation threshold, e.g., at 235 mJ/cm^2.

FIG. 6I shows an integrated active-matrix LED pixel array based device 690 formed by the above fabrication process. As described in FIGS. 5A and 5B, the TFT array backplanes 630 are formed on the polyimide film 624 on the carrier glass substrate 622 and each include a number of non-volatile memories/drivers 634. Each non-volatile memory includes at least one transistor conductively coupled to the respective drive electrode 636 in a top layer of the TFT array backplane 630. An array of LEDs 662 is bonded to the TFT array backplanes 630 through the intermediate layers 668 to form an array of active-matrix LED pixels. Each LED pixel 682 includes four LEDs 662 and four non-volatile memories conductively coupled to the four LEDs 662. Each LED includes epitaxial semiconductor layers having one or more quantum well layers MQW 665 between a first contact electrode (p-electrode 666) and a second contact electrode (n-electrode 664). The p-electrodes 666 of the LEDs 662 are respectively bonded and conductively coupled to the drive electrodes 636 via the intermediate layers 668. Each LED 662 has a substantially same area size as the respective bonded drive electrode 636 and is aligned with the respective bonded drive electrode 636. The LED 662 and the respective intermediate layer 668 are self-signed with each other due to simultaneous patterning. The dielectric spacers 672 are disposed in gaps between adjacent LEDs 662 and the respective bonded drive electrodes 636. The transparent conductive layer 674 is on a flat surface of the array of the LEDs 662 and in contact with the n-electrodes 666 of the LEDs 662 to form a common ground of the active-matrix LED pixels. Patterns of different color phosphor materials or quantum dots materials 682a, 682b, and 682c are formed above the array of LEDs 662 to form an array of multi-color display pixels 682. Each display pixel 682 including four sub-pixels operable to emit light with four different colors including blue, red, green, and white when excited by the corresponding four LEDs in the display pixel. The blue color can be directly generated by the blue LEDs 452. The transparent protective layer 688 is used to protect surfaces of the array of active-matrix multi-color display pixels 682, and the polarizer film 686 can be arranged between the pixels 682 and the transparent protective layer 688. The protective layer 688 can be a touch-sensitive transparent layer and can form, together with the transparent layer 674 (as the common electrode), a capacitive touch screen position sensor.

Example Process

FIG. 7 is a flow diagram of an example process 700 of forming an integrated active-matrix light-emitting pixel display system by bonding. The integrated system can be the integrated LED pixel array based display system 100 of FIG. 1, 300 of FIGS. 3A-3B, and 500 of FIGS. 5A-5B. The example process 700 can be similar to the processes described according to FIGS. 4A-1 to 4I or the processes described according to FIGS. 6A-6I.

A plurality of layers is formed on a first substrate to form a light emitting structure (702). In some implementations, the light emitting structure includes multiple quantum well (MQW) semiconductor layers between a first contact electrode, e.g., a p-GaN electrode, and a second contact electrode, e.g., an n-GaN electrode. The MQW layers can include Group III-V compounds and be configured to be activated to emit light with a primary color. In some examples, the MQW layers include pairs of In0.3Ga0.7N/GaN layers, and the light emitting structure is a blue LED structure, e.g., the blue LED structure 400a formed on a sapphire substrate or the blue LED structure 400b formed on a silicon (111) substrate. In some examples, the MQW layers include pairs of AlGaN/GaN layers, and the light emitting structure can be a UV or deep UV LED structure formed on a sapphire substrate. The plurality of layers can be epitaxial semiconductor layers grown on the first substrate, e.g., by MOCVD.

The light emitting structure on the first substrate is integrated with a backplane device formed on a second substrate by bonding (704). The backplane device includes at least one backplane having a plurality of pixel circuits. Each of the pixel circuits can include a non-volatile memory including at least one transistor conductively coupled to a corresponding drive electrode in a top layer of the backplane device. The light emitting structure can be integrated with the backplane device by connecting a top layer of the light emitting structure, e.g., the first contact electrode, with the top layer of the backplane device including the drive electrodes, e.g., by low temperature bonding using an intermediate conductive layer. In such a way, the non-volatile memories are conductively coupled to the light emitting structure via the first contact electrode, the intermediate conductive layer, and the drive electrodes.

The intermediate conductive layer can include one or more metallic films. The metallic films can include one of: an iridium-tin-oxide (ITO) film with a titanium (Ti) film, a cupper (Cu) film with a Tantalum (Ta) film, an aluminum (Al) film with a Tin (Sn) film, and a gold (Au) or silver (Ag) film with at least one adhesive film including chromium (Cr), Platinum (Pt), Palladium (Pd), or Titanium (Ti).

To achieve good bonding, both bonding surfaces can be pre-treated to remove any contamination and/or oxide film that can hamper diffusion of intermediate metals diffusing into the bonding surfaces. Before bonding, the light emitting structure and the backplane are aligned with each other in a vacuum chamber. As the layers in the light emitting structure is continuous across the light emitting structure, the alignment can be at a wafer level alignment accuracy, e.g., at a sub-millimeter precision wafer alignment. After the alignment, the two devices are clamped together on a bonding chuck, and a pressure is applied on both sides of the devices when the devices are in a full contact at a low temperature for a period of time. Then the bonded devices can be optionally annealed to another low temperature for another period of time.

The first substrate is laser lifted-off to expose the light emitting structure according to a laser scan area (706). As noted above, the first substrate, e.g., a sapphire substrate, for the light emitting structure can be removed by a laser, e.g., a short pulse KrF UV excimer laser, scanning an area over the first substrate, e.g., by delamination of a buffer layer (such as GaN layer) of the light-emitting structure from the sapphire substrate transparent for the UV laser.

In some implementations, the backplane includes a complementary metal-oxide-semiconductor (CMOS) backplane, and the second substrate includes a silicon semiconductor wafer. Before the integration, the two devices are aligned at a wafer-to-wafer level of accuracy. After the integration, the first substrate can be removed, e.g., by laser lift-off, to expose the light emitting structure. The light emitting structure can be polished (or thinned) to expose the second contact electrode for further processing.

In some implementations, the backplane includes a low temperature polysilicon (LTPS) active-matrix (AM) thin-film transistors (TFT) array control backplane, and the second substrate includes a flexible film, e.g., a polyimide film or a stainless steel, on a carrier substrate, e.g., a carrier glass. Multiple light emitting structures can be arranged on the second substrate by sequentially performing scan and lift-off on each light emitting structure formed on a first structure, e.g., a semiconductor wafer. For example, a first light emitting structure on a first wafer can be aligned with a first region of the TFT backplane device and then bonded with the first region of the TFT backplane device, e.g., by low temperature bonding. A laser, e.g., a UV laser, can be used to scan a rectangular shape area on the light emitting structure, such that the light emitting structure in the rectangular area is separated from the first substrate and remains bonded on the TFT backplane device. Then the first substrate together with the light emitting structure on non-scanned areas are removed from the first region of the TFT backplane device. The light emitting structure can include a buffer layer formed on the first substrate. Removing the first substrate for the TFT backplane device can expose the buffer layer for further processing.

Then a second light emitting structure on a second wafer can be aligned with a second region of the TFT backplane device. By the similar method as described above, the second light emitting structure on a rectangular area is separated from the second wafer and remains bonded to the second region of the TFT backplane device, and the second light emitting structure on non-scanned area are lifted off together with the second wafer. The second light emitting structure on the second wafer is aligned with the second region of the TFT backplane device on the second substrate, such that the second light emitting structure in the second area is adjacent to the light emitting structure in the first area on the TFT backplane device.

After the multiple light emitting structures are arranged on the TFT backplane device, the buffer layers of the light emitting structures can be removed by polishing, e.g., CMP, such that the second contact electrodes of the light emitting structures are exposed for further processing. The second contact electrodes can be further thinned by polishing.

The light emitting structure is patterned to form an array of light emitting elements each coupled to respective pixel circuits of the backplane device to thereby form an array of active-matrix light emitting pixels (708). Before patterning, a protective mask can be aligned with the respective drive electrodes in the top layer of the backplane device, such that dielectric spacers between the respective drive electrodes are selectively etched away. The light emitting structure, the intermediate conductive layer, and the dielectric spacers are patterned simultaneously, such that each light emitting element is self-aligned with a corresponding intermediate conductive layer. The light emitting element can have the same size as the corresponding intermediate conductive layer. The light emitting element is aligned with the corresponding drive electrode, and can have a size no smaller than the corresponding drive electrode. Each light emitting element is conductively coupled to a respective non-volatile memory by the second contact electrode, the intermediate conductive layer and the corresponding drive electrode. Each light emitting pixel includes at least one of the light emitting elements and at least one of the non-volatile memories conductively coupled to the at least one of the light emitting elements.

After the patterning, an isolation material, e.g., an opaque dielectric material such as SiNx, is filled in gaps between the adjacent light emitting elements. Then, topology planarization, e.g., polishing by chemical-mechanical polishing (CMP), is performed to form a flat surface across the array of light emitting elements. The filled dielectric material can be polished to expose doped surfaces of the light emitting elements, e.g., to the second contact electrodes such as n-GaN electrodes. A transparent conductive layer, e.g., an ITO layer, can be deposited on top of the flat surface including the surfaces of the second contact electrodes to form a common electrode, e.g., an electrical common ground, for the light emitting elements.

An array of active-matrix multi-color display pixels is formed by selectively depositing different color phosphor or different size quantum-dot materials on the array of light emitting elements (710). Each light emitting element is operable to emit light with a primary color. The phosphor material or the quantum-dot material is operable to emit a secondary color when excited by light from the light-emitting element. The secondary color can be different from the primary color.

In some implementations, each light emitting element is operable as a blue color LED, e.g., with an emission wavelength between 450 nm and 500 nm. In each display pixel, at least two blue color LEDs are configured to optically excite at least two other colors by secondary light emission of the phosphor materials or quantum dots materials on the at least two blue color LEDs. Each of the active-matrix light emitting pixels is configured to be a multi-color display pixel including one blue color LED operable to provide a blue color and the at least two blue color LEDs with the phosphor materials or quantum dots materials operable to respectively provide a red color and a green color.

In some implementations, each of the light-emitting elements is operable as a light-emitting diode (LED) to emit UV or deep UV light with a wavelength between 100 nm and 450 nm. For each of the active-matrix light emitting pixels, at least three UV or deep UV LEDs are configured to optically excite at least three colors, e.g., red, green, and blue, by secondary light emission of the phosphor materials or quantum dots materials on the at least three UV or deep UV LEDs. The pixel can also include a UV or deep UV LED configured to emit a white color by secondary light emission of yellow color phosphor material or quantum dot material on the UV or deep UV LED.

A transparent protective layer can be formed on top of the array of active-matrix multi-color display pixels. The protective layer can be a touch-sensitive protective layer and can form, together with the transparent conductive layer (as the common electrode), a capacitive touch screen position sensor. The protective layer can be made of transparent material, e.g., glass or plastic, coated with a conductive material, e.g., indium tin oxide (ITO). A polarizer film can be deposited between the protective layer and the array of display pixels.

In some implementations, the backplane is a CMOS backplane formed on a top side of a semiconductor wafer. A conductive grid array package, e.g., ball grid array (BGA) package, can be formed on a bottom side of the semiconductor wafer and conductively coupled to the CMOS backplane. The BGA package can function as conductive interconnects to connect the CMOS backplane to other displays for seamless integration to form a larger display or to a control unit of a larger display.

In some implementations, the backplane is a TFT array control backplane formed on a flexible film on a carrier glass. After the array of multi-color active matrix display pixels is formed, the carrier glass can be removed, e.g., by laser lift-off. For example, the polyimide-coated carrier glass can be delaminated via UV excimer laser lift-off at 308 nm. In such a way, the formed integrated device on the flexible film can be flexible.

Embodiments of the subject matter and the functional operations described in this specification can be implemented in digital electronic circuitry, in tangibly-embodied computer software or firmware, in computer hardware, including the structures disclosed in this specification and their structural equivalents, or in combinations of one or more of them. Embodiments of the subject matter described in this specification can be implemented as one or more computer programs, i.e., one or more modules of computer program instructions encoded on a tangible non-transitory program carrier for execution by, or to control the operation of, data processing apparatus. Alternatively or in addition, the program instructions can be encoded on an artificially-generated propagated signal, e.g., a machine-generated electrical, optical, or electromagnetic signal, that is generated to encode information for transmission to suitable receiver apparatus for execution by a data processing apparatus. The computer storage medium can be a machine-readable storage device, a machine-readable storage substrate, a random or serial access memory device, or a combination of one or more of them.

The processes and logic flows described in this specification can be performed by one or more programmable computers executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application-specific integrated circuit).

Computers suitable for the execution of a computer program include, by way of example, can be based on general or special purpose microprocessors or both, or any other kind of central processing unit. Generally, a central processing unit will receive instructions and data from a read-only memory or a random access memory or both. The essential elements of a computer are a central processing unit for performing or executing instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device, e.g., a universal serial bus (USB) flash drive, to name just a few.

Computer-readable media suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory can be supplemented by, or incorporated in, special purpose logic circuitry.

While this specification contains many specific implementation details, these should not be construed as limitations on the scope of any invention or on the scope of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the embodiments described above should not be understood as requiring such separation in all embodiments.

Thus, particular embodiments of the subject matter have been described. Nevertheless, it will be understood that various modifications may be made without departing from the spirit and scope of the subject matter. Accordingly, other embodiments are within the scope of the following claims.

What is claimed is:

1. A method of fabricating an integrated device, the method comprising:
    forming a plurality of layers on a first substrate to form a light emitting structure;
    integrating the formed light emitting structure on the first substrate with a backplane device formed on a second substrate by connecting a first top layer of the light emitting structure with a second top layer of the backplane device, wherein the backplane device includes at least one backplane having a plurality of pixel circuits; and
    after the integration, patterning the light emitting structure to form a plurality of separate light emitting elements each conductively coupled to respective pixel circuits of the plurality of pixel circuits to thereby form a plurality of active-matrix light emitting pixels, wherein each of the active-matrix light emitting pixels comprises at least one of the light emitting elements and at least one of the pixel circuits conductively coupled to the at least one of the light emitting elements.

2. The method of claim 1, wherein each of the pixel circuits comprises a non-volatile memory including at least one transistor conductively coupled to a corresponding drive electrode in the second top layer, and
    wherein the non-volatile memory is conductively coupled to a corresponding light emitting element in a respective active-matrix light emitting pixel through the corresponding drive electrode.

3. The method of claim 2, wherein the at least one backplane comprises scanning drivers and data drivers, and
    wherein each of the non-volatile memories is coupled to one of the scanning drivers through at least one word line and to one of the data drivers through at least one bit line.

4. The method of claim 1, wherein the plurality of layers includes a contact electrode layer as the first top layer, and each of the pixel circuits is coupled to a respective drive electrode in the second top layer, and
    wherein each of the pixel circuits is conductively coupled to the light emitting structure through the respective drive electrode and the contact electrode layer.

5. The method of claim 4, wherein the contact electrode layer comprises a doped semiconductor layer, and
    wherein the contact electrode layer is patterned to form individual Ohmic contacts of the separate light emitting elements.

6. The method of claim 1, wherein integrating the formed light emitting structure on the first substrate with the backplane device formed on the second substrate comprises:
    using low temperature bonding to bond the first top layer of the light emitting structure on the second top layer of the backplane device through an intermediate conductive layer.

7. The method of claim 6, comprising:
    simultaneously patterning the light emitting structure and the intermediate conductive layer, wherein each of the light emitting elements is self-aligned with a respective patterned intermediate conductive layer.

8. The method of claim 6, wherein the intermediate conductive layer comprises one or more metallic films including:
    an iridium-tin-oxide (ITO) film with a titanium (Ti) film,
    a copper (Cu) film with a Tantalum (Ta) film,
    an aluminum (Al) film with a Tin (Sn) film, or a gold (Au) or silver (Ag) film with at least one adhesive film including chromium (Cr), Platinum (Pt), Palladium (Pd), or Titanium (Ti).

9. The method of claim 1, wherein the first substrate comprises a first semiconductor wafer and the second substrate comprises a second semiconductor wafer, and
wherein integrating the formed light emitting structure on the first substrate with the backplane device formed on the second substrate comprises:
aligning the first semiconductor wafer with the second semiconductor wafer face-to-face at a wafer-to-wafer level of accuracy.

10. The method of claim 1, wherein integrating the formed light emitting structure on the first substrate with the backplane device formed on the second substrate comprises:
aligning the formed light emitting structure on the first substrate with a first region of the backplane device on the second substrate; and
bonding the light emitting structure with the first region of the backplane device.

11. The method of claim 10, further comprising integrating another light emitting structure on another first substrate with the backplane device on the second substrate by
aligning the another light emitting structure on the another first substrate with a second region of the backplane device; and
bonding the another light emitting structure with the second region of the backplane device, the second region being adjacent to the particular region.

12. The method of claim 10, further comprising:
scanning, by using a laser, an area with a particular shape on the light emitting structure such that the light emitting structure in the area is separated from the first substrate and remains bonded on the backplane device; and
removing the first substrate together with other non-scanned areas on the light emitting structure from the first region of the backplane device.

13. The method of claim 12, further comprising:
aligning another light emitting structure on another first substrate with a second region of the backplane device on the second substrate;
bonding the another light emitting structure with the second region of the backplane device;
scanning, by using the laser, a second area with the particular shape on the another light emitting structure such that the another light emitting structure in the second area is separated from the another first substrate and remains bonded on the backplane device; and
removing the another first substrate together with other non-scanned areas on the another light emitting structure from the second region of the backplane device,
wherein the another light emitting structure on the another first substrate is aligned with the second region of the backplane device on the second substrate, such that the another light emitting structure in the second area is adjacent to the light emitting structure in the first area on the backplane device.

14. The method of claim 1, wherein each of the pixel circuits is coupled to a respective drive electrode in the second top layer, and
wherein the method further comprises:
before the patterning, aligning a protective mask with the respective drive electrodes in the second top layer, such that dielectric materials between the respective drive electrodes in the second top layer are selectively etched away after the patterning.

15. The method of claim 1, further comprising:
before the patterning, removing the first substrate from the light emitting structure to expose the light emitting structure.

16. The method of claim 15, wherein the light emitting structure comprises one or more quantum well layers as an active medium between the first top layer as a first contact electrode and a second contact electrode,
wherein the light emitting structure comprises a buffer layer between the second contact electrode and the first substrate, and
wherein the method further comprises:
polishing the light emitting structure to remove the buffer layer to expose the second contact electrode.

17. The method of claim 16, wherein the method further comprises:
thinning the second contact electrode by polishing to remove a portion of the second contact electrode.

18. The method of claim 15, wherein removing the first substrate from the light emitting structure comprises:
using laser lift-off or laser scribing.

19. The method of claim 1, further comprising:
filling an isolation material in gaps between adjacent light emitting elements of the plurality of light emitting elements.

20. The method of claim 19, wherein the isolation material comprises an opaque dielectric material.

21. The method of claim 19, wherein the light emitting structure comprises one or more quantum well layers as an active medium between the first top layer as a first contact electrode and a second contact electrode, and
wherein the method further comprises: polishing the light emitting elements filled with the isolation material to expose the second contact electrodes in the light emitting elements and form a flat surface across the second contact electrodes of the light emitting elements.

22. The method of claim 21, further comprising:
depositing a transparent conductive layer on the flat surface to connect the second contact electrodes of the light emitting elements to form a common electrode for the light emitting elements.

23. The method of claim 1, further comprising:
forming a conductive grid array package on a bottom of the second substrate opposite to the second top layer, the conducive grid array package being conductively coupled to the at least one backplane.

24. The method of claim 23, wherein the conductive grid array package comprises a ball grid array (BGA) package.

25. The method of claim 1, wherein the formed light-emitting structure comprises one or more quantum well layers including Group III-V compounds and is configured to be activated to emit light with a primary color, and each of the light emitting elements is configured to emit light with the primary color.

26. The method of claim 25, wherein each of the light emitting elements comprises a light emitting diode (LED).

27. The method of claim 1, wherein each of the light-emitting elements is operable to emit light with a first color,
wherein the method further comprises:
forming a plurality of active-matrix multi-color display pixels using the plurality of active-matrix light-emitting pixels, each display pixel including at least a particular pixel element to emit light with a second color, the second color being different from the first color.

28. The method of claim 27, wherein each display pixel comprises at least three pixel elements operable to emit light with at least three different colors including red, blue, and green.

29. The method of claim 27, wherein forming the plurality of active-matrix multi-color display pixels comprises:
patterning with photoresist to select particular light-emitting elements of the plurality of light-emitting elements;
depositing phosphor films or a quantum-dot films on the selected light-emitting elements, wherein the selected light-emitting elements with the deposited phosphor films or the quantum-dot films are operable to emit the second color when the phosphor films or the quantum-dot films are excited by light from the selected light-emitting elements; and
removing the photoresist to form the particular pixel elements of the display pixels.

30. The method of claim 27, wherein each of the light-emitting elements is operable to emit ultraviolet (UV) or deep UV light with a wavelength between 100 nm and 450 nm.

31. The method of claim 30, wherein forming the plurality of active-matrix multi-color display pixels comprises:
forming at least three different color phosphor films or different size quantum-dot films on at least three light-emitting elements in each of the display pixels, wherein the display pixel is operable to emit at least blue, red, and green colors when the phosphor films or quantum-dot films are excited by the UV or deep UV light from the at least three light-emitting elements.

32. The method of claim 27, wherein each of the light-emitting elements is operable to emit light with a blue color.

33. The method of claim 32, wherein forming the plurality of active-matrix multi-color display pixels comprises:
forming at least two different color phosphor films or different size quantum-dot films on at least two light-emitting elements in each of the display pixels, wherein the display pixel is operable to emit at least red and green colors when the phosphor films or quantum-dot films are excited by the blue light from the at least two light-emitting elements.

34. The method of claim 33, wherein forming the plurality of active-matrix multi-color display pixels comprises:
forming a transparent layer on a third light-emitting element in the display pixel,
wherein the display pixel is operable to emit a blue color from the third light-emitting element.

35. The method of claim 27, wherein each display pixel comprises a first pixel element and a second pixel element that have respective first light conversion efficiency and second light conversion efficiency when excited by the light-emitting elements,
wherein patterning the light emitting structure to form a plurality of separate light emitting elements comprises:
patterning the light emitting structure to form a plurality of first light emitting elements each having a first area, the first light emitting elements being for the first pixel elements; and
patterning the light emitting structure to form a plurality of second light emitting elements each having a second area, the second light emitting elements being for the second pixel elements, and
wherein an area ratio between the first area and the second area is based on a ratio between the first light conversion efficiency and the second light conversion efficiency.

36. The method of claim 27, further comprising:
forming an isolation spacer between adjacent pixel elements of the display pixels, wherein the isolation spacer comprises an opaque dielectric material.

37. The method of claim 27, further comprising:
forming a transparent protective layer on top of the plurality of active-matrix multi-color display pixels.

38. The method of claim 37, wherein the formed transparent protective layer comprises a transparent touch-sensitive protective layer, and
wherein the transparent touch-sensitive protective layer is configured to form, together with a common electrode of the light emitting elements, a capacitive touch screen position sensor.

39. The method of claim 37, further comprising:
forming a polarizer film between the protective layer and the display pixels.

40. The method of claim 1, wherein the first substrate comprises one of a single crystal silicon semiconductor substrate and a sapphire substrate, and
wherein the plurality of layers comprises epitaxial semiconductor layers grown on the first substrate.

41. The method of claim 1, wherein the at least one backplane comprises a complementary metal-oxide-semiconductor (CMOS) backplane.

42. The method of claim 1, wherein the backplane device comprises an array of backplanes formed on the second substrate and separable from each other.

43. The method of claim 1, wherein the second substrate comprises a flexible film on a rigid substrate.

44. The method of claim 43, further comprising:
removing the rigid substrate such that the integrated device fabricated on the flexible film becomes flexible.

45. The method of claim 1, wherein the at least one backplane comprises a low temperature polysilicon (LTPS) thin-film transistors (TFT) array control backplane.

46. The method of claim 1, wherein each of the active-matrix light emitting pixels is drivable by a current source.

47. A method of fabricating an integrated active-matrix LED pixel array based display by bonding, the method comprising:
epitaxially growing a plurality of semiconductor layers on a first substrate to form a light emitting diode (LED) structure, the semiconductor layers including one or more quantum well layers having Group III-V compounds between a first doped semiconductor layer as a first contact electrode and a second doped semiconductor layer as a second contact electrode;
forming an intermediate metal layer on a top layer of a backplane device formed on a second substrate, the backplane device including at least one backplane having a plurality of non-volatile memories, each of the non-volatile memories being conductively coupled to a respective drive electrode in the top layer of the backplane device;
integrating the LED structure on the first substrate with the backplane device on the second substrate by low temperature bonding including bonding the first doped semiconductor layer of the LED structure with the top layer of the backplane device via the intermediate metal layer, wherein each of the non-volatile memories is conductively coupled to the LED structure via the respective drive electrode, the intermediate metal layer and the first contact electrode;
after the integration, patterning the LED structure together with the intermediate metal layer and the bonded top layer of the backplane device to form an array of LEDs each conductively coupled to respective non-volatile memories of the plurality of non-volatile memories to thereby form an array of active-matrix LED pixels, wherein each of the active-matrix LED pixels comprises at least one of the LEDs and at least one of the non-volatile memories conductively coupled to the at least one of the LEDs;

forming an array of active-matrix multi-color display pixels by selectively depositing different color phosphor materials or different size quantum dots materials on surfaces of the LEDs in each of the active-matrix LED pixels, each display pixel including at least three pixel elements operable to emit light with three colors including red, blue, and green when excited by the LEDs; and forming a transparent protective layer on the array of active-matrix multi-color display pixels.

48. The method of claim 47, further comprising:

forming first isolation spacers between adjacent LEDs of the array of LEDs, the first isolation spacers including an opaque dielectric material;

polishing the array of LEDs with the first isolation spacers to expose the second doped semiconductor layers of the LEDs and to form a flat surface across the array of LEDs;

depositing a transparent conductive layer on the flat surface to form a common electrode for the array of active-matrix LED pixels;

forming second isolation spacers between adjacent pixel elements of the display pixels and on the transparent conductive layer, the second isolation spacers comprising the opaque dielectric material; and forming a polarizer film between the transparent protective layer and the array of active-matrix multi-color display pixels, wherein the different color phosphor materials or quantum dots materials are selectively patterned on the transparent conductive layer, and wherein the transparent protective layer is touch-sensitive and configured to form, together with the common electrode, a capacitive touch screen position sensor.

49. The method of claim 47, wherein the at least one backplane comprises a complementary metal-oxide-semiconductor (CMOS) backplane, and the second substrate comprises a silicon semiconductor wafer, wherein the first substrate comprises one of a silicon semiconductor wafer and a sapphire wafer, wherein the method further comprising:

before the integration, aligning the first substrate with the second substrate at a wafer-to-wafer level of accuracy;

after the integration, removing the first substrate by laser lift-off to expose the LED structure and polishing the LED structure to expose the second doped semiconductor layer;

before the patterning, aligning a protective mask with the respective drive electrodes in the top layer of the backplane device, such that dielectric materials between the respective drive electrodes in the top layer are selectively etched away after the patterning; and forming a ball grid array (BGA) package on a bottom layer of the second substrate opposite to the top layer and conductively coupled to the backplane device.

50. The method of claim 47, wherein the at least one backplane comprises a low temperature polysilicon (LTPS) active-matrix (AM) thin-film transistors (TFT) array control backplane, and the second substrate comprises a flexible film on a carrier substrate, wherein the first substrate comprises one of a silicon semiconductor wafer and a sapphire wafer, wherein integrating the formed LED structure on the first substrate with the TFT backplane device formed on the second substrate comprises:

aligning the formed LED structure on the first substrate with a first region of the TFT backplane device on the second substrate;

bonding the LED structure with the first region of the TFT backplane device;

scanning, by using a laser, a rectangular area on the LED structure such that the LED structure in the rectangular area is separated from the first substrate and remains bonded on the TFT backplane device; and removing the first substrate together with other non-scanned areas on the LED structure from the first region of the TFT backplane device.

51. The method of claim 50, further comprising:

aligning another LED structure on another first substrate with a second region of the TFT backplane device on the second substrate;

bonding the another LED structure on the second region of the TFT backplane device;

scanning, by using the laser, a rectangular area on the another LED structure such that the another LED structure in the rectangular area is separated from the another first substrate and remains bonded on the TFT backplane device; and removing the another first substrate together with other non-scanned areas on the another LED structure from the second region of the TFT backplane device, wherein the another LED structure on the another first substrate is aligned with the second region of the TFT backplane device on the second substrate, such that the another LED structure in the second area is adjacent to the LED structure in the first area on the TFT backplane device.

52. The method of claim 47, wherein each of the display pixels includes first, second, and third pixel elements having respective first, second, and third light conversion efficiencies to emit a blue color, a green color, and a red color when excited by the LEDs, wherein patterning the LED structure to form an array of LEDs comprises:

patterning the LED structure to form a plurality of first LEDs each having a first area, the first LEDs being for the first pixel elements;

patterning the LED structure to form a plurality of second LEDs each having a second area, the second LEDs being for the second pixel elements; and patterning the LED structure to form a plurality of third LEDs each having a third area, the third LEDs being for the third pixel elements;

wherein an area ratio between the first area, the second area and the third area is based on a ratio between the first light conversion efficiency, the second light conversion efficiency, and the third light conversion efficiency.

* * * * *